US009941843B2

(12) United States Patent
Nobbe et al.

(10) Patent No.: US 9,941,843 B2
(45) Date of Patent: *Apr. 10, 2018

(54) AMPLIFIER DYNAMIC BIAS ADJUSTMENT FOR ENVELOPE TRACKING

(71) Applicant: Peregrine Semiconductor Corporation, San Diego, CA (US)

(72) Inventors: Dan William Nobbe, Crystal Lake, IL (US); Jeffrey A. Dykstra, Woodstock, IL (US); Chris Olson, Palatine, IL (US); James S. Cable, Del Mar, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/040,952

(22) Filed: Feb. 10, 2016

(65) Prior Publication Data
US 2016/0164468 A1 Jun. 9, 2016

Related U.S. Application Data

(62) Division of application No. 13/829,946, filed on Mar. 14, 2013, now Pat. No. 9,413,298.
(Continued)

(51) Int. Cl.
*H03F 3/04* (2006.01)
*H03F 1/02* (2006.01)
(Continued)

(52) U.S. Cl.
CPC .......... *H03F 1/0205* (2013.01); *H03F 1/025* (2013.01); *H03F 1/0216* (2013.01); *H03F 1/0222* (2013.01); *H03F 1/0227* (2013.01); *H03F 1/0244* (2013.01); *H03F 1/0277* (2013.01); *H03F 1/223* (2013.01); *H03F 1/3247* (2013.01); *H03F 1/3282* (2013.01); *H03F 1/56* (2013.01); *H03F 3/191* (2013.01); *H03F 3/193* (2013.01); *H03F 3/195* (2013.01); *H03F 3/21* (2013.01); *H03F 3/211* (2013.01); *H03F 3/24* (2013.01); *H03F 3/45179* (2013.01); *H03F 3/45183* (2013.01); *H03F 3/45188* (2013.01); *H03F 2200/102* (2013.01); *H03F 2200/108* (2013.01); *H03F 2200/129* (2013.01); *H03F 2200/15* (2013.01); *H03F 2200/18* (2013.01); *H03F 2200/213* (2013.01); *H03F 2200/222* (2013.01);
(Continued)

(58) Field of Classification Search
CPC ......... H03F 1/0261; H03F 1/302; H03F 1/301
USPC ................................ 330/285, 295, 310, 311
See application file for complete search history.

(56) References Cited

U.S. PATENT DOCUMENTS 5,251,330 A    10/1993   Chiba et al.
5,420,536 A    5/1995   Faulkner et al.
(Continued)

OTHER PUBLICATIONS

Nguyen, Khiem D., Notice of Allowance received from the PTO dated Mar. 11, 2016 for U.S. Appl. No. 13/829,946, 7 pgs.
(Continued)

*Primary Examiner* — Khanh V Nguyen
*Assistant Examiner* — Khiem Nguyen
(74) *Attorney, Agent, or Firm* — Jaquez Land Greenhaus LLP; Martin J. Jaquez, Esq.; Alessandro Steinfl, Esq.

(57) ABSTRACT

An envelope tracking amplifier having stacked transistors is presented. The envelope tracking amplifier uses dynamic bias voltages at one or more gates of the stacked transistors in addition to a dynamic bias voltage at a drain of a transistor.

25 Claims, 81 Drawing Sheets

Related U.S. Application Data

(60) Provisional application No. 61/747,009, filed on Dec. 28, 2012, provisional application No. 61/747,016, filed on Dec. 28, 2012, provisional application No. 61/747,025, filed on Dec. 28, 2012, provisional application No. 61/747,034, filed on Dec. 28, 2012.

(51) Int. Cl.

| | | |
|---|---|---|
| *H03F 3/193* | (2006.01) | |
| *H03F 3/21* | (2006.01) | |
| *H03F 1/22* | (2006.01) | |
| *H03F 1/32* | (2006.01) | |
| *H03F 1/56* | (2006.01) | |
| *H03F 3/195* | (2006.01) | |
| *H03F 3/24* | (2006.01) | |
| *H03F 3/45* | (2006.01) | |
| *H03F 3/191* | (2006.01) | |

(52) U.S. Cl.
CPC .. *H03F 2200/336* (2013.01); *H03F 2200/387* (2013.01); *H03F 2200/408* (2013.01); *H03F 2200/411* (2013.01); *H03F 2200/451* (2013.01); *H03F 2200/534* (2013.01); *H03F 2200/537* (2013.01); *H03F 2200/541* (2013.01); *H03F 2200/546* (2013.01); *H03F 2200/78* (2013.01); *H03F 2201/3233* (2013.01); *H03F 2203/45112* (2013.01); *H03F 2203/45366* (2013.01); *H03F 2203/45544* (2013.01); *H03F 2203/45638* (2013.01); *H03F 2203/45731* (2013.01)

(56) References Cited

U.S. PATENT DOCUMENTS

| | | |
|---|---|---|
| 5,610,555 A | 3/1997 | Funahashi et al. |
| 6,725,021 B1 | 4/2004 | Anderson et al. |
| 7,043,213 B2 | 5/2006 | Robinson et al. |
| 7,440,733 B2 | 10/2008 | Maslennikov et al. |
| 7,602,243 B2 | 10/2009 | Murao |
| 7,684,514 B2 | 3/2010 | Saito et al. |
| 7,714,664 B2 | 5/2010 | Kanaya et al. |
| 7,783,269 B2 | 8/2010 | Vinayak et al. |
| 8,310,313 B2 | 11/2012 | Guo et al. |
| 8,432,224 B1 | 4/2013 | Woo et al. |
| 8,493,142 B2 | 7/2013 | Tadano |
| 8,779,860 B2 | 7/2014 | Jeon et al. |
| 9,160,376 B1 | 10/2015 | Scuderi |
| 9,287,829 B2 | 3/2016 | Nobbe et al. |
| 9,413,298 B2 | 8/2016 | Nobbe et al. |
| 9,543,901 B2 | 1/2017 | Nobbe et al. |
| 9,667,195 B2 | 5/2017 | Nobbe et al. |
| 9,716,477 B2 | 7/2017 | Wagh et al. |
| 9,729,107 B2 | 8/2017 | Nobbe et al. |
| 2006/0119435 A1 | 6/2006 | Oh et al. |
| 2008/0297128 A1 | 12/2008 | Xu et al. |
| 2010/0039094 A1 | 2/2010 | Nagata et al. |
| 2010/0085120 A1 | 4/2010 | Marbell et al. |
| 2011/0098011 A1 | 4/2011 | Camp, Jr. et al. |
| 2013/0229235 A1 | 9/2013 | Ohnishi |
| 2014/0184336 A1 | 7/2014 | Nobbe et al. |
| 2014/0266456 A1 | 9/2014 | Vice et al. |
| 2015/0244322 A1 | 8/2015 | Hur et al. |
| 2016/0164469 A1 | 6/2016 | Nobbe et al. |
| 2016/0241199 A1 | 8/2016 | Nobbe et al. |
| 2017/0359029 A1 | 12/2017 | Nobbe et al. |

OTHER PUBLICATIONS

Nobbe, et al., Response filed in the USPTO dated Mar. 23, 2016 for U.S. Appl. No. 13/830,680, 15 pgs.
Nguyen, Khiem D., Office Action received from the USPTO dated Apr. 21, 2016 for U.S. Appl. No. 14/626,833, 51 pgs.
Nguyen, Patricia T., Office Action received from the USPTO dated Jun. 2, 2016 for U.S. Appl. No. 13/830,680, 18 pgs.
Wagh, et al., Response to Non-Final Office Action filed in the USPTO dated Jun. 20, 2016 for U.S. Appl. No. 14/626,833, 33 pgs.
Nguyen, Khiem D., Office Action received from the USPTO dated Sep. 11, 2014 for U.S. Appl. No. 13/829,946, 9 pgs.
Nguyen, Khiem D., Office Action received from the USPTO dated Feb. 23, 2015 for U.S. Appl. No. 13/829,946, 25 pgs.
Nguyen, Khiem D., Office Action received from the USPTO dated Jul. 3, 2016 for U.S. Appl. No. 13/829,946, 11 pgs.
Nguyen, Khiem D., Notice of Allowance received from the PTO dated Dec. 21, 2015 for U.S. Appl. No. 13/829,946, 11 pgs.
Nobbe, et al., Comments on Examiner's Statement of Reasons for Allowance filed in the USPTO dated Jun. 13, 2016 for U.S. Appl. No. 13/829,946, 5 pgs.
Nobbe, et al., Response filed in the USPTO dated Dec. 11, 2014 for U.S. Appl. No. 13/829,946, 2 pgs.
Nobbe, et al., Response filed in the USPTO dated May 22, 2015 for U.S. Appl. No. 13/829,946, 23 pgs.
Nobbe, et al., Response filed in the USPTO dated 9/915 for U.S. Appl. No. 13/829,946, 14 pgs.
Nguyen, Patricia T., Notice of Allowance received from the USPTO dated Aug. 16, 2016 for U.S. Appl. No. 14/858,772, 16 pgs.
Nobbe, et al., Response filed in the USPTO dated Aug. 22, 2016 for U.S. Appl. No. 13/830,680, 13 pgs.
Nobbe, et al., Response to Non-Final Office Action filed in the USPTO dated Jan. 24, 2017 for U.S. Appl. No. 14/821,501, 23 pgs.
Nguyen, Khiem D., Office Action received from the USPTO dated Jan. 27, 2017 for U.S. Appl. No. 14/958,848, 9 pgs.
Nobbe, et al., Response filed in the USPTO dated Mar. 24, 2017 for U.S. Appl. No. 14/958,848, 11 pgs.
Nguyen, Patricia T., Office Action received from the USPTO dated May 18, 2017 for U.S. Appl. No. 15/046,267, 6 pgs.
Nguyen, Khiem D., Notice of Allowance received from the USPTO dated May 23, 2017 for U.S. Appl. No. 14/626,833, 27 pgs.
Nguyen, Patricia T., Notice of Allowance received from the USPTO dated May 26, 2017 for U.S. Appl. No. 14/821,501, 19 pgs.
Nguyen, Khiem D., Notice of Allowance received from the USPTO dated Oct. 20, 2016 for U.S. Appl. No. 14/626,833, 13 pgs.
Nguyen, Patricia T., Office Action received from the USPTO dated Oct. 28, 2016 for U.S. Appl. No. 14/821,501, 17 pgs.
Nguyen, Patricia T., Notice of Allowance received from the USPTO dated Nov. 4, 2016 for U.S. Appl. No. 13/830,680, 11 pgs.
Nguyen, Khiem D., Office Action received from the USPTO dated Jun. 28, 2017 for U.S. Appl. No. 15/279,274, 11 pgs.
Nguyen, Khiem D., Office Action received from the USPTO dated Jun. 30, 2017 for U.S. Appl. No. 14/958,848, 53 pgs.
Dykstra, et al., Response filed in the USPTO dated Jul. 12, 2017 for U.S. Appl. No. 15/279,274, 4 pgs.
Nobbe, et al., Response filed in the USPTO dated Jul. 17, 2017 for U.S. Appl. No. 15/046,267, 10 pgs.
Nobbe, et al., Response filed in the USPTO dated Jul. 20, 2017 for U.S. Appl. No. 14/958,848, 17 pgs.
Nobbe, et al., Response filed in the USPTO dated Oct. 17, 2017 for U.S. Appl. No. 15/046,267, 17 pgs.
Nguyen, Khiem D., Office Action received from the USPTO dated Oct. 19, 2017 for U.S. Appl. No. 15/279,274, 28 pgs.
Nobbe, et al., Preliminary Amendment filed in the USPTO dated Sep. 5, 2017 for U.S. Appl. No. 15/618,452, 11 pggs.
Nguyen, Patricia T., Office Action received from the USPTO dated Oct. 5, 2017 for U.S. Appl. No. 15/046,267, 43 pgs.
Nguyen, Khiem D., Final Office Action received from the USPTO dated Nov. 17, 2017 for U.S. Appl. No. 14/958,848, 22 pgs.
Nguyen, Khiem D., Interview Summary received from the USPTO dated Dec. 29, 2017 for U.S. Appl. No. 14/958,848, 6 pgs.
Peregrine Semiconductor Corporation, Response filed in the USPTO dated Jan. 23, 2018 for U.S. Appl. No. 14/958,848, 18 pgs.
Dykstra, Khiem D., Response filed in the USPTO dated Nov. 24, 2017 for U.S. Appl. No. 15/279,274, 19 pgs.
Iguyen, Patricia T., Notice of Allowance received from the USPTO dated Feb. 9, 2018 for U.S. Appl. No. 15/046,267, 11 pgs.

AMPLIFIER DYNAMIC BIAS ADJUSTMENT FOR ENVELOPE TRACKING

CROSS REFERENCE TO RELATED APPLICATIONS—CLAIMS OF PRIORITY

The present application is a divisional of commonly owned co-pending U.S. patent application Ser. No. 13/829,946 entitled "Amplifier Dynamic Bias Adjustment for Envelope Tracking" filed on Mar. 14, 2013, which Ser. No. 13/829,946 application is incorporated by reference herein in its entirety; and application Ser. No. 13/829,946 claims priority to U.S. provisional application No. 61/747,009 entitled "Amplifier Dynamic Bias Adjustment for Envelope Tracking" filed on Dec. 28, 2012 and incorporated herein by reference in its entirety; and application Ser. No. 13/829,946 also claims priority to U.S. provisional application No. 61/747,016 entitled "Optimization Methods for Amplifier with Variable Supply Power" filed on Dec. 28, 2012 and incorporated herein by reference in its entirety; and application Ser. No. 13/829,946 also claims priority to U.S. provisional application No. 61/747,025 entitled "Amplifiers Operating in Envelope Tracking Mode or Non-Envelope Tracking Mode" filed on Dec. 28, 2012 and incorporated herein by reference in its entirety; and application Ser. No. 13/829,946 also claims priority to U.S. provisional application No. 61/747,034 entitled "Control Systems and Methods for Power Amplifiers Operating in Envelope Tracking Mode" filed on Dec. 28, 2012 and incorporated herein by reference in its entirety.

The present application is related to U.S. application Ser. No. 13/830,070 entitled "Optimization Methods for Amplifier with Variable Supply Power" filed on Mar. 14, 2013, issuing Dec. 22, 2015 as U.S. Pat. No. 9,219,445, and incorporated herein by reference in its entirety. The present application is also related to U.S. application Ser. No. 13/830,680 entitled "Amplifiers Operating in Envelope Tracking Mode or Non-Envelope Tracking Mode" filed on Mar. 14, 2013 and incorporated herein by reference in its entirety. The present application is also related to U.S. application Ser. No. 13/830,555 entitled "Control Systems and Methods for Power Amplifiers Operating in Envelope Tracking Mode" filed on Mar. 14, 2013 and incorporated herein by reference in its entirety.

BACKGROUND

1. Field

The present application relates to amplifiers. In particular the present application relates to dynamic bias adjustment for an amplifier operating in the envelope tracking mode.

2. Description of Related Art

Although nonlinear amplifiers can exhibit higher efficiency than linear amplifiers, until recently nonlinear power amplifiers were undesirable for use with RF signals produced by linear modulation schemes. A technique known as "envelope tracking" (ET) was developed that allows use of linear amplifiers to approach the efficiency of non-linear power amplifiers with RF signals produced by linear modulation schemes (e.g. where it is important to maintain relative variation within an envelope of an RF signal). By dynamically adjusting a DC bias voltage at a drain terminal of an output transistor of a power amplifier in a manner that roughly follows a time varying envelope of the RF signal, a signal produced by a linear modulation scheme can be amplified by a power amplifier without undesirable envelope distortion. Effectively, the technique of envelope tracking shifts a burden of linearity away from the power amplifier to an ETPS (envelope tracking power supply) that is connected to the drain terminal of the output transistor of the nonlinear power amplifier.

SUMMARY

According to a first aspect of the present disclosure, a circuital arrangement is provided, the circuital arrangement comprising: an amplifier comprising: stacked transistors having a plurality of bias terminals configured to operatively provide a plurality of dynamic bias voltages or currents to the stacked transistors; an input port operatively connected to an input transistor of the stacked transistors; an output port operatively connected to an output transistor of the stacked transistors; and a reference terminal operatively coupling the input transistor to a reference potential, wherein the stacked transistors comprise two subsets of transistors operatively arranged in series, a first subset comprising the input transistor operatively connected between the reference potential at the reference terminal and a second subset, the second subset comprising one or more transistors operatively connected in series with each other, at least one transistor of the one or more transistors being the output transistor, the second subset operatively connected between the first subset and a variable output supply bias voltage or current provided to the output transistor.

According to a second aspect of the present disclosure, a circuital arrangement is provided, the circuital arrangement comprising: an amplifier comprising: a plurality of transistors comprising an input terminal, an output terminal and a reference terminal; a variable supply power operatively coupled to the output terminals of the plurality of transistors; a plurality of transformers each comprising a primary winding and a secondary winding, wherein the primary windings of the transformers are serially connected between the output terminals of the plurality of transistors and the variable supply power; a reference potential operatively coupled to the reference terminals of the plurality of transistors; a bias terminal operatively connected to the plurality of transistors and configured to provide a dynamic bias voltage or current to the plurality of transistors; an input port operatively connected to the input terminals of the plurality of transistors, wherein the input port is configured to provide an RF input signal to the plurality of transistors; and an output port in correspondence of a secondary winding of a first transformer of the plurality of transformers, wherein: the secondary windings of the plurality of transformers are connected in a series arrangement between the output port and the reference potential such that an RF output power provided at the output port in correspondence of the RF input signal is a combination of powers in correspondence of the plurality of secondary windings.

According to a third aspect of the present disclosure, a circuital arrangement is provided, the circuital arrangement comprising: an amplifier comprising: stacked transistors having a plurality of bias terminals configured to operatively provide a plurality of dynamic bias voltages or currents to the stacked transistors; a plurality of transformers operatively coupling an RF input signal provided to an input port of the amplifier, to an input of the transistors from the stacked transistors; an output port of the amplifier operatively connected to an output transistor of the stacked transistors; and a last transistor of the stacked transistors being coupled to a reference potential, wherein the stacked transistors are operatively arranged in series arrangement between a variable output supply bias operatively connected to the output transistor, and the reference potential provided to the last transistor.

According to a fourth aspect of the present disclosure, a circuital arrangement is provided, the circuital arrangement comprising: an amplifier comprising: stacked transistors comprising P-type MOSFET and N-type MOSFET devices operatively arranged in a series arrangement wherein a first half of the stack comprises P-type devices only, and a second half of the stack comprises N-type devices only; a plurality of bias terminals configured to operatively provide a plurality of dynamic bias voltages or currents to the stacked transistors; a first terminal operatively coupled to a last N-type device of the stacked transistors and configured to receive a first output supply bias, wherein the last N-type device is at the bottom of the stacked transistors; a second terminal operatively coupled to a first P-type device of the stacked transistors and configured to receive a second output supply bias, wherein the first P-type device is at the top of the stacked transistors; an input port operatively coupled to a common input connection in correspondence of the first P-type device and the last N-type device and configured to provide an RF input signal to the stacked transistors, and an output port of the amplifier operatively coupled to a common output connection of a middle pair of N-type and P-type devices and configured to provide an RF output signal in correspondence of the RF input signal.

According to a fifth aspect of the present disclosure, a method of amplifying a signal in a circuital arrangement is provided, the method comprising: providing an amplifier comprising stacked transistors in a cascode configuration; adapting the arrangement to operatively connect a plurality of bias supplies to a plurality of gate terminals in correspondence of the stacked transistors and to a drain terminal in correspondence of a drain of an output transistor of the stacked transistors; applying an input signal to an input port of the arrangement operatively connected to an input transistor of the stacked transistors; varying the bias supply in correspondence of the drain of the output transistor, and impressing a desired amplification on the input signal to obtain an amplified output signal by varying at least one bias supply of the plurality of bias supplies in correspondence of the gate terminals.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 35 uses an input tunable matching network and an output tunable matching network.

FIG. 36 uses a resistor-capacitor feedback loop that can be enabled through the use of a feedback switch.

FIG. 37 uses an alternative resistor-capacitor feedback loop that is configured to tune the resistor and capacitor elements based on a desired mode of operation.

DETAILED DESCRIPTION

The present disclosure describes methods and arrangements for amplifier dynamic bias adjustment for envelope tracking. Furthermore, configuration methods and arrangements using such amplifiers as well as related system integration and controls are presented. Such amplifiers may be used within mobile handsets for current communication systems (e.g. WCMDA, LTE, etc. . . . ) wherein amplification of signals with frequency content of above 100 MHz and at power levels of above 50 mW is required. Such amplifiers may also be used to transmit power at frequencies and to loads as dictated by downstream splitters, cables, or feed network(s) used in delivering cable television service to a consumer, a next amplifier in an RF chain at a cellular base station; or a beam forming network in a phased array radar system, and other. The skilled person may find other suitable implementations for the present disclosure, targeted at lower (e.g. audio) frequency systems as well, such as audio drivers, high bandwidth laser drivers and similar. As such, it is envisioned that the teachings of the present disclosure will extend to amplification of signals with frequency content of below 100 MHz as well.

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 26:
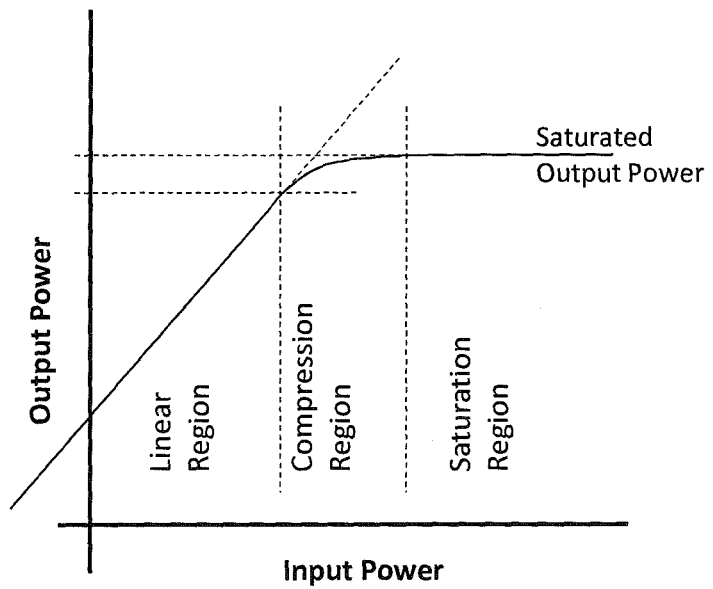
FIG. 26 shows relationships between input/output power and various regions of operation of an amplifier.

Throughout the present disclosure, the terms "linear region" and "compression region" refer to basic operations of an amplifier stage. When operating in the linear region, the amplifier output response is linear, in other words, the change in the output power of the amplifier is linear with respect to a corresponding change in input power. This is the typical response of the amplifier at low input power levels. Typically there is minimal change in the amplifier's gain or phase response as a function of input power in this region. As the input power level to the amplifier increases and the amplifier output approaches its maximum output level, known as the saturation level, the output response of the amplifier becomes non-linear. In this case, the change in output power of the amplifier for a given change in input power decreases as the output power approaches the saturation level. Once the output power reaches saturation level, any incremental increase in input power will not affect the output power level (zero incremental gain), thus remaining at saturation. The transition region between the linear region and the region of zero incremental gain is referred to as the compression region of operation of the amplifier. The region of zero incremental gain wherein the output power remains at the saturation level is referred to as the saturation region. One measure of the amount of compression typically used in the industry is the −1 dB compression point. This is the point at which the gain has been reduced by 1 dB. Furthermore, it is common in the industry to refer to the saturation level as the −3 dB compression point. FIG. 26 shows the various regions of operation of an amplifier. Typically the phase response will change along with the gain as the amplifier starts to compress.

Operating an amplifier from a fixed supply results in degraded efficiency when the peak-to-average ratio of the modulation is large. This is because the supply voltage needs to be high enough to accommodate the peak, even though most of the time a much lower supply voltage could be used. The voltage from the supply that is not needed for the RF signal is wasted as heat in the amplifier as depicted by FIG. 29A, where the supply voltage level is indicated by the top of the gray box and the dissipated heat is represented by the gray area.

One could imagine coarsely following the envelope of the modulated signal with a variable power supply. This provides an advantage if the variable power supply is efficient. The applied variable supply voltage can be relatively slow or fast compared to the modulation frequency and still provide a benefit, as all cases would result in less power dissipated in the amplifier. In this variable supply case, it is assumed that the supply is always some level above the instantaneous supply voltage needed, which means that all amplitude information is from the RF input waveform, and the amplifier remains as a linear amplifier (operates in the linear region). The amplifier would remain as a linear amplifier throughout (constant gain and phase), but may experience distortion such as AM-PM (amplitude modulation-to-phase modulation) due to the supply voltage changes. Although industry standard definitions don't exist at this time, some refer to this method as envelope following. The supply is following the envelope at some level, but doesn't have to follow it exactly. FIG. 29B depicts such a case, where the variable power supply follows very closely the envelope of the modulated signal (e.g. transmitted RF), which results in a reduction of the dissipated heat.

The next level of improvement comes when the dynamic supply voltage no longer maintains headroom or some margin between the needed voltage and the supplied voltage. In this case, the amplitude of the amplifier's output is set or limited by the supply voltage. This puts the amplifier in compression at these instants, which typically further improves the efficiency because now the efficiency of the amplifier has improved along with the reduced power due to excess voltage wasted as heat. Transition from linear to compressed regions of operation obviously results in reduced gain for the amplifier. Additionally, the phase response often changes as this transition occurs. The transition from compression to linear regions of operation will have the equal but opposite change in gain and phase.

Operating in this mode where the envelope signal from the dynamic supply puts the amplifier into compression means that the output of the dynamic supply must be exact in time or phase and also amplitude, otherwise distortion will result at the output of the amplifier. In other words, the amplitude or envelope path is separate from the phase path, but both must have acceptable time alignment when the two components are combined. This time alignment must be preserved over the bandwidth of the modulation, thus imposing limits on the phase distortion allowed in the paths.

The bandwidth of the envelope signal needs to be several times larger than the baseband modulation bandwidth. This is because a polar decomposition of the modulation into magnitude and phase shows much wider bandwidth for the amplitude portion. Another way to think of it is by considering the modulation in an IQ constellation format. A transition from one symbol to the next may make a phase change of up to 180 degrees, but it may go from the outermost symbol's amplitude, through a peak, then approach or even reach zero, and return to an outermost symbol's amplitude, all within one symbol transition. That translates into a fast amplitude component. This mode of operation, where the envelope must track the signal amplitude precisely, is often referred to as envelope tracking.

In the envelope tracking case, the amplitude and phase information are being supplied at the input to the amplifier (complex modulation). The dynamic supply voltage may further set the amplitude, but isn't required at all signal levels. The dynamic supply voltage may apply the envelope signal at the peaks and through some portion of the modulation, but then reach a minimum value and let the amplitude information at the amplifier's input continue to provide the amplitude or envelope through other portions of the modulation. This minimum value of the dynamic supply is typically chosen based on the capabilities of the dynamic supply and also the minimum acceptable supply voltages for the amplifier.

If the supply were to follow the envelope all the way through every symbol transition and thus impart all amplitude modulation through the envelope path, the result would be a polar modulator. A polar modulator or polar amplifier has all phase information applied at one port, usually the RF input of an amplifier, and all amplitude information applied at a second port, usually the output bias for an amplifier. Polar modulators or amplifiers are challenging for several reasons: 1) the bandwidth of the amplitude signal is much wider than the baseband modulation and wider than the ET envelope bandwidth, 2) the amplitude signal may approach or even reach zero in the modulation, which is difficult to do in a real amplifier setup without significant distortion, and 3) it is difficult to create a modulated signal over a large range of output powers.

It should be noted that although envelope tracking is used throughout the current disclosure to showcase the various embodiments, many of the teachings of the present disclosure apply not only to envelope tracking, but to envelope following, average power tracking, and polar modulation as well.

Memory effects are also important in amplifiers. Memory effects are when the response of the amplifier is dependent on a previous state of the amplifier. For example, if the input modulation hits a peak and causes increased power dissipation in the amplifier device, the device may experience self-heating or a device temperature increase from the power dissipation. If the modulation amplitude decreases a moment later, the amplifier's gain and phase may still be altered due to the heating associated with the modulation from the previous time. There are many possible sources of memory effects, including thermal, bias circuits, and matching components. Operation in envelope following, envelope tracking, and polar modulation modes can further introduce memory effects due to the dramatically changing bias conditions. These effects must be considered by the amplifier and system designers.

Figure 1:
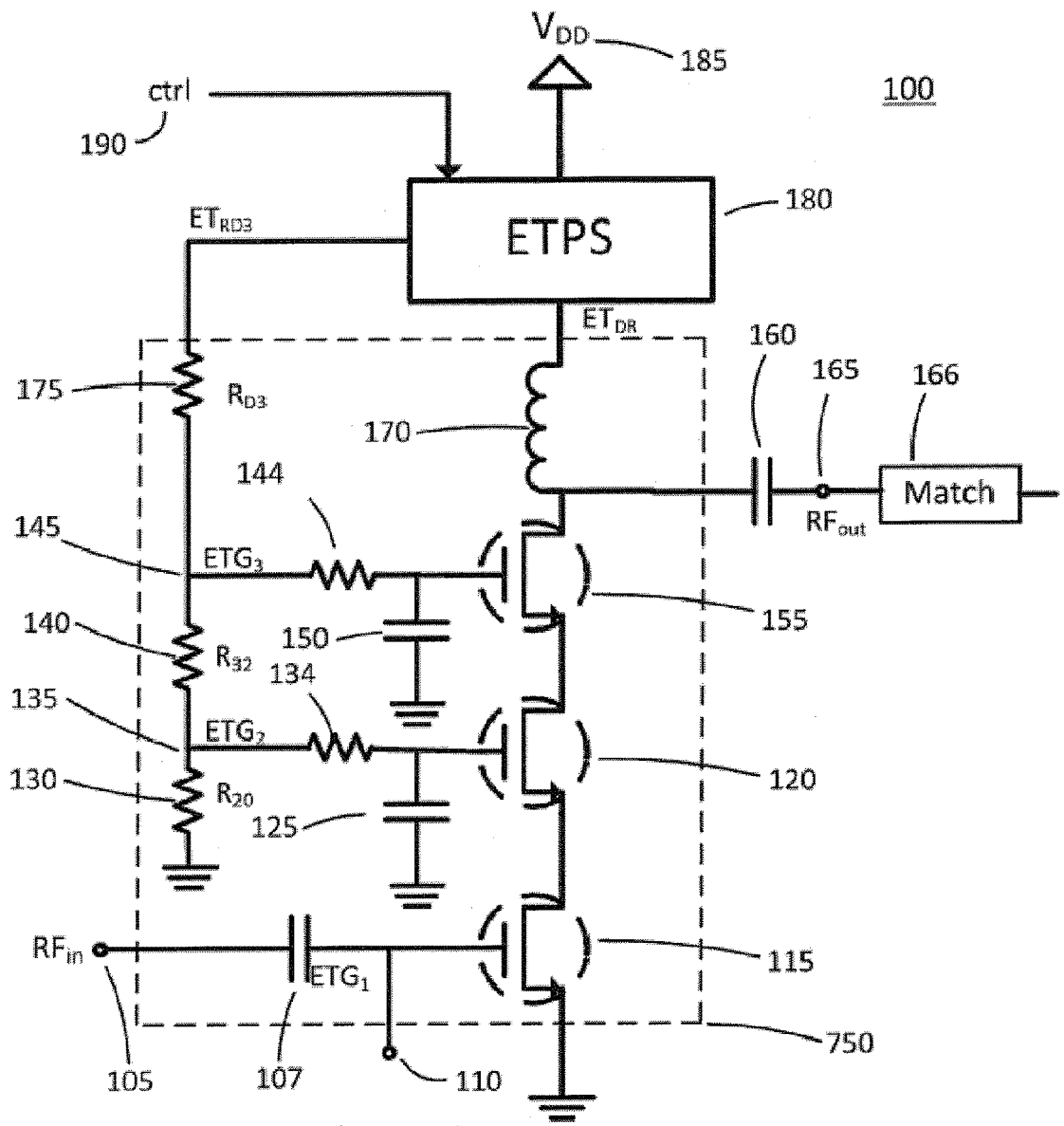
FIG. 1 shows an example embodiment according to the present disclosure of an envelope tracking amplifier with a match circuit at its output.

FIG. 1 shows an example envelope tracking amplifier (100) according to various embodiments of the present disclosure. By way of example and not of limitation, the envelope tracking amplifier (100) can comprise a stack of FETs (e.g., three FETs): a first FET (115), a second FET (120), and a third FET (155). Moreover, the first FET (115) can be referred to as a first subset of FET(s), and the second FET (120) and the third FET (155) (cascode) can be referred to as a second subset of FET(s). The skilled person will note that FETs (115), (120) and 155) are configured as a three-stage cascode amplifier (750). Teachings from other documents, such as U.S. Pat. No. US2011/0181360 A1, published on Jul. 28, 2011, further describe stacked cascode amplifiers and methods to minimize output signal distortion by way, for example, of biasing the various gates of the transistors within the stack. The person skilled in the art may use these teaching for further specifics on multi-stage stacked transistors in a cascode configuration. If the stack of FETs comprises more than three FETs, e.g., four FETs, the second, third, and fourth FETs will be considered as part of the second subset of FET(s). In the embodiment shown in FIG. 1, a DC bias voltage is supplied to the envelope tracking amplifier (100) by a supply voltage $V_{DD}$ (185). Although N-type MOSFETs are used to describe the embodiments in the present disclosure, a person skilled in the art would recognize that other types of transistors such as, for example, P-type MOSFETs and bipolar junction transistors (BJTs) can be used instead or in combination with the N-type MOSFETs. Furthermore, a person skilled in the art will also appreciate the advantage of stacking more than two transistors, such as three, four, five or more, provide on the voltage handling performance of the amplifier. This can for example be achieved when using non bulk-Silicon technology, such as insulated Silicon on Sapphire technology. In general, individual devices in the stack can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stack of devices.

Figure 19:
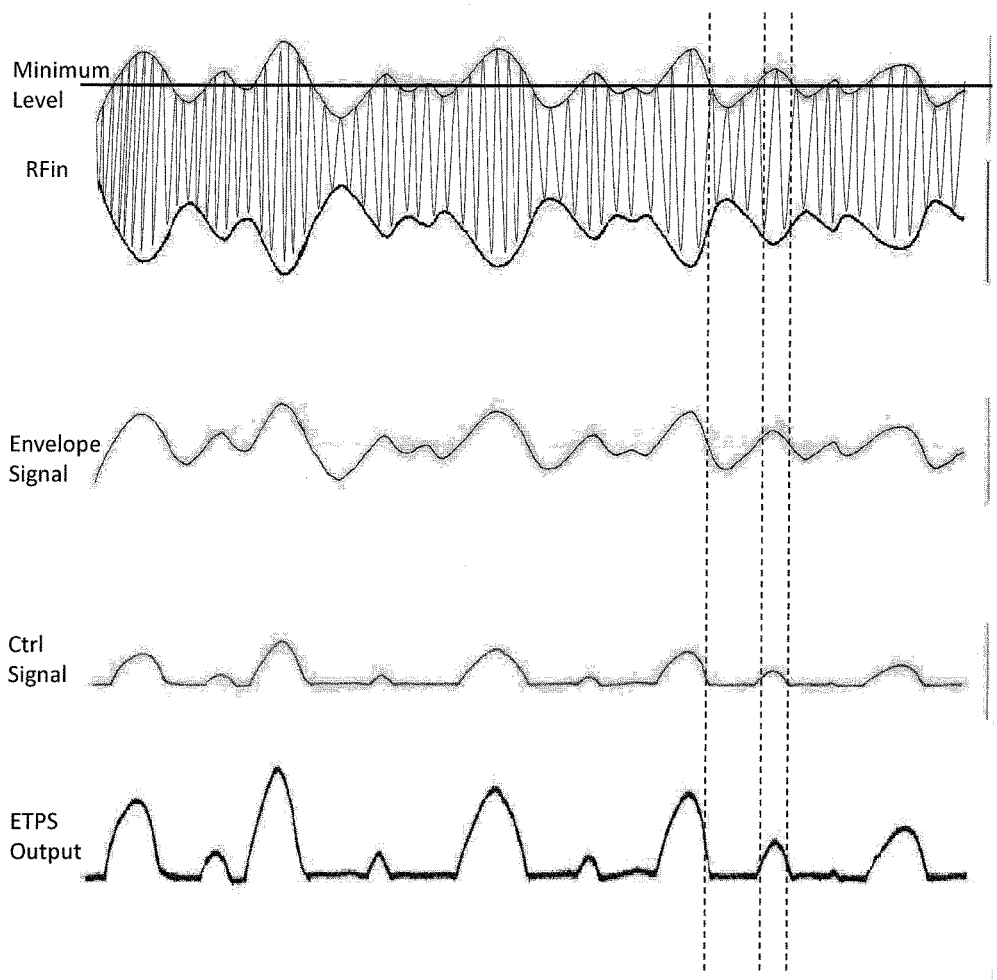
FIG. 19 shows an exemplary relationship between an RF input signal, a corresponding envelope signal, a corresponding ET power supply control signal and a corresponding ET power supply output.

An envelope tracking power supply (ETPS) (180), such as, for example, a variable voltage or current source (e.g. variable DC-DC converter), can be connected to receive power from power supply $V_{DD}$ (185) and output a dynamic bias voltage to a third resistor (175) with a resistance value represented by $R_{D3}$, and to an inductor (170). The dynamic bias output from the ETPS can be controlled by a control voltage or current signal "ctrl" (190). As a consequence of the control signal (190) applied to the ETPS (180) the dynamic bias voltages $ET_{RD3}$ and $ET_{DR}$ are functions of a time varying envelope of an RF input signal (e.g. FIG. 19) that is provided to an input terminal (105) of the envelope tracking amplifier (100). The input port of the envelope tracking amplifier (100) can comprise the input terminal (105) and a reference (e.g. ground) terminal that is connected to a source of the first FET (115). The envelope of the RF input signal is hereinafter referred to as an "envelope signal", and may be represented by a time varying signal roughly following the envelope of the RF input signal. Although a variable DC-DC convertor may be used to describe the ETPS within the various embodiments of the present disclosure, a person skilled in the art would recognize that other types of envelope tracking power supplies (ETPS) based on variable voltage or current sources may be used as well. FIG. 19 shows an exemplary relationship between an input RFin signal, a corresponding envelope signal, an ETPS control signal (ctrl) derived from the envelope signal and an output of the ETPS corresponding to the control signal. It is to be noted that during the envelope tracking operation the ETPS control signal, and thus the ETPS output, at times follows the envelope signal, and at times takes a fix value. The person skilled in the art will know that when ETPS output follows the envelope signal, the output of the amplifier is in compression and the RF output power is provided by the ETPS, and when at a fixed level, the amplifier operates linearly and the RF output is determined by the RF input signal.

Envelope tracking power supplies need to have a bandwidth wide enough to support the amplitude component of the modulation. As mentioned, this can be many times greater than the baseband bandwidth. To accomplish this, many ETPSs are built using a combination of a DC-DC switching converter and an analog error amplifier. They can be constructed in many ways, including serial and parallel combinations. The switching DC-DC converter is typically more efficient than the analog amplifier, but has a more limited bandwidth. This is because the DC-DC converter can support a modulation bandwidth that is approximately a factor of 5 to 10 lower than its switching frequency. Faster DC-DC converters are desired. The process choice plays an important role in setting the bandwidth of the DC-DC converter. While hybrid technologies such as CMOS (control circuits) and GaN (switchers) might offer high speed and efficiency, monolithic integration benefits such as cost and size may push the solution to a process such as CMOS, CMOS SOI, or CMOS SOS. The benefits of the SOI and SOS processes include a variety of benefits, one of which is lower parasitic capacitance, and thus faster speeds. If the DC-DC converter is fast enough, the analog amp would not be required.

There are numerous benefits to integration of these functions and even integration with the amplifier itself. Integration of the ETPS or portions of it with the amplifier can result in reduced parasitic inductance, reduced parasitic capacitance, reduced phase delays and distortion, and device matching. With monolithic integration of circuit blocks that may include the amplifier, ETPS, and/or control circuits, one can make use of the matching between devices to track and adjust variations due to manufacturing tolerances, temperature and others in ways that can't be supported across multiple ICs and possibly multiple technologies.

Figure 2:
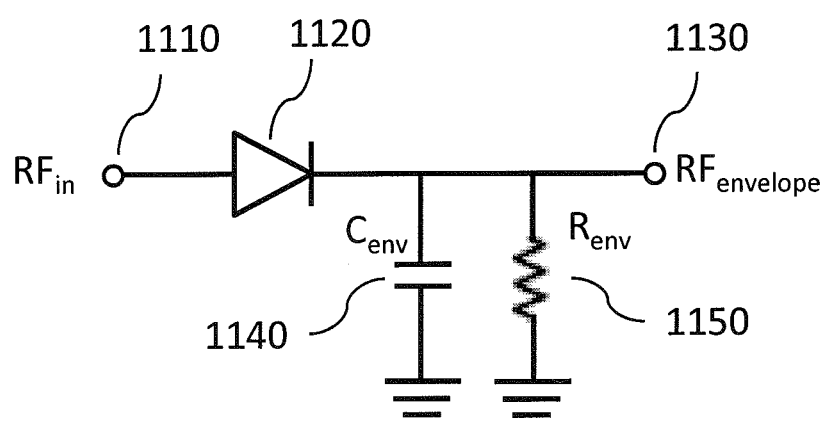
FIG. 2 shows an example implementation of an envelope detector.

The term "port" refers to a two terminal pair, where a signal can be applied across the two terminals. As used herein, the term "dynamic bias voltage" may refer to a bias voltage that can vary with respect to time. The envelope signal may be extracted from the RF input signal by way of an envelope detector. FIG. 2 shows an example implementation of the envelope detector (1100). The envelope detector (1100) can comprise a diode (1120) in series with a load, where the load can be represented by a capacitor (1140) with a value of Cm, and a resistor (1150) with a value represented by $R_{env}$ that are connected in parallel. $R_{env}$ and $C_{env}$ can be chosen to determine a maximum rate change of an envelope signal $RF_{envelope}$ that is extracted at an output terminal (1130) from an input signal $RF_{in}$ that is fed into an input terminal (1110). Further design details of the envelope detector (1100) as well as other implementations of envelope detectors will be known to a person skilled in the art.

Turning back to FIG. 1, the inductor (170) serves as an RF choke to allow the dynamic bias voltage $ET_{DR}$ to pass to a drain of the third FET (155) while preventing RF energy from flowing to the ETPS (180). The inductor (170) in FIG. 1 can be a choke, a smaller inductor that is part of the matching circuit, or a more complex structure that diplexes signals at different frequencies. A coupling capacitor (160) is connected between the drain of the third FET (155) and an output terminal (165) where an RF output signal can be obtained. An output port of the envelope tracking amplifier (100) can comprise the output terminal (165) and the ground terminal that is connected to the source of the first FET (115). This output port typically feeds a matching circuit (166) (e.g. tunable matching network as described in U.S. Pat. No. 7,795,968 B1, issued on Sep. 14, 2010, which is incorporated herein by reference in its entirety) to condition the RF output signal for the next stage. The third resistor (175) is further connected to a gate resistor (144), which is connected to the gate of the third FET (155). A second resistor (140) with a value represented by $R_{32}$ is connected between node (145) and a second gate resistor (134), which is connected to the gate of the second FET (120). A first resistor with a value represented by $R_{20}$ is also connected between electrical ground and node (135). The value of the gate resistor (144) may be smaller than the value of resistor (175) and the value of gate resistor (134) may be smaller than the value of resistor (140). By way of example and not of limitation, gate resistors (144) and (134) may be 50 ohms.

The third, second, and first resistors (175), (140), and (130), respectively, form a voltage divider network such that a set of bias voltages $ET_{G2}$, $ET_{G3}$ are scaled versions of the dynamic bias voltage $ET_{RD3}$ and therefore vary as a function of the envelope signal. For example, the bias voltage $ET_{G2}$ can be expressed according to the following equation as per standard voltage division:

$$ET_{G2}=ET_{RD3}*(R_{20})/(R_{20}+R_{32}+R_{D3})$$

The voltage divider network may be considered to be an example embodiment of bias adjustment circuitry. As used herein, the term "bias adjustment circuitry" may refer to circuitry that is configured to perform an adjustment operation on a dynamic bias voltage signal prior to applying the dynamic bias voltage signal to bias terminals of an amplifier that comprises stacked FETs. In the embodiment shown in FIG. 1, a third gate capacitor (150) is connected between the gate of the third FET (155) and electrical ground. Also in the embodiment shown in FIG. 1, a second gate capacitor (125) is connected between the gate of the second FET (120) and electrical ground. The gate capacitors (125, 150) allow gate voltages (voltage across the respective gate capacitor) of the second FET (120) and the third FET (155), respectively, to float, that is let the gate voltages vary along with the RF signal at the drain of the corresponding FETs (120, 155), which consequently allow control (e.g. evenly distribute) of the voltage drop across the two transistors for a more efficient operation of the two transistors. See for example, U.S. Pat. No. 7,248,120, issued on Jul. 24, 2007, entitled "Stacked Transistor Method and Apparatus", which is incorporated herein by reference in its entirety.

During operation of the envelope tracking amplifier (100), a bias voltage at the drain of the third FET (155), delivered through the inductor (170), in addition to the bias voltages $ET_{G2}$ and $ET_{G3}$ at the gate of the second FET and the gate of the third FET, respectively, vary as a function of the envelope signal as dictated by the ETPS control signal (190).

Figure 3:
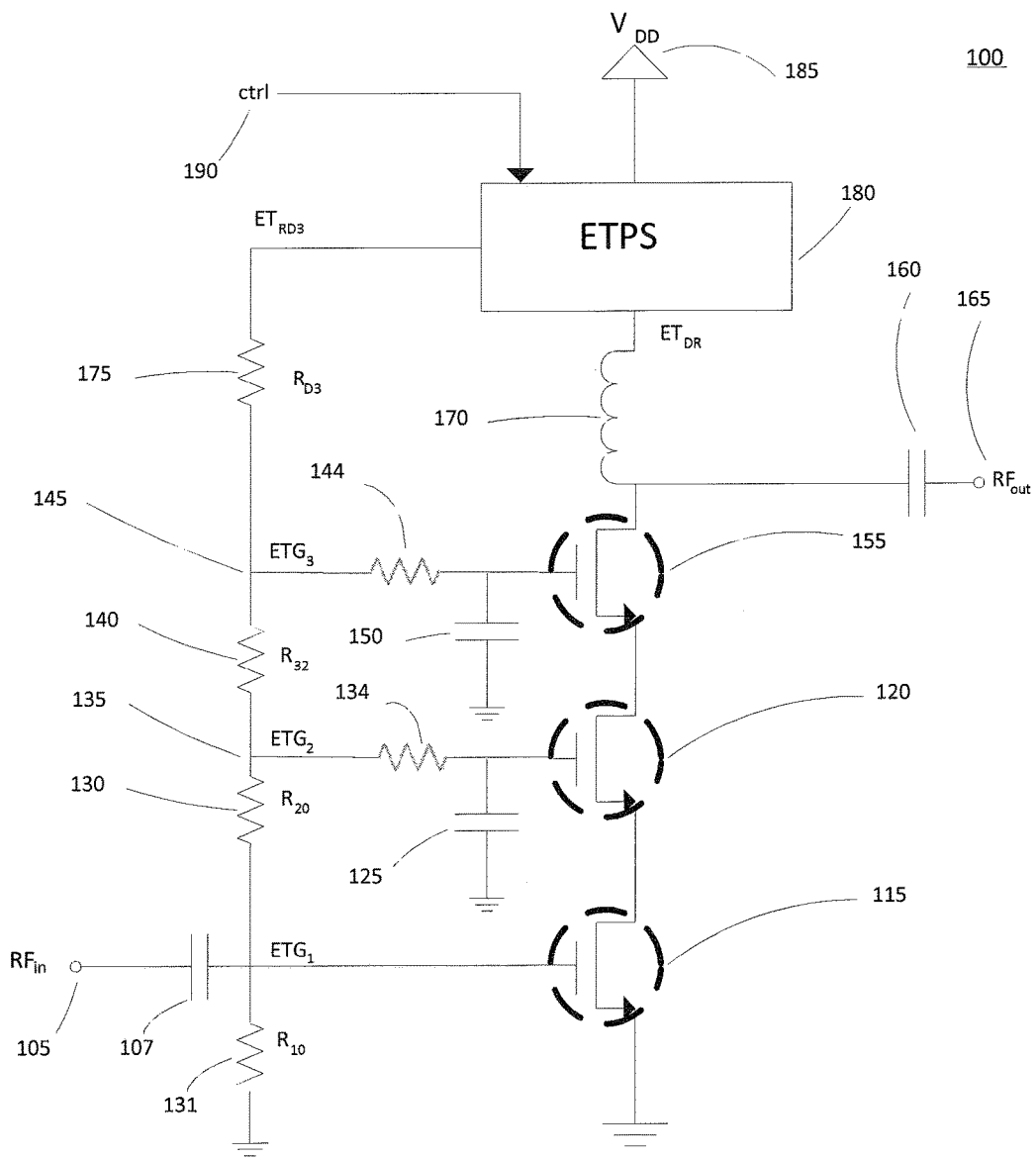
FIGS. 3-4 show example alternative embodiments to the envelope tracking amplifier shown in FIG. 1.
Figure 4:
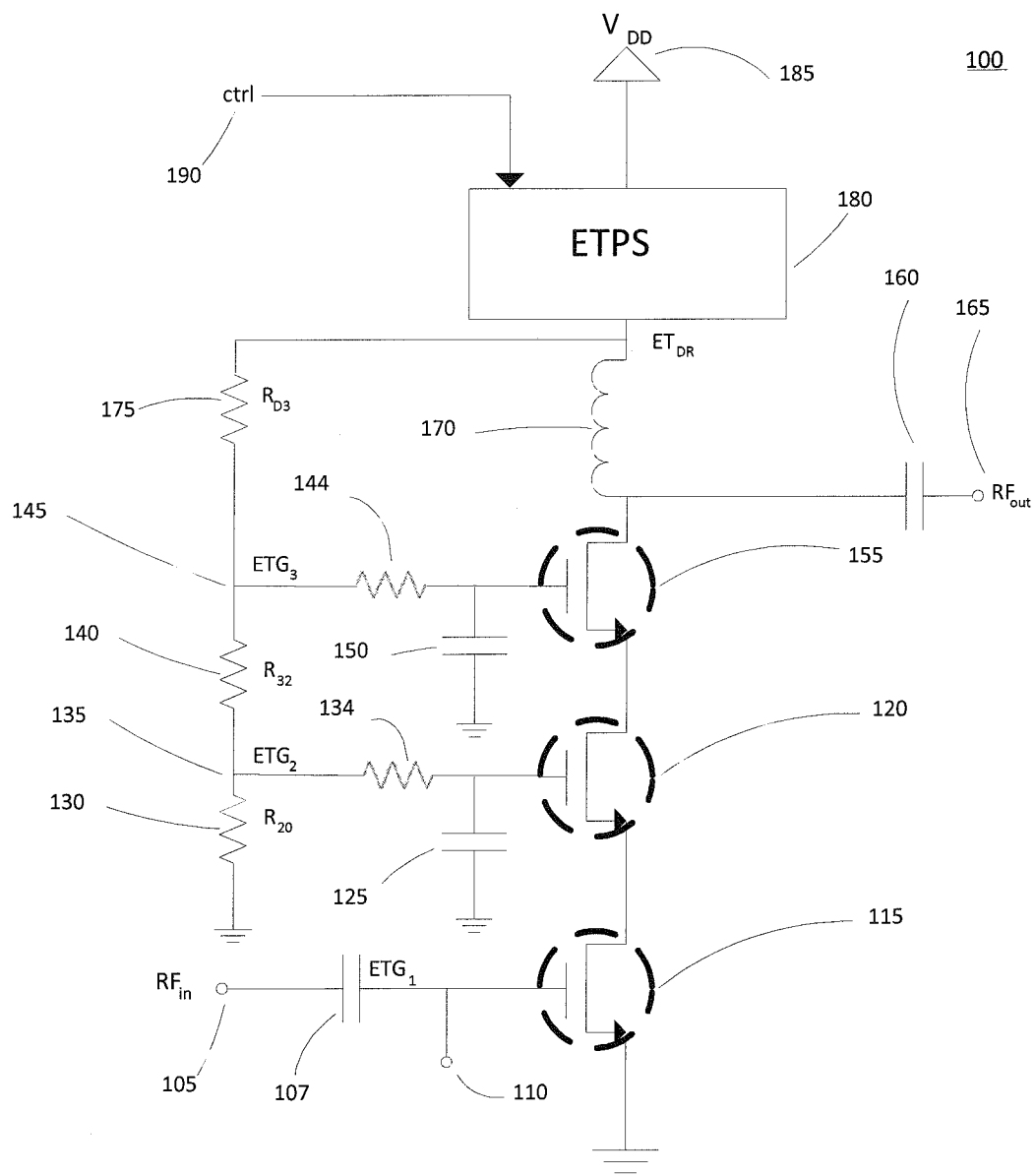

Additionally, a bias voltage $ET_{G1}$ can be applied to a first gate bias node (110) to bias a gate of the first FET (115). The bias voltage $ET_{G1}$ can be either a fixed voltage or a dynamic bias voltage. One or more of the gate bias voltages $ET_{G1}$, $ET_{G2}$, $ET_{G3}$ can be scaled, amplitude shifted, phase shifted, inverted, and/or subject to any mathematical operation (e.g. implemented by an op-amp circuit) with relation to the dynamic bias voltage $ET_{DR}$ supplied to the inductor (170), such operations performed by other embodiments of bias adjustment circuitry. Introducing a phase shift in one or more of the gate bias voltages $ET_{G1}$, $ET_{G2}$, $ET_{G3}$ can compensate for unintended effects of the envelope tracking amplifier (100) by pre-distorting phase(s) of the first, second and/or third FET (115, 120, 155). In some embodiments, the bias voltage $ET_{G1}$ is held fixed while the other two bias voltages $ET_{G2}$ and $ET_{G3}$ vary as a function of the envelope signal. In other possible embodiments, one or more of the gate bias voltages $ET_{G1}$, $ET_{G2}$, $ET_{G3}$ are dynamic bias voltages while other gate bias voltages are fixed bias voltages. By way of example, and not of limitation, FIG. 3 shows an exemplary arrangement of implementing the dynamic bias voltage to the gate of the first FET (115) through the voltage divider formed by resistors $R_{D3}$, $R_{32}$, $R_{20}$, and $R_{10}$. In some embodiments, the dynamic bias voltage for the drain and the gates of the FETs can come from a single output of the ETPS (180), as shown in FIG. 4.

The envelope tracking amplifier (100) can be used as a driver, a final, or any other type of amplifier. For example, such an amplifier may be used within a mobile handset for current communication systems to amplify signals with frequency content above 100 MHz and at power levels of above 50 mW. The stack of FETs may comprise any number of FETs (e.g. FIG. 8A, described later) and be chosen to be partially or fully depleted for best overall performance. The embodiment shown in FIG. 1 uses three FETs merely by way of example, as a person skilled in the art will be able to extend the teachings of the present disclosure to other embodiments comprising any number of FETs in the stack of transistors. The bias for the gate of the first FET (115) can be provided by, for example, a current mirror circuit, or any of a variety of standard biasing configurations known to a person skilled in the art.

Figure 5:
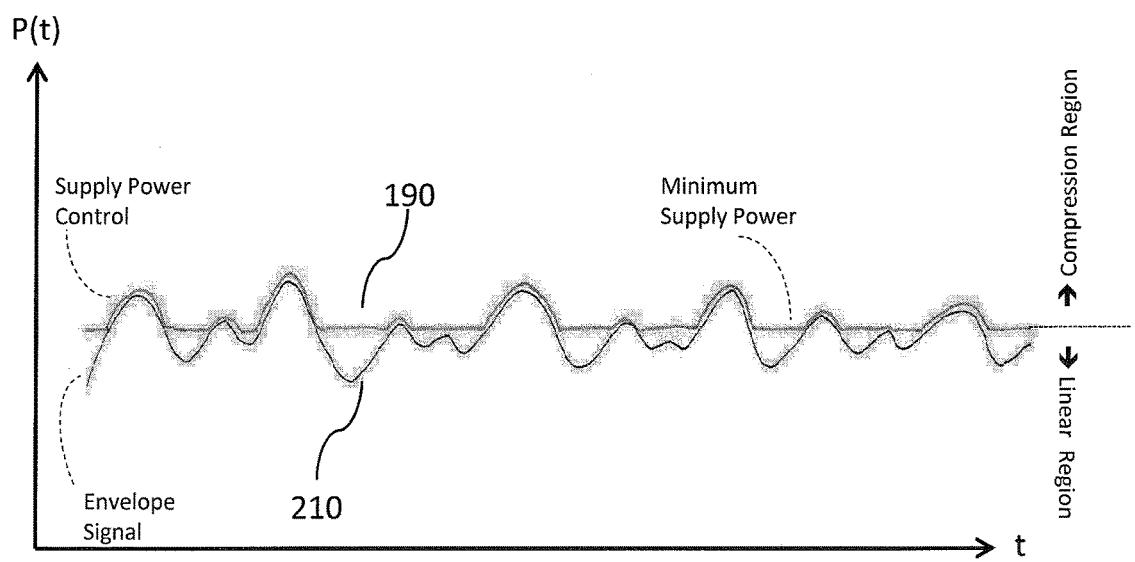
FIG. 5 shows waveforms that correspond to an exemplary envelope signal and an exemplary control signal that closely follows peaks of the exemplary envelope signal and is slightly higher than troughs of the exemplary envelope signal.

In some embodiments, the control signal (190), that is used to determine the dynamic bias voltages $ET_{RD3}$ and $ET_{DR}$, closely follows the envelope signal. In other embodiments, the control signal (190) closely follows peaks of the envelope signal and can be slightly higher than the troughs of the envelope signal. In yet other embodiments, the control signal (190) may alternate between following the envelope signal during certain periods of time, and being constant during other periods of time. FIG. 5 shows waveforms that correspond to an exemplary envelope signal (210) and an exemplary control signal (190) that closely follows peaks of the exemplary envelope signal and is constant during the troughs of the exemplary envelope signal. Such an embodiment enables the envelope tracking amplifier to operate in or near the compression region of the amplifier during peaks of the envelope signal, and operate in the linear region of the amplifier during troughs of the envelope signal. In embodiments where the dynamic bias voltages $ET_{RD3}$ and $ET_{DR}$ are directly related (e.g. $ET_{RD3}$ and $ET_{DR}$ both increase or decrease at similar times), equal voltage division across the second and third FETs (120, 155) can be maintained, which contributes to keeping the second and third FETs (120, 155) in saturation as the RF input signal and the RF output signal vary. Modulating the gate voltage (e.g. via $ET_{RD3}$) lets the transistors in the stack remain in the saturation region, thus preserving their amplitude and phase characteristics as the envelope signal is varied. This leads to better overall amplifier linearity and thus efficiency.

In some embodiment it may be desirable to modulate the gate voltage via an envelope signal, such as $ET_{RD3}$, while letting the gate float with the RF signal as described earlier. In this situation and considering the third FET transistor (155), the corresponding gate capacitor (150) and resistor (R144) have to be chosen such as the low pass filter seen by $ET_{RD3}$ passes the entire frequency spectrum of the envelope signal, and at the same time the impedance seen by the RF signal looking from the gate of the transistor (e.g. capacitor (150) in parallel with resistor (R144)) is such that the RF signal attenuation is set by the capacitor as designed and not by the bias and envelope path. Given these constraints, derivation of corresponding resistor and capacitor values, as well as derivation of the more generalized formula taking into account for example transistor's model and other components within the circuit, are well within the reach of the skilled person.

Alternatively, the dynamic bias voltage $ET_{RD3}$ can be inversely related to the envelope signal. As voltage at a drain terminal of the third FET (155) becomes sufficiently low, the third FET (155) and/or the second FET (120) begin(s) to act as a gate voltage controlled resistor (triode) instead of a gate voltage controlled current source (saturation). If the dynamic bias voltage $ET_{RD3}$ becomes high as the third FET (155) and/or the second FET (120) begin(s) to act as a gate voltage controlled resistor, an equivalent resistance presented by the third FET (155) and/or the second FET (120) can become low since an equivalent resistance presented by a FET in triode operation can be inversely proportional to a gate bias voltage of the FET in triode operation. As a result, when the dynamic bias voltage $ET_{RD3}$ is inversely related to the envelope signal, it is possible that the third FET (155) and/or the second FET (120) do(es) not significantly hinder operation of the envelope tracking amplifier (100) when voltage at a drain terminal of the third FET (155) becomes sufficiently low that the third FET (155) and/or the second FET (120) begin(s) to act as a gate voltage controlled resistor (triode).

Figure 6:
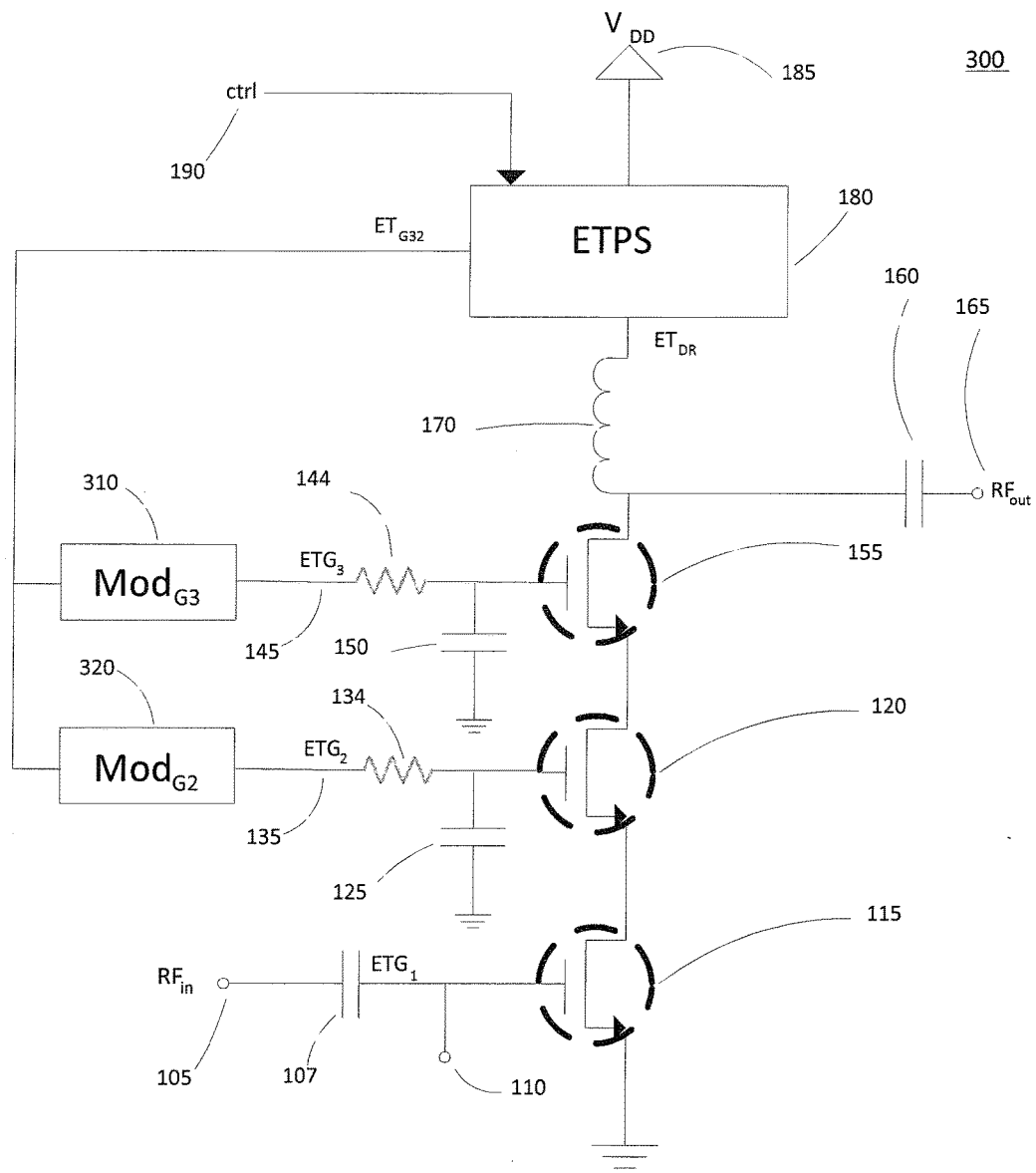
FIGS. 6-7 show example embodiments according to the present disclosure of an envelope tracking amplifier that is configured such that gate bias voltages applied to gates of different FETs can be independent of each other due to inclusion of gate modifiers.

FIG. 6 shows an embodiment according to the present disclosure of an envelope tracking amplifier (300) that is configured such that the gate bias voltages applied to node (145) and node (135) can be independent of each other due to inclusion of a third gate modifier (310) and a second gate modifier (320), both of which, alone or in combination, are example embodiments of bias adjustment circuitry. The third gate modifier (310) and the second gate modifier (320) can comprise circuits that are configured to independently scale, amplitude shift, phase shift, invert, and/or perform any mathematical operation (e.g. implemented by an op-amp circuit) of the dynamic bias voltage $ET_{G32}$ to generate the gate bias voltages $ET_{G3}$ and $ET_{G2}$ that are adapted to be applied to node (145) and node (135), respectively. The first gate ($ETG_1$) can be biased by, for example, a current mirror circuit connected to the gate of the first FET (110). Compared to the embodiment shown in FIG. 1, the embodiment shown in FIG. 6 provides additional freedom because voltages $ET_{G3}$ and $ET_{G2}$ are not tied together by a resistive voltage divider.

Figure 7:
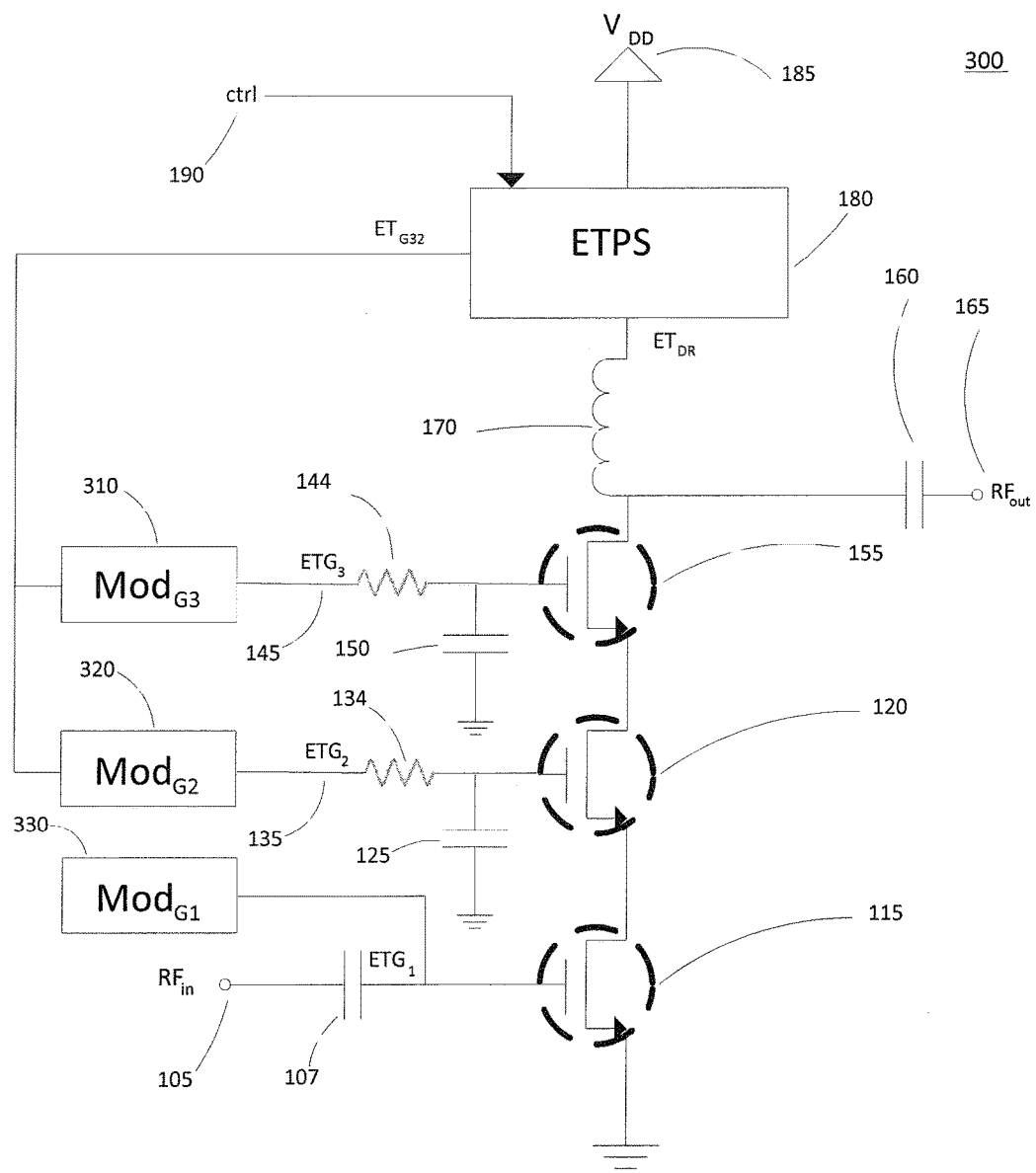

FIG. 7 shows an alternative embodiment where the gate of the first FET (115) can also be biased by a first gate modifier (330) in substantially a similar manner as the second gate modifier (320) and the third gate modifier (310). In some embodiments, the gate modifiers (310, 320, 330) can be made of a variety of analog or digitally tuned circuits known by those skilled in the art. By way of example and not of limitation, the gate modifiers (310, 320, 330) can be a simple op amp circuit, or an RLC circuit.

Figure 8:
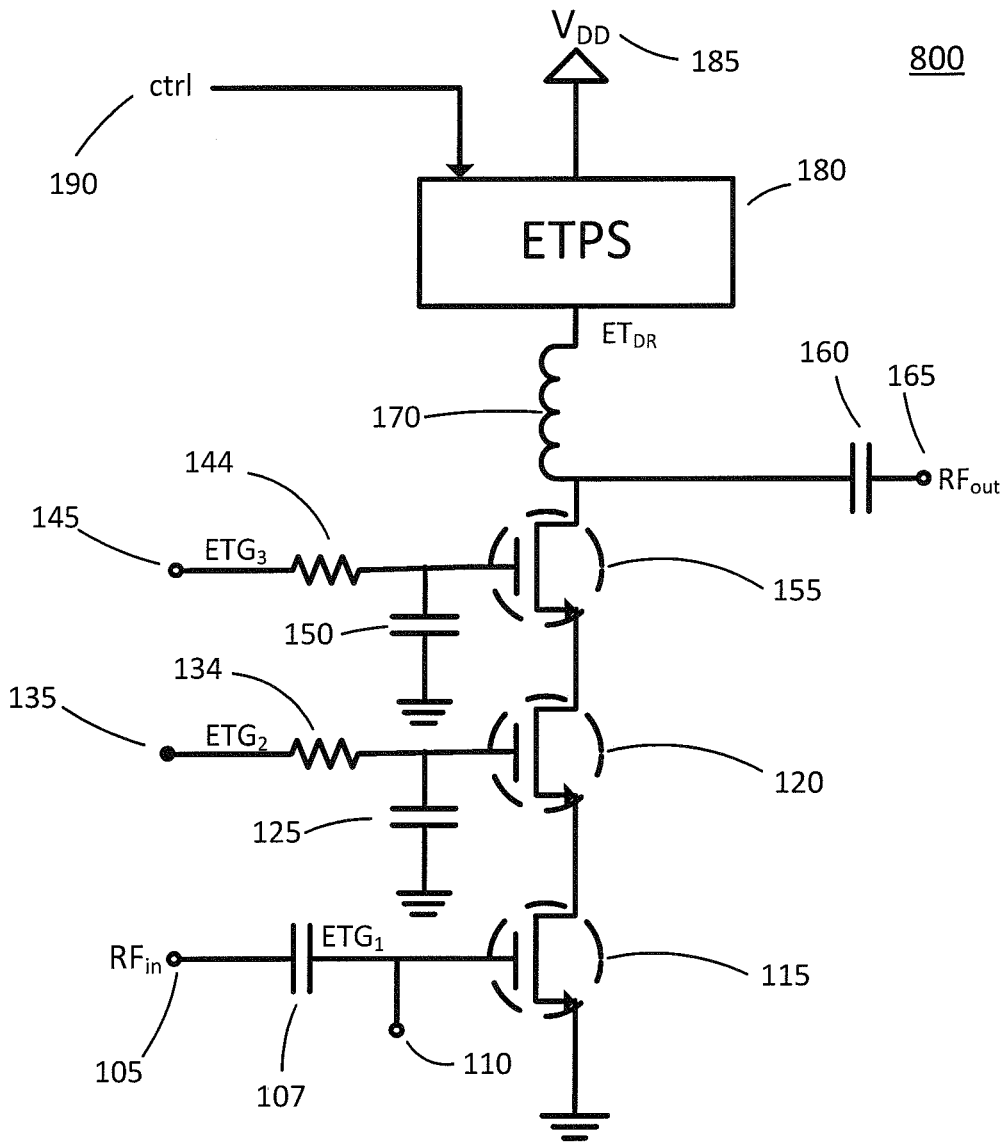
FIG. 8 shows an embodiment according to the present disclosure of an envelope tracking amplifier that is configured such that the gate bias voltages are supplied by a source (not shown) other than an ETPS (e.g. variable DC-DC converter).

FIG. 8 shows an embodiment according to the present disclosure of an envelope tracking amplifier (800) that is configured such that the gate bias voltages applied to node (145) and node (135) are supplied by a source (not shown) other than the ETPS (180). By way of example, and not of limitation, the source other than the ETPS (180) may comprise a baseband controller such as a transceiver unit (not shown). The baseband controller can be a part of an RF circuit that comprises the envelope tracking amplifier (800). Regardless of the method of supply of the gate bias voltage (e.g. to nodes (135), (145)), when operating in the envelope tracking mode, usually such gate bias voltage would share the characteristic of varying as a function of the envelope signal (e.g. FIG. 27). In some cases however, even though ET operation is desired, it may be desirable not to vary all of the gate bias voltages, as any one of the gates, including the gate of the input transistor (115), may be held at fixed voltage during ET operation. This selection, or optimization of gate bias voltage, is based on device choices, corresponding devices breakdown voltages, the choice of DC bias conditions, and voltage division through the stack, among other things.

Figure 8A:
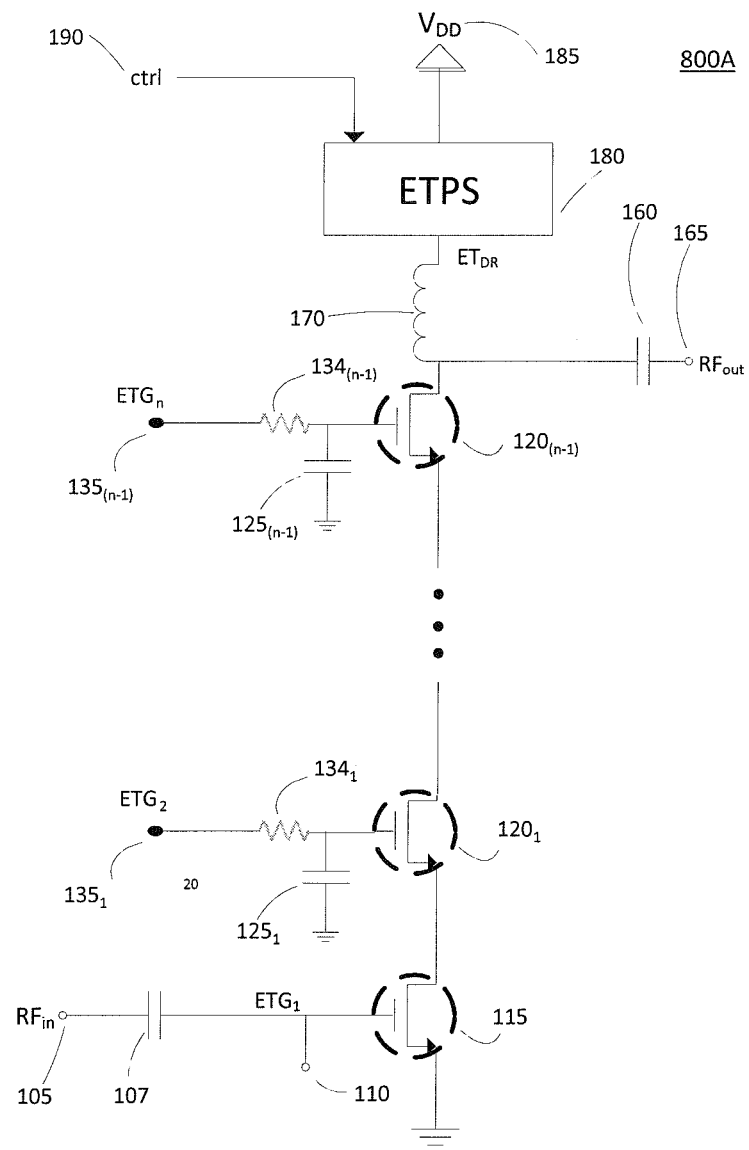
FIG. 8A shows the exemplary embodiment of FIG. 8 for a case where N stacked devices are used in the amplification stage, where N is larger than three.

FIG. 8A depicts the embodiment of FIG. 8 for a case where the number of stacked devices in the amplifier is n, where n is larger than three. The configuration of FIG. 8A allows the envelope tracking amplifier 800A to be fed (n−1) gate bias voltages via nodes $135_1$ through $135_{(n-1)}$. As previously mentioned, configurations with stacked higher than three devices can be applied to any of the embodiments of the present disclosure, and is not limited to FET devices only. Transistors in the stack can be of different sizes (e.g. oxide thickness) and types (e.g. different threshold voltages).

Figure 8B:
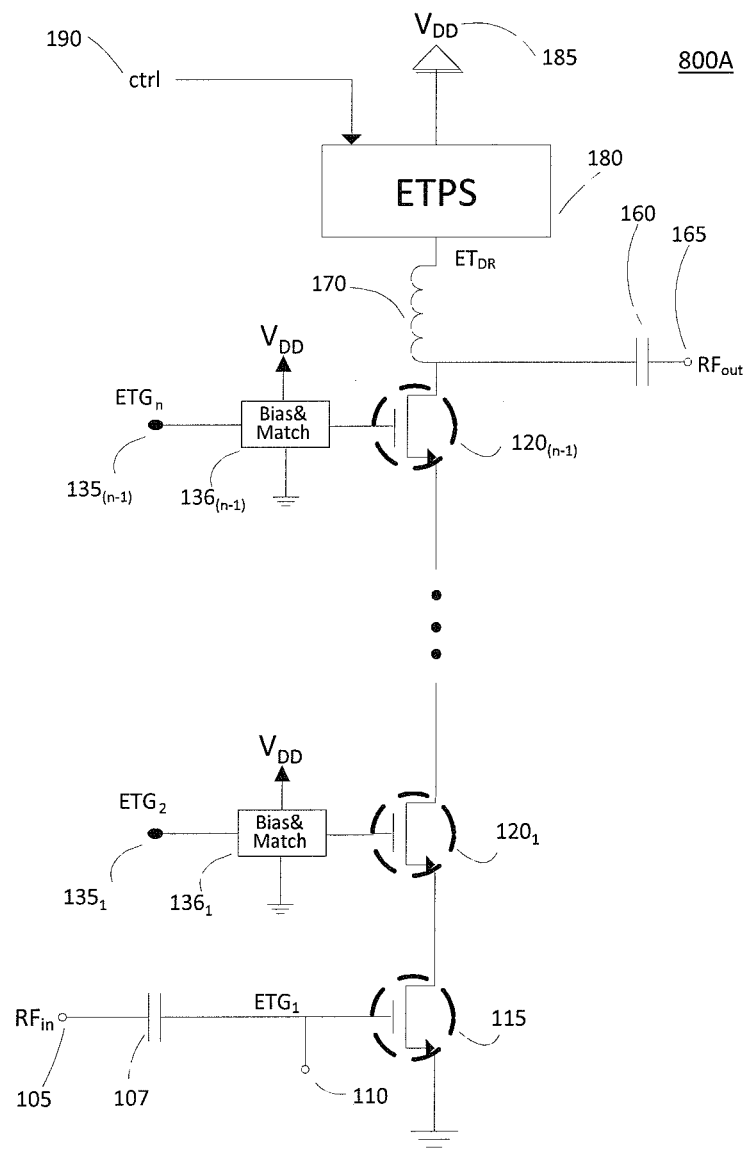
FIG. 8B shows an exemplary embodiment according to the present disclosure of an ET configuration where special bias and matching circuits are used at the gates of the transistor devices.

In some embodiments it may be desirable to replace the R-C networks (e.g. 134, 125 of FIG. 8A) at the gate of the cascode devices (or equivalent) with a different circuitry and as suited by the configuration. FIG. 8B shows such an embodiment according to the present disclosure, wherein the R-C networks at the gates are replaced with application specific biasing and matching circuits (136). These circuits may include a combination of active and passive devices and shape the input gate bias voltage ETG at terminals (135) to an effective gate bias voltage as required by the desired mode of operation of the ET amplifier. These circuits may operate at frequencies ranging from DC to the RF modulation frequency.

In some embodiments, the baseband controller can be used to generate the envelope signal, whether from the baseband signal or directly from the RF signal. Furthermore, the baseband controller can generate the gate bias voltages $ET_{G1}$, $ET_{G2}$, and $ET_{G3}$ in a manner similar to the embodiments previously discussed by scaling, amplitude shifting, phase shifting, inverting, and/or performing any mathematical operation (e.g. implemented by an op-amp circuit or digital signal processors) on the envelope signal. By way of example, and not of limitation, digital techniques (e.g. look-up tables, D/A and A/D converters) can be used to generate arbitrary voltage signals that are then used as the gate bias voltages $ET_{G1}$, $ET_{G2}$, and $ET_{G3}$. Analog circuit techniques may be used to generate arbitrary voltage signals (including fixed voltages) that can then be used as the gate bias voltages $ET_{G1}$, $ET_{G2}$, and $ET_{G3}$ as well. Example embodiments of such configurations can be found in FIGS. 53-70, which will be described in detail in later paragraphs.

Figure 10:
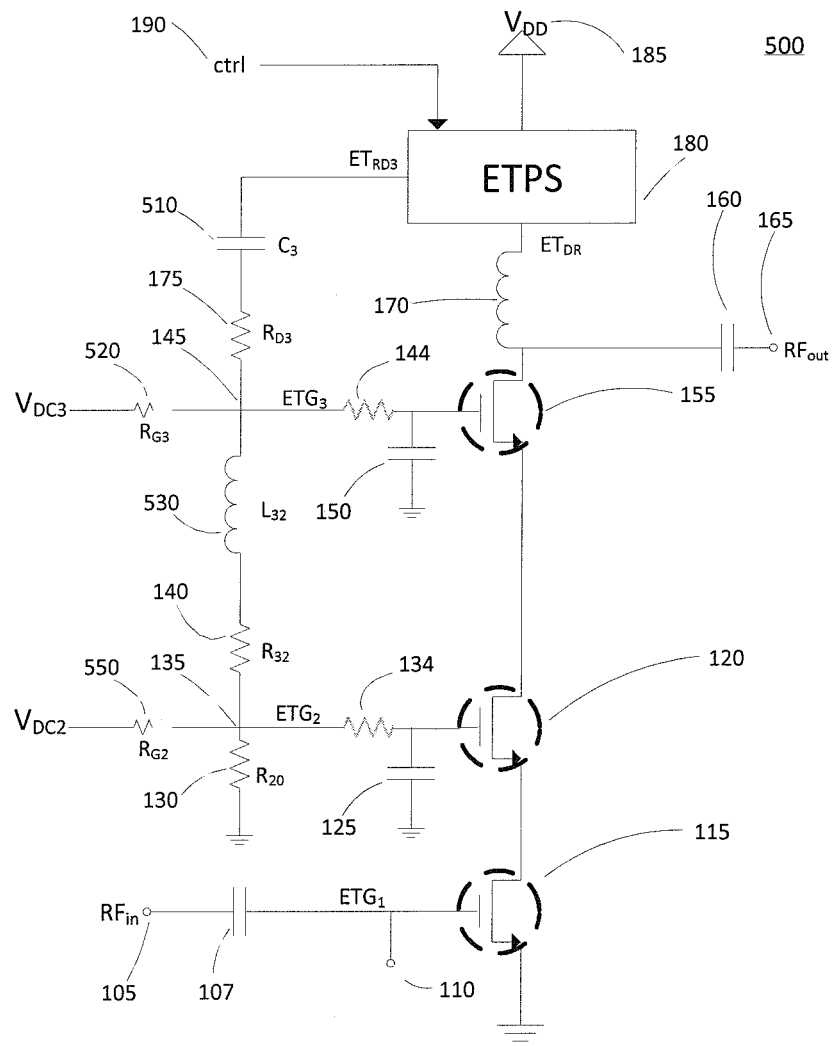
FIGS. 10-11 show example embodiments according to the present disclosure of an envelope tracking amplifier that is configured to introduce various phase shifts between the dynamic voltage applied to the drain and the dynamic bias voltages applied to the gates.
Figure 11:
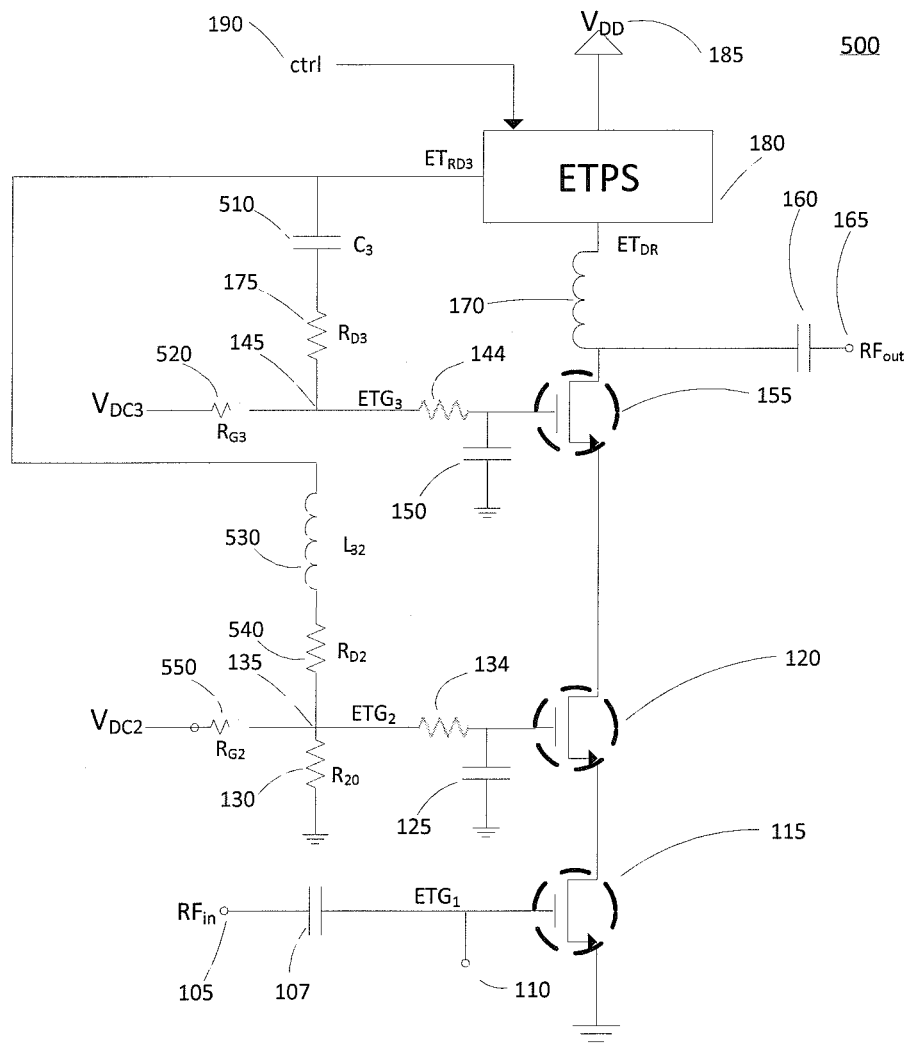

FIGS. 10-11 show example alternate embodiments of an envelope tracking amplifier (500) that is configured to introduce both a phase shift and/or amplitude changes in the dynamic bias voltage $ET_{RD3}$ prior to the dynamic bias voltage $ET_{RD3}$ being applied (by way of a capacitive-resistive network) to the gate of the third FET (155) and being applied (by way of an inductive-resistive network) to the gate of the second FET (120) as the dynamic gate bias voltages $ET_{G3}$ and $ET_{G2}$, respectively. The capacitive-resistive network and the inductive-resistive network, alone or in combination, are further example embodiments of bias adjustment circuitry. In comparison with the embodiment shown in FIG. 1, a capacitor (510) (e.g., a variable capacitor, digitally tunable capacitor) with a value represented by $C_3$ has been connected between the third resistor (175) and the ETPS (180) (e.g. variable voltage or current source). Additionally, a third gate resistor (520) with a value represented by $R_{G3}$ has been connected between node (145) and a DC voltage $V_{DC3}$.

The embodiments shown in FIGS. 10 and 11, as well as FIGS. 6, 7, and 8B allow for the ability to adjust the amplitude and phase of the envelope signal applied to the gates. This can be used as a modulation port for imparting modulation, or for a pre-distortion method to compensate for distortion in the amplifier. This is true for all modes of operation (linear, envelope following, envelope tracking, polar, and other modes).

The capacitor (510) may block a DC component of the dynamic bias voltage $ET_{RD3}$ and pass a time-varying component of the dynamic bias voltage $ET_{RD3}$. The DC voltage $V_{DC3}$ can restore the DC component of the dynamic bias voltage $ET_{RD3}$ to the gate of transistor (155). In a similar manner, $V_{DC2}$ can restore the DC component to the gate of transistor (120). The embodiment of FIG. 10 thus allows application of the DC component of the gate bias supplies separately from the dynamic component representing the envelope signal.

Capacitor (510) may be used to create a desired phase shift between the dynamic bias voltage $ET_{RD3}$ and the third gate bias voltage $ET_{G3}$. Circuit analysis that accounts for the resistor (520), the third gate capacitor (150), possibly a parasitic gate capacitance of the third FET (155), and other components surrounding node (145) to derive an equation for the amount of phase shift is within the capability of a person skilled in the art. Results of such analysis can be used to determine appropriate values of $C_3$, $R_{D3}$, $R_{G3}$, and the third gate capacitor (150) and resistor (144) that can yield a desired phase shift.

With further reference to FIG. 11, the inductive-resistive network comprises an inductor (530) with a value represented by $L_{32}$ (e.g., variable inductor, digitally tunable inductor) connected in series with a second resistor (540) with a value represented by $R_{D2}$. The inductive-resistive network is connected between node (135) and the ETPS (180). A DC bias voltage $V_{DC2}$ may be overlaid to the envelope signal at node (135). The circuit comprising the inductor (530), the second resistor (540), and the second resistor (130) forms a voltage divider from the dynamic bias voltage $ET_{RD3}$ to the second gate bias voltage $ET_{G2}$. Assuming that the voltage source that connects to $R_{G2}$ has a low output resistance when compared with $R_{G2}$, the second gate bias voltage $ET_{G2}$ that results from such voltage divider can be determined according to the following equation:

$$ET_{G2}=ET_{RD3}*(R_{20}//R_{G2}/(R_{20}//R_{G2}+R_{D2}+j\omega L_{32})$$

The // sign indicates a parallel combination of resistors where: Rparallel=(R1*R2)/(R1+R2).

Complex number analysis of the equation stated above can reveal that a phase shift in an amount equal to an inverse tangent of a quantity represented by $\omega*L_{32}/(R_{20}+R_{D2})$ can occur between the dynamic bias voltage $ET_{RD3}$ to the second gate bias voltage $ET_{G2}$. A more complete analysis that accounts for the second gate capacitor (125) and possibly a parasitic gate capacitance of the second FET (120) is within the capability of a person skilled in the art. Results of such analysis can be used to determine appropriate values of $L_{32}$, $R_{D2}$, $R_{20}$, and the second gate capacitor (125) that can yield a desired phase shift.

In other embodiments similar to FIGS. 10-11, phase shifts may be introduced in signal paths between the ETPS (180) and the gates of the second and third FETs (120, 155) by using capacitive-resistive networks in both signal paths, or by using inductive-resistive networks in both signal paths. In other embodiments, a capacitive-resistive network can be used to introduce a phase shift in a signal path between the ETPS and node (135) while an inductive-resistive network is used to introduce a phase shift in a signal path between the ETPS (180) and node (145). Alternatively, a phase shift may be introduced in a signal path between the ETPS (180) and a gate of one FET from among the second and third FETs (120, 155) while the other FET from among the second and third FETs (120, 155) receives a dynamic bias voltage that has not been phase shifted. A person skilled in the art will not require further diagrams to understand such embodiments.

Figure 12:
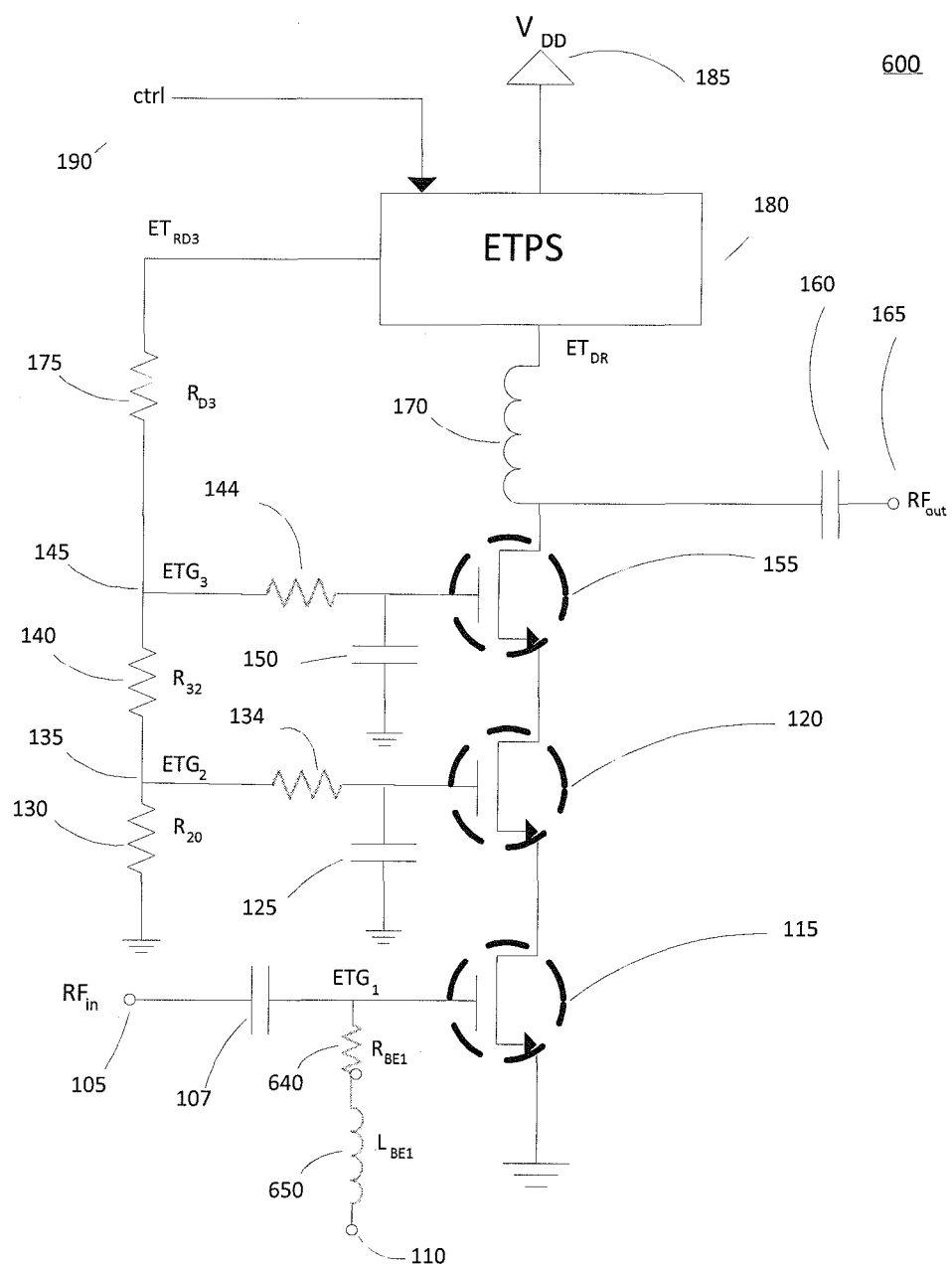
FIG. 12 shows an example embodiment according to the present disclosure of an envelope tracking amplifier that can phase shift a bias input to the gate of the first FET.

FIG. 12 shows an embodiment according to the present disclosure of an envelope tracking amplifier (600) similar to the envelope tracking amplifier (100) of FIG. 1 except for a circuitry being added to introduce a phase shift in the dynamic bias voltage or current that is applied to the first gate bias node (110). By way of example and not of limitation, an inductive-resistive network similar to the inductive-resistive network shown in FIGS. 10-11 is connected between the gate of the first FET (115) and the first gate bias node (110) to phase shift the signal between the first gate bias node (110) and the gate of the first FET (115). The example inductive-resistive network comprises an inductor (650) with a value represented by $L_{BE1}$ connected in series with a resistor (640) with a value represented by $R_{BE1}$. Analysis and design of the inductive-resistive network comprising the inductor (650) and the resistor (640) is within reach of the skilled person.

In some embodiments, a capacitive-resistive network can be connected between the first gate bias node (110) and the gate of the first FET (115). In circuits where the capacitive-resistive network is connected between the first gate bias node (110) and the gate of the first FET (115), a DC voltage can also be applied to the gate of the first FET (115) to restore a DC component of a dynamic bias voltage that is applied to the first gate bias node (110), in a manner similar to the capacitive-resistive network shown in FIGS. 10-11.

Figure 13:
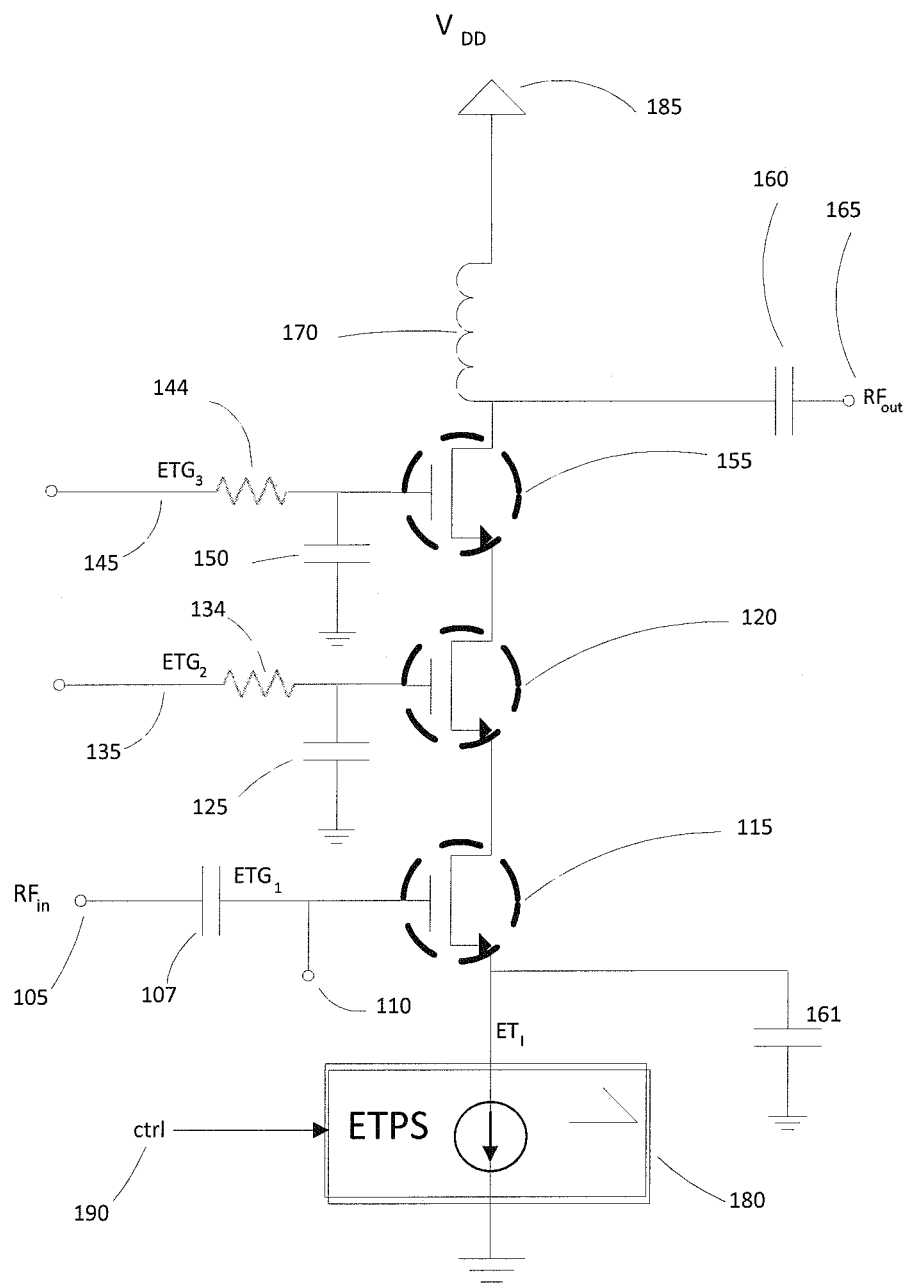
FIG. 13 shows an example embodiment according to the present disclosure of an envelope tracking amplifier wherein the ET power supply is a variable current source.

FIG. 13 shows an example embodiment according to the present disclosure of an envelope tracking amplifier wherein the ET power supply is a variable current source. In this configuration the ETPS (180) is a current source, connected to the source terminal of transistor (115), and which modulates the current of the stack via its input control signal (190). Main supply power is still provided by $V_{DD}$ (185), now connected to the inductor (170). A capacitor (161) is connected between the source terminal of transistor (115) and ground. At RF frequency, the equivalent impedance of the capacitor is very small, effectively providing an RF ground to the source of the transistor. In this configuration, gate biases are controlled in a similar manner as in the previous cases.

Figure 14:
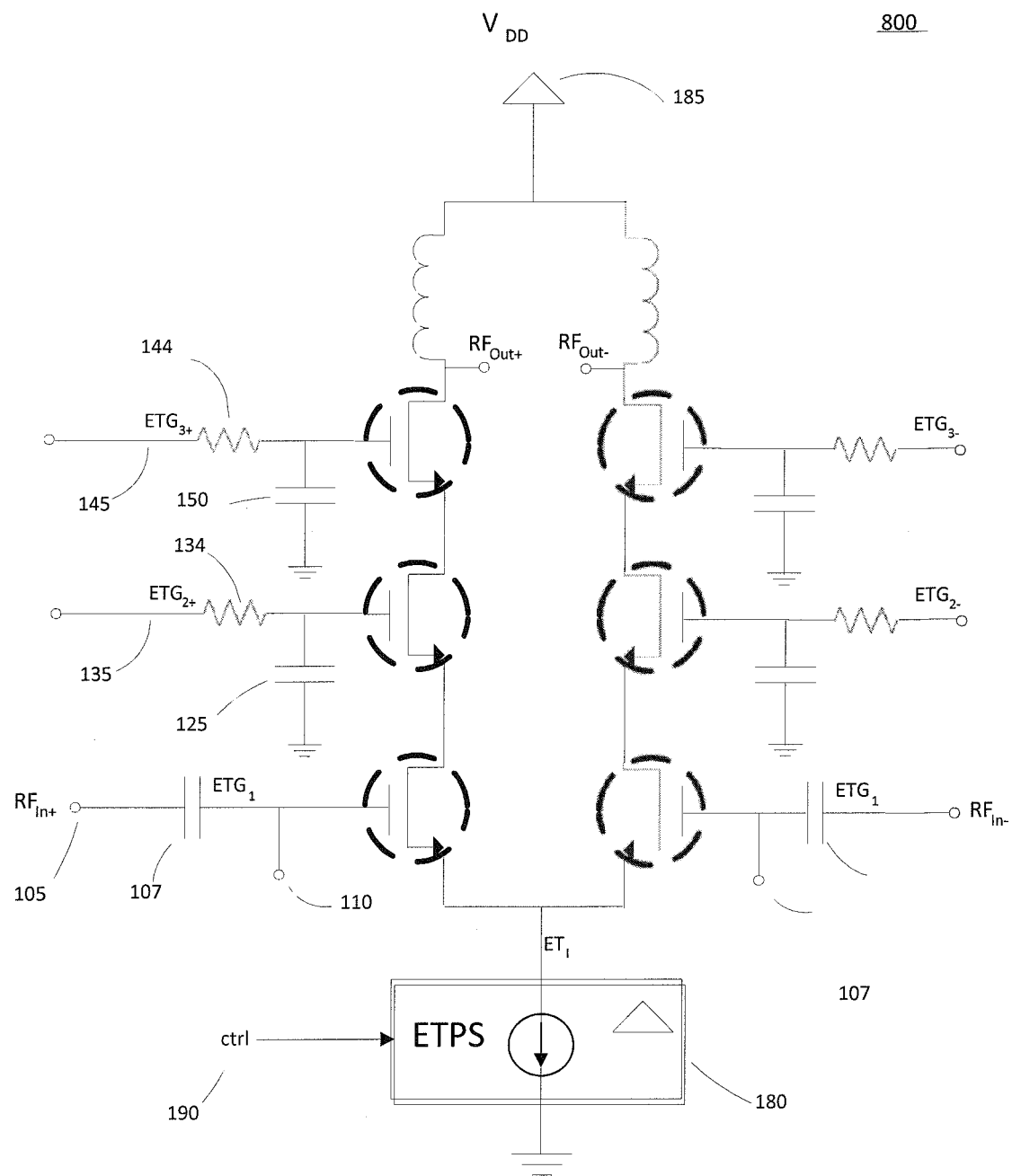
FIG. 14 shows an example embodiment according to the present disclosure of a differential input envelope tracking amplifier wherein the ET power supply is a variable current source.

FIG. 14 shows an example embodiment according to the present disclosure of a differential envelope tracking amplifier wherein the ET power supply is a variable current source. In this configuration the input RF signal, as well as the various bias supplies, may be provided differentially to the corresponding complementary input terminals. It is to be noted that in some cases, nodes $ET_{G3+}/ET_{G3-}$ and $ET_{G2+}/ET_{G2-}$ may be connected to create a single gate bias node for each transistor pair, such as single ended bias supplies may be provided to the gates of the transistor pairs through these nodes. In the embodiment of FIG. 14, node ($ET_1$) is a virtual ground. In general, for all the arrangements disclosed, the source terminal of the input transistor is connected to a reference potential of the arrangement, which may be effectively a system reference ground as in FIGS. 1-4, an RF ground as in FIG. 13, or a virtual ground as in FIG. 14.

Figure 15:
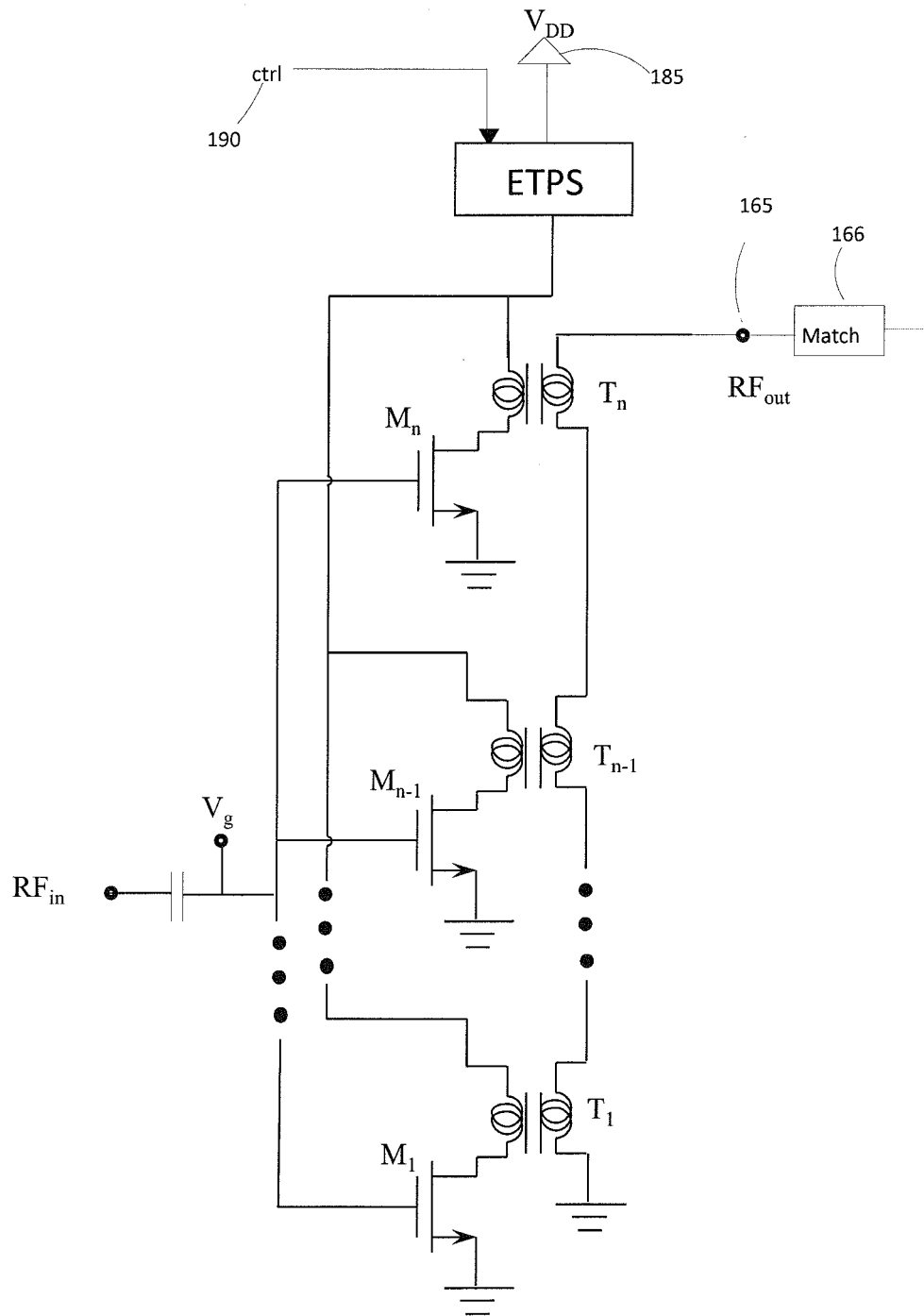
FIG. 15 shows an example embodiment according to the present disclosure of a combined output envelope tracking amplifier, wherein transformers are used to combine outputs of the various transistors of a stack.
Figure 18:
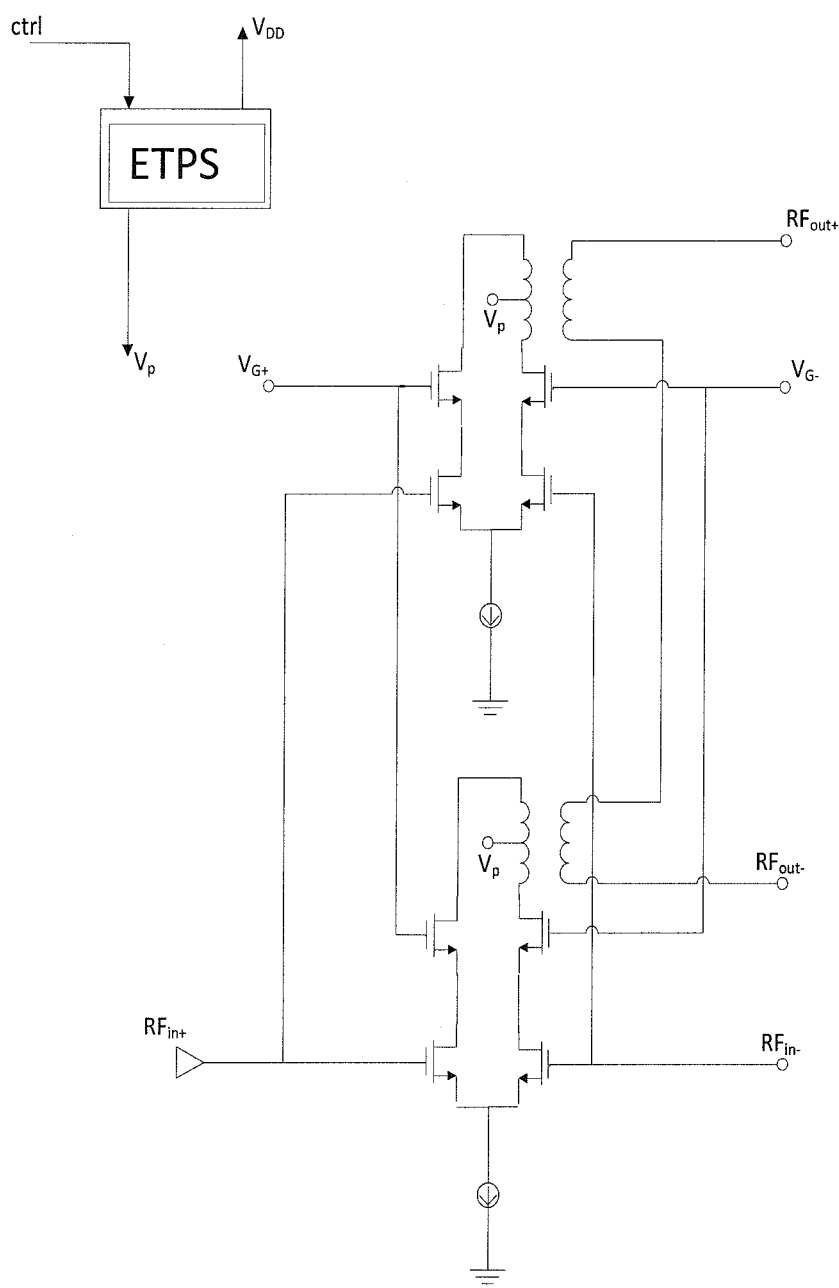
FIG. 18 shows a differential input/output configuration of the embodiment of FIG. 15.

FIG. 15 shows an example embodiment according to the present disclosure of a combined output envelope tracking amplifier, wherein transformers ($T_n$, $T_{n-1}$, ..., $T_1$) are used to combine outputs (power) of the various transistors ($M_n$, $M_{n-1}$, ..., $M_1$). In this embodiment the input RF signal is fed to all the transistors in parallel, which thus have a common input node at their gates. Each transistor is thus biased similarly, by way of the common gate bias voltage ($V_g$), and the variable supply provided by the ETPS unit to their drains via a plurality of transformer chokes (primary side of the transformer). In this configuration, the gate bias voltage may be further modified dynamically as per prior description (e.g. envelope signal). The person skilled in the art will understand that each of the transistors ($M_n$, $M_{n-1}$, ..., $M_1$) may be replaced by a cascode configuration for higher RF output power capability and/or higher gain. Similarly, the same person may envision a differential implementation of this embodiment. FIG. 18 shows such an example, wherein differential input/output amplifiers in cascode configuration are used.

Figure 16:
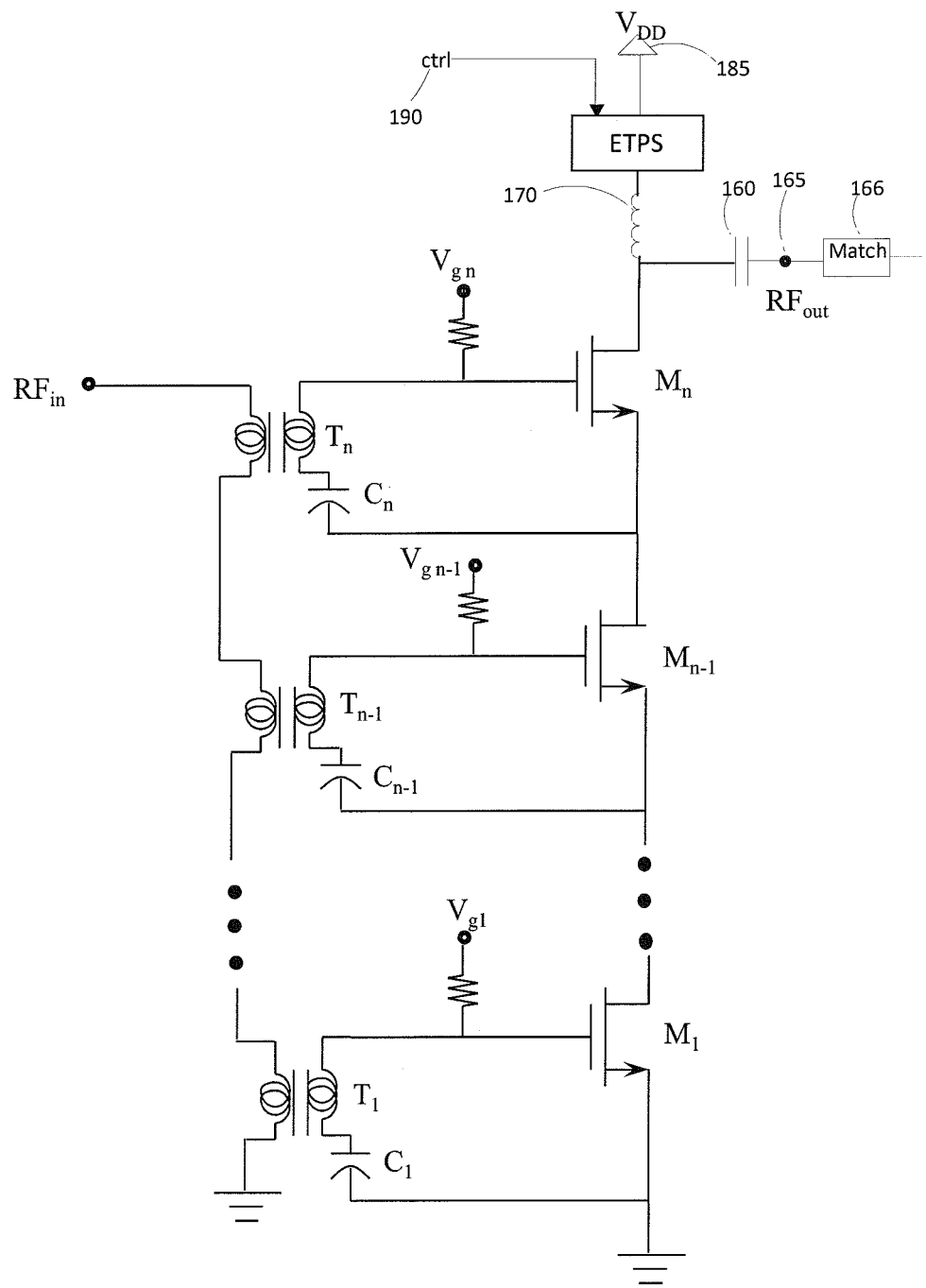
FIG. 16 shows an example embodiment according to the present disclosure of a transformer-coupled envelope tracking amplifier, wherein transformers are used to couple the various input gates of transistors of a stack to an input signal.

FIG. 16 shows an example embodiment according to the present disclosure of a transformer-coupled input envelope tracking amplifier, wherein transformers ($T_n$, $T_{n-1}$, ..., $T_1$) are used to couple the various input gates of transistors of a stack to an input RF signal. In this configuration, transistors from the stack are connected in a series configuration (e.g. source to drain), with power from the ETPS unit connected to the transistor at the top ($M_n$), and a reference potential (e.g. ground) connected to the source terminal of the bottom transistor ($M_1$). Dynamic gate biasing may be provided via voltages ($V_{gn}, V_{g(n-1)}, \ldots, V_{g1}$), which with the help of the capacitors ($C_n, C_{n-1}, \ldots, C_1$) set the gate-to-source voltages for each of the transistors. The person skilled in the art will notice that in this embodiment $V_{gn} > V_{g(n-1)} > \ldots > V_{g1}$. The person skilled in the art will understand that each of the transistors ($M_n, M_{n-1}, \ldots, M_1$) may be replaced by a cascode configuration for higher RF output power capability and/or higher gain. Similarly, the same person may envision a differential implementation of this embodiment.

Figure 17:
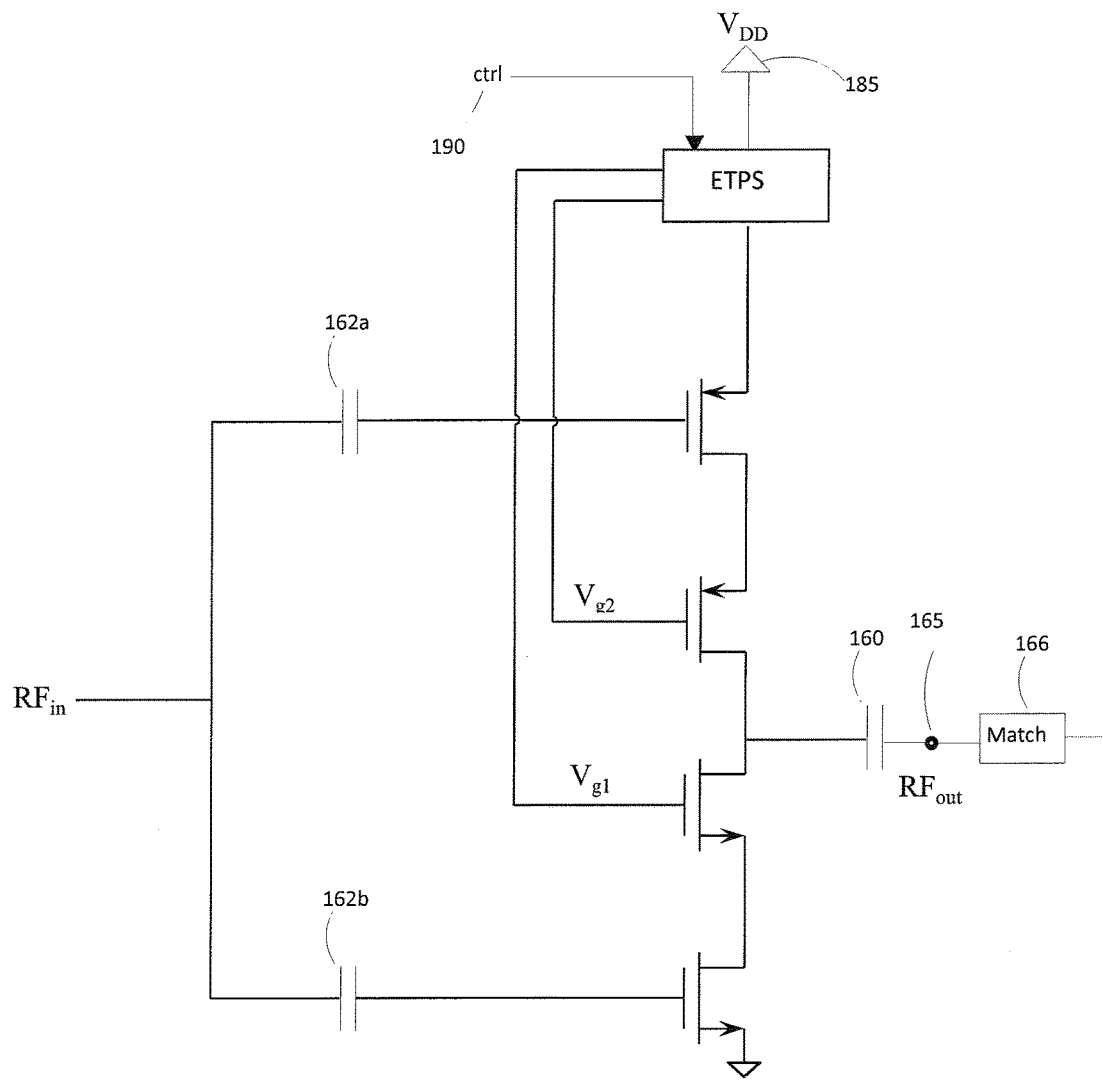
FIG. 17 shows an example embodiment according to the present disclosure of an envelope tracking amplifier with push-pull output stage.

FIG. 17 shows an example embodiment according to the present disclosure of an envelope tracking amplifier with push-pull output stage. In this configuration the top of the stack may comprise a number of P-type MOSFET devices connected in a series configuration, and the bottom may comprise the same number of N-type MOSFET devices also connected in a series configuration. The middle two devices are thus of opposite types and interconnected at their drain terminals. In this embodiment the input RF is fed to the top and bottom devices, via input coupling capacitors (162a, 162b), which in turn propagates through the top and bottom halves of the stack in a complementary fashion, yielding in outputting the amplified RF output signal from one half of the stack or the other half of the stack. In some embodiments both halves may output simultaneously but at different power levels. Biasing of the gates may be provided via fixed voltages, or via dynamic voltages (Vg1, Vg2) as depicted in FIG. 17 and generated within the ETPS unit. The person skilled in the art will understand that each of the transistors may be replaced by a cascode configuration for higher RF output power capability. Similarly, the same person may envision a differential implementation of this embodiment.

As previously discussed, in the case of an amplifier configured for ET operation, also referred to as "ET mode of operation", such amplifier is susceptible to operate in either the linear or the compression region, latter being the desired region of operation. Furthermore, when the amplifier is not configured for ET mode of operation (non-ET mode), for example by virtue of supplying a fixed supply voltage to the amplifier, the amplifier is also susceptible to operate in either linear or compression regions, but in such case the desired region of operation is the linear region.

As discussed in prior sections, ET amplifiers operate as a function of an envelope of the input RF signal, referred to as the envelope signal, to the amplifier which may be applied to their supply and biasing inputs. The envelope signal can be equivalent to the time varying tracking signal corresponding to the successive peaks of the input RF signal. When the output of the amplifier tracks the envelope signal due to a change in the applied supply level, the amplifier operates mainly in the highly efficient compression region. When operating in this region, the applied supply restores the amplitude of the output which is lost due to operation in the compression region of the amplifier (AM/AM distortion). Alternatively and mainly at low input power levels, the amplifier output follows the envelope of the input RF signal and operates in the linear region, which is a less efficient region of operation typical to non-ET configurations.

One of the main drives for ET implementation within power amplifiers is the improvement in power efficiency while maintaining a good linear response of the amplifier. ET seeks to improve efficiency by adjusting the supply power based on roughly following the time varying envelope signal thereby adjusting the supply power to the amplifier based on the potential demand. Thus less supply power is provided for lower level input signals, thereby reducing wasted power provided to the amplifiers. Adjustment of the supply power for ET implementation can be done by either adjusting the supply voltage (FIGS. 1, 3, 4) to the amplifier or by adjusting the supply current (FIGS. 13-14) to the amplifier. In both cases, a supply control signal derived from the envelope signal and encompassing desired ET behaviors may be used to dynamically adjust the ET supply power.

The supply control signal is constructed using the envelope signal and such as to reflect limitations associated with ET mode of operation, such as bandwidth limitation of the dynamic output of the variable power supply as well as limitations in output linearity of the amplifier at low power levels when operating in the compression region (e.g. due to low $V_{DS}$ voltage across one or more of the stack transistors), latter limitation defining a minimum preset power level for ET mode of operation. Additional scaling and offset components are applied to the control signal such as to map the output signal of the amplifier to the desired operational range.

Even though the amplifier is set to operate in ET mode, there are instances when the combination of low input RF power level to the amplifier and the ET supply power level (controlled by the supply control signal) removes the amplifier from the compression region and puts it into the traditional linear region of operation typical to non-ET configurations. This switching from compression region to linear region of operation and vice versa, is dependent on the modulation scheme used on the input RF signal, but expected to occur especially in RF signals with high peak-to-average power ratio.

Figure 27:
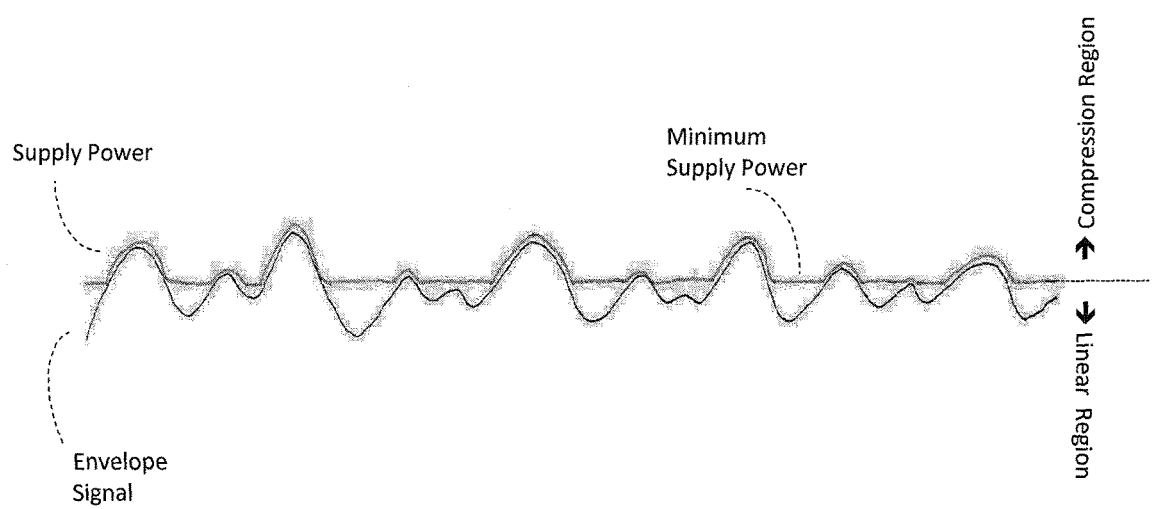
FIG. 27 shows an example of an envelope signal, associated amplifier supply power and region of operation for an amplifier operating in an envelope tracking mode.

FIG. 27 shows an example of an envelope signal and associated amplifier supply power when operating in ET mode. The supply power follows the time varying envelope signal (e.g. amplitude varies as a function of time) during its peaks, pushing the amplifier to operate in compression and controlling the envelope through the applied envelope voltage. As the supply power lowers and reaches its minimum preset level, the supply stops following the envelope signal and thus the amplifier starts operating in the less efficient linear region wherein the supply level is static. In an ET mode, the linear region of operation is thus characterized by the region wherein the supply power is set to the minimum preset value.

As discussed earlier, operating in the compression region has the advantage of linearity and reduced power dissipation to some degree. FIGS. 29A and 29B show the level by which the dissipated heat can be reduced between a traditional fixed supply operation depicted by FIG. 29A, and a variable supply operation depicted by FIG. 29B (not accounting for difference in heat dissipation between the power supplies operating at these different regions), where the supply closely follows the envelope signal of the modulation. Going to FIG. 29C, the power added efficiency (PAE) versus output power is plotted for the same two cases of operation. During linear operation, for a given fixed supply, the PAE rises with a rise of the output power until the output eventually saturates (e.g. close to saturation) and the PAE reaches a maximum practical level, for example around 28% at an output power level of 15.5 dBm for a supply voltage of 1.5 volts. This maximum practical level is a function of the fixed supply voltage, and rising the fixed supply voltage will yield to higher maxima values for the PAE as depicted by FIG. 29C, where the PAE is plotted for various fixed supply voltages, ranging from 1.5 volts to 6 volts. In the case where the amplifier operates in the compression region and with a variable supply voltage, the PAE follows the heavy dashed curve, which corresponds at a higher output power range to the points swept by the maxima of the fixed supply operation, and at a lower output power range it falls back into a linear operation. This fall back occurs at an equivalent power supply level of 1.5 volts. This level is the "minimum level" referenced in FIG. 29 and discussed in the following paragraphs.

When the amplifier makes the transition from the compression region to the linear region, it operates with less power efficiency and with some added level of distortion to the amplified output as the benefit of AM/AM amplitude correction via supply power modulation is lost. Another undesired side effect of the switching between regions of operation of the amplifier is the change in gain at the output of the amplifier stage; when in the compression region the output signal is clipped and thus reduces the gain of the amplifier as compared to the gain obtained when operating in the linear region.

The present disclosure provides systems and methods by which said limitations can be overcome or at least reduced by some degree. For example, a feedback network can be used within a feedback path around an ET amplifier to create a closed loop configuration such as to optimize response when the amplifier is pushed into operating in the linear region. Given the electrical characteristics of the amplifier, traditional feedback amplifier design techniques can be used to optimize amplifier performance in the linear region and thus positively affect corresponding vital parameters such as gain, phase, distortion and stability. This feedback network can be switched in and out, to effectively activate and de-activate the feedback loop, in unison with the desired operational mode and/or region of operation of the amplifier (ET versus non-ET modes or compression versus linear regions) and under control of a main controller unit which may be aware of the input RF signal to the amplifier or the corresponding envelope signal.

One example of this benefit is that by using feedback in the linear region and removing the feedback in the compressed region is that the gain and efficiency are maximized in the compressed region, while linearity is maximized in the linear region. Another example is that using feedback in the linear region and removing the feedback in the compressed region lets one choose how much gain and thus gain compression (e.g. amount of gain less than the equivalent gain in the linear region) they want in their system as a design parameter, not just a device property.

In another embodiment further linearization of the amplifier can be obtained by adjusting the various gate bias supplies (e.g. $ETG_1$, $ET_{G2}$, $ETG_3$ of FIGS. 1, 3-4, 6-14) such as to compensate for changes in the gain curves of individual transistors of the stack as the ET supply power (e.g. voltage) varies. A controller which is aware of the ET supply power level or the corresponding controlling signal, in combination with lookup tables (shaping tables) containing transistor characteristic data (e.g. current gain characteristic curve . . . ), may be used to create and apply the desired adjustments.

Figure 28:
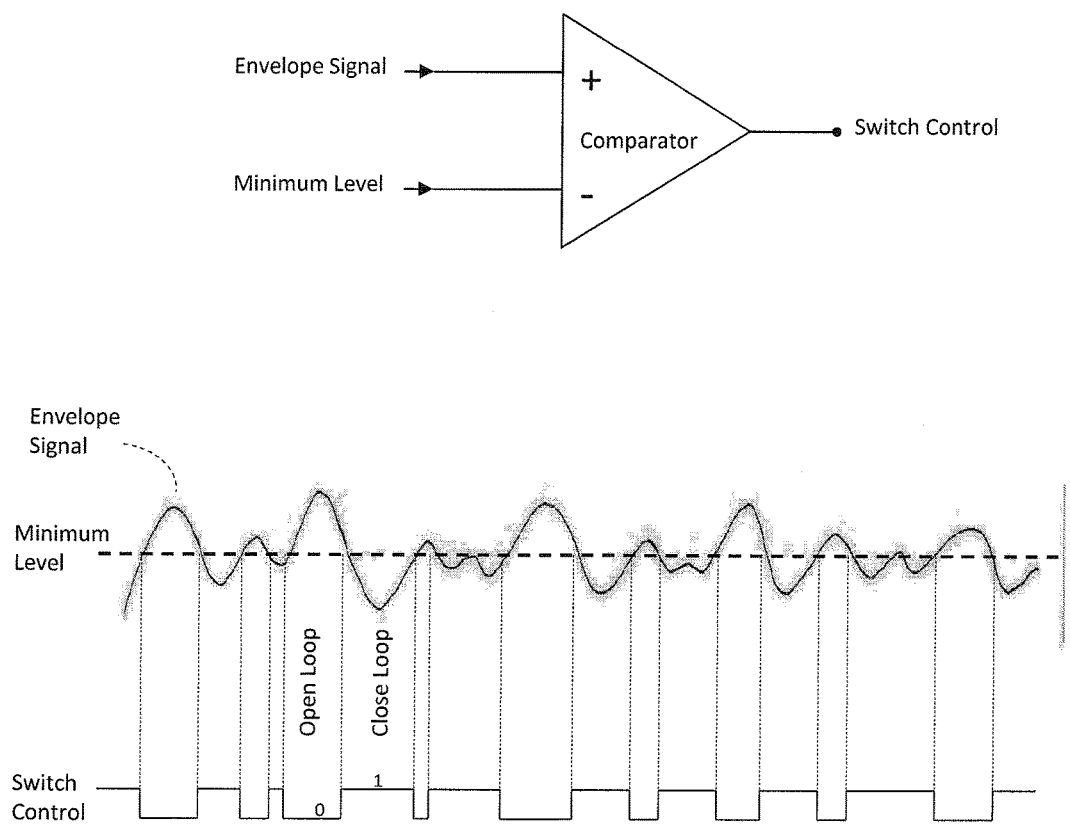
FIG. 28 shows an exemplary method of detecting a switch control signal as well as the relationship between a switch control, the feedback loop status (open/close) and the envelope signal.
Figure 30:
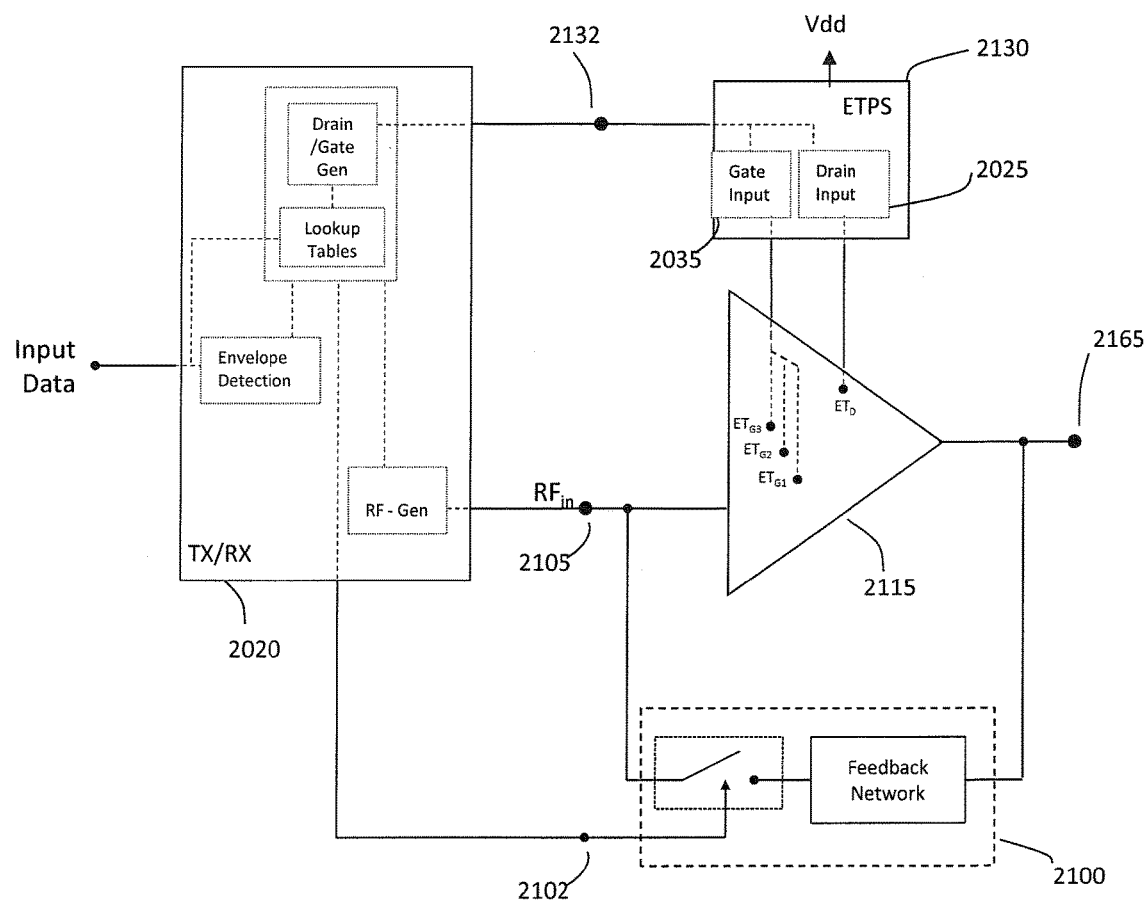
FIG. 30 shows an exemplary system configuration for proposed embodiment, wherein a transceiver is used as main controller.

Such a controller mentioned in the above embodiments can be the transceiver unit traditionally used in modern communication systems. The controller can generate a switch control signal which is synchronized to the change in operational mode/region of the amplifier. FIG. 30 shows such an embodiment, wherein the switch control signal is generated within the transceiver unit (2020) and fed to switch control input terminal (2102). In the embodiment of FIG. 30, the same transceiver unit (2020) generates the supply control signal which in turn is fed to input terminal (2132) of the ET power supply unit (2130), which latter uses to generate the effective supply power to the amplifier stage (2115) via its internal dedicated circuitry (gate input and drain input modules (2025, 2035)). 138 FIG. 28 shows a relationship between the switch control, the feedback status (open loop, close loop) and the amplifier operating region. In FIG. 28, a comparator unit is used to generate the switch control signal, as an alternative method to having a controller, such as one shown in FIG. 30, perform this task. As shown in FIG. 28, the envelope signal and a preset minimum value corresponding to the minimum supply power to the ET amplifier are the inputs to the comparator. In FIG. 28, it is assumed that the switch is open when input switch control is in a low state (e.g. value of 0). A person skilled in the art will understand that other implementations to obtain the switch control signal are possible. Also, one skilled in the art will understand that it is not limited to open and closed loop, but can be a switching between different levels of feedback or even a continuously variable level of feedback. FIG. 28 shows the feedback being switched based on the envelope compared to a reference level. As mentioned, the feedback could be continuously varied, for example based on the envelope voltage, or other parameters such as input power level.

Figure 29:
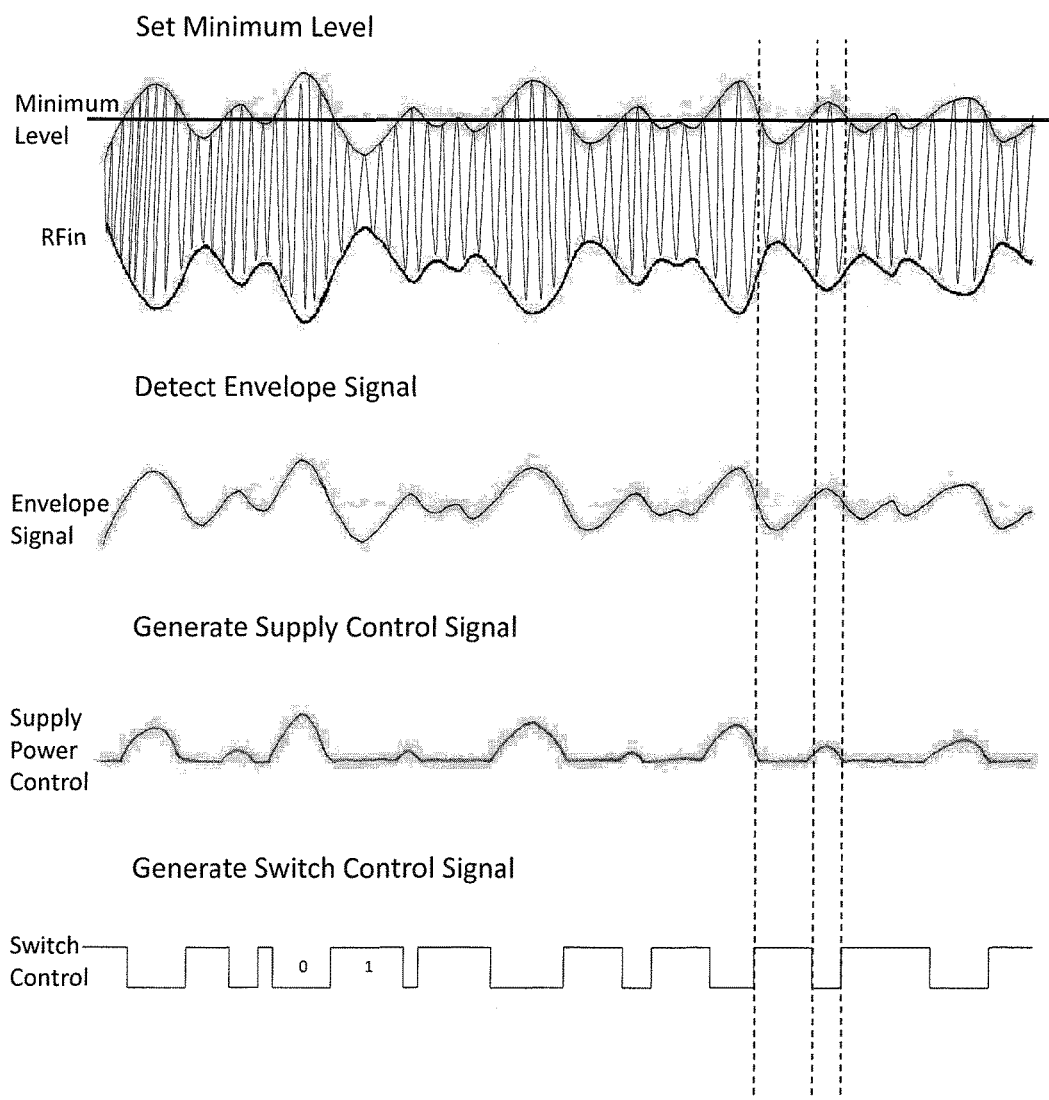
FIG. 29 shows relationship amongst various signals used in the proposed embodiment.
Figure 29A:
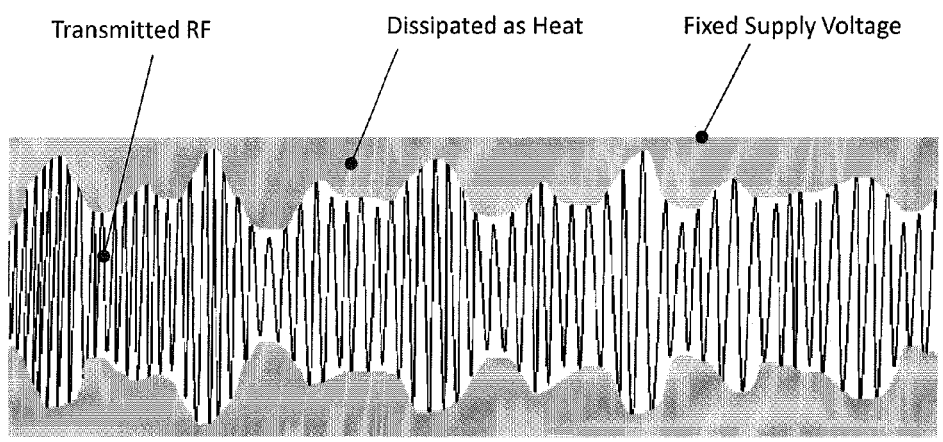
FIGS. 29A and 29B contrast the dissipated power in an amplifier operating in a linear region where the supply power is fixed, versus an amplifier operating in a compression region where the supply power follows the envelope of the input RF signal.
Figure 29B:
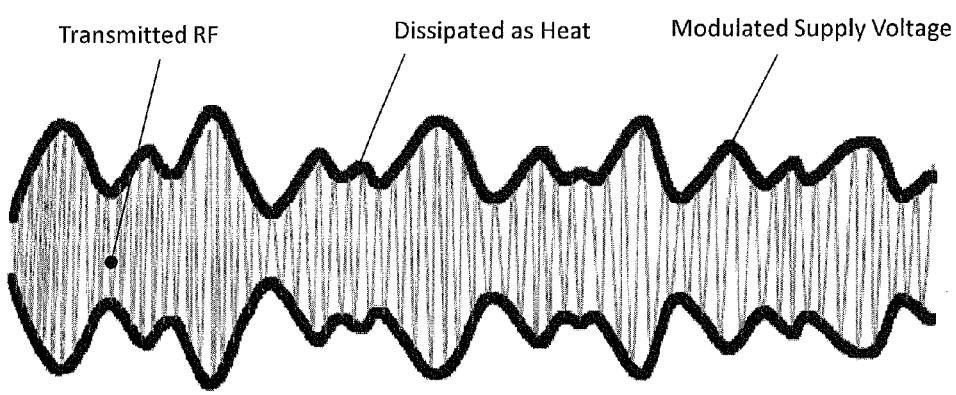
Figure 29C:
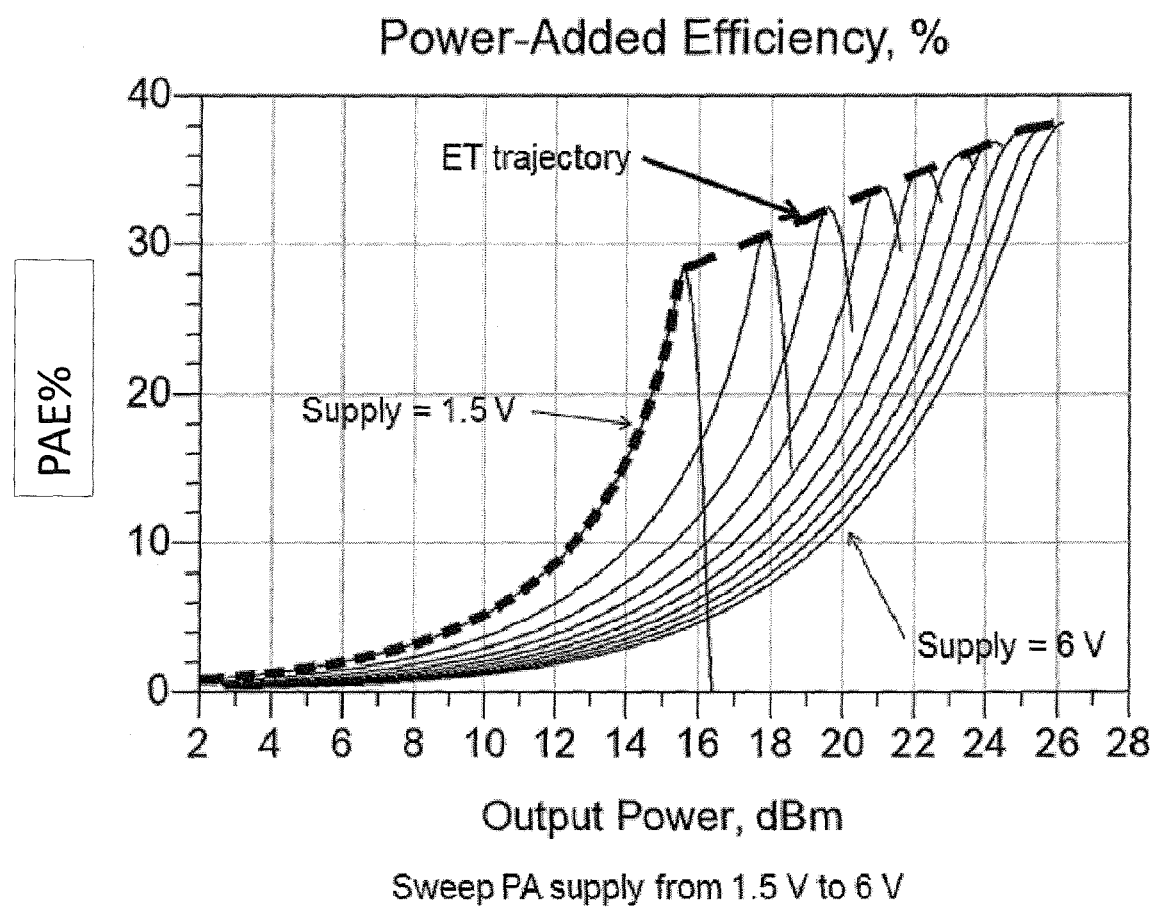
FIG. 29C contrasts the Power-Added Efficiency (PAE) of an amplifier operating in a linear region at different fixed supply voltages versus an amplifier operating in a compression region where the supply power follows the envelope of the input RF signal.

FIG. 29 is an exemplary depiction of relationships between the various signals mentioned in previous paragraphs. Starting from the $RF_{in}$ signal and a preset minimum level corresponding to the minimum ET supply power level, the envelope signal, the supply power control signal and the switch control signal are generated.

Figure 20:
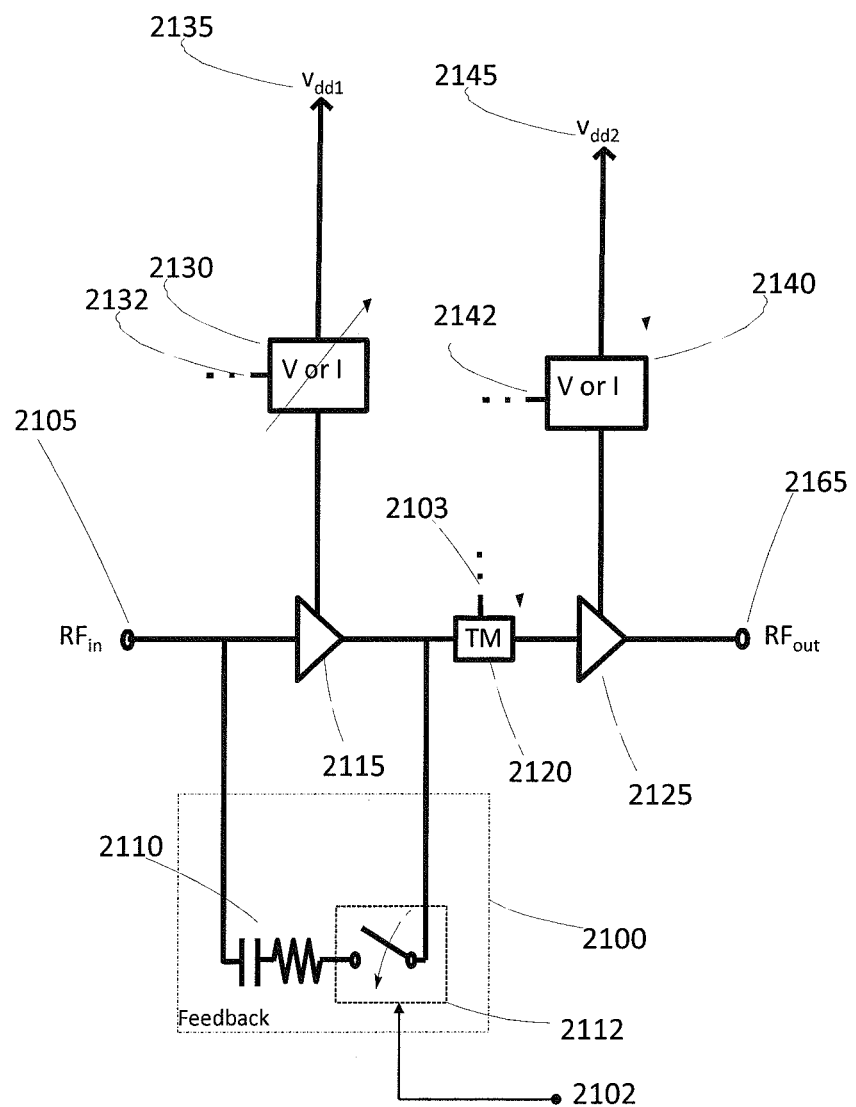
FIG. 20 shows embodiments where a feedback network and a tunable matching network are connected to an amplifier arrangement comprising a plurality of amplifiers, each amplifier being provided with its own power source, used to bias the amplifier and to provide power to the amplifier. Each amplifier of FIG. 20 may operate in either an ET or a non-ET mode.

Furthermore and in order to compensate for possible mismatch of the output impedance of the amplifier stage between the two distinct configurations (feedback loop active and feedback loop not active), and thus loss of effective output power seen by the next stage, a tunable matching network can be added at the output stage of the power amplifier (e.g. FIG. 1). Same controller unit as previously mentioned can control such a network as well. FIG. 20, later described in detail, shows an embodiment wherein a switchable feedback network (2100) is used within a feedback path created around a first stage amplifier (2115), which is followed by a tunable matching network (2120). The tunable matching network may be continuously variable or variable in discrete steps under control of an input control signal (2103). Same tunable matching network may also be used for modifying the load lines of the amplifier stage (2115) and thus impact gain, since amplifier gain is proportional to its load (e.g. $G_{voltage} \approx g_m \times R_{Load}$).

Figure 21:
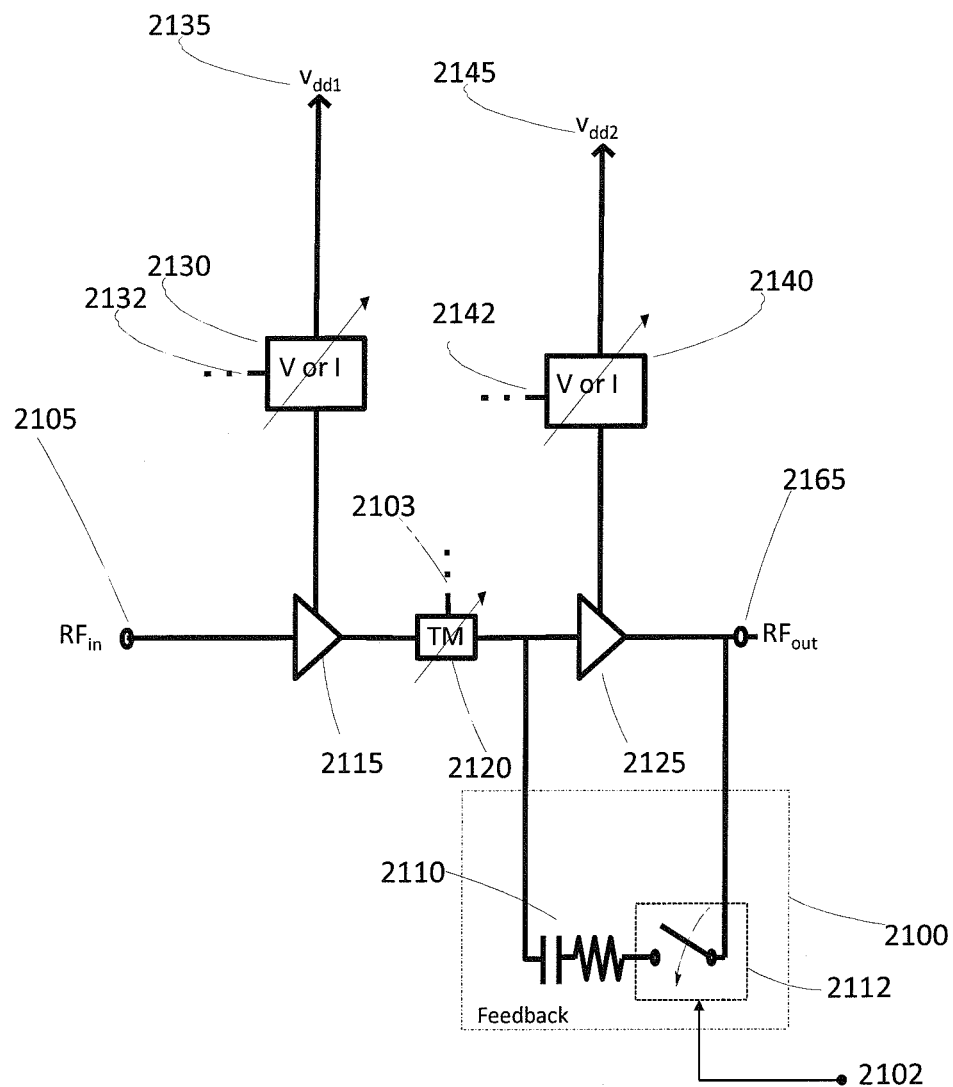
FIGS. 21-22 show alternative embodiments where the feedback network can be arranged in different locations within the amplifier arrangement compared to FIG. 1.
Figure 23:
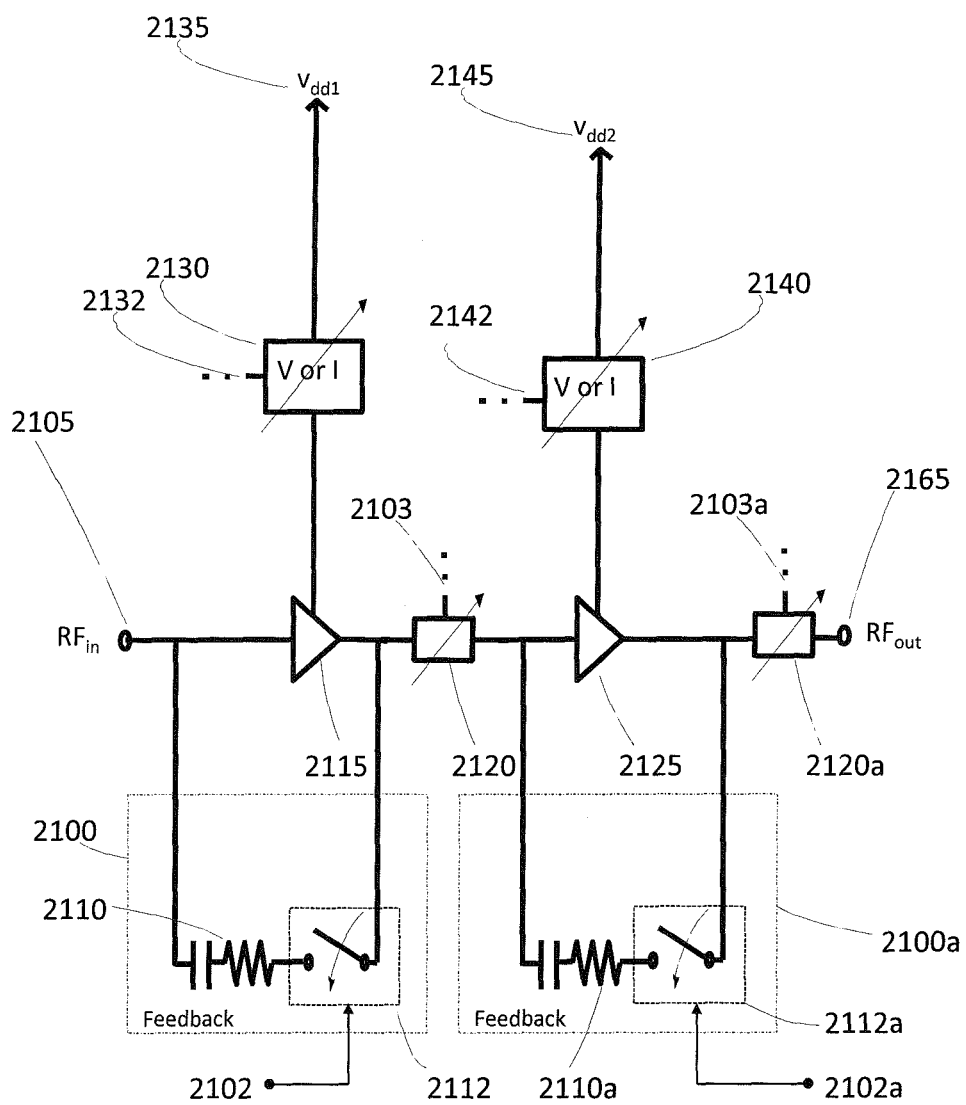
FIG. 23 shows an alternative embodiment where a feedback network and a tunable matching network are connected to each of the amplifiers within the amplifier arrangement.
Figure 24:
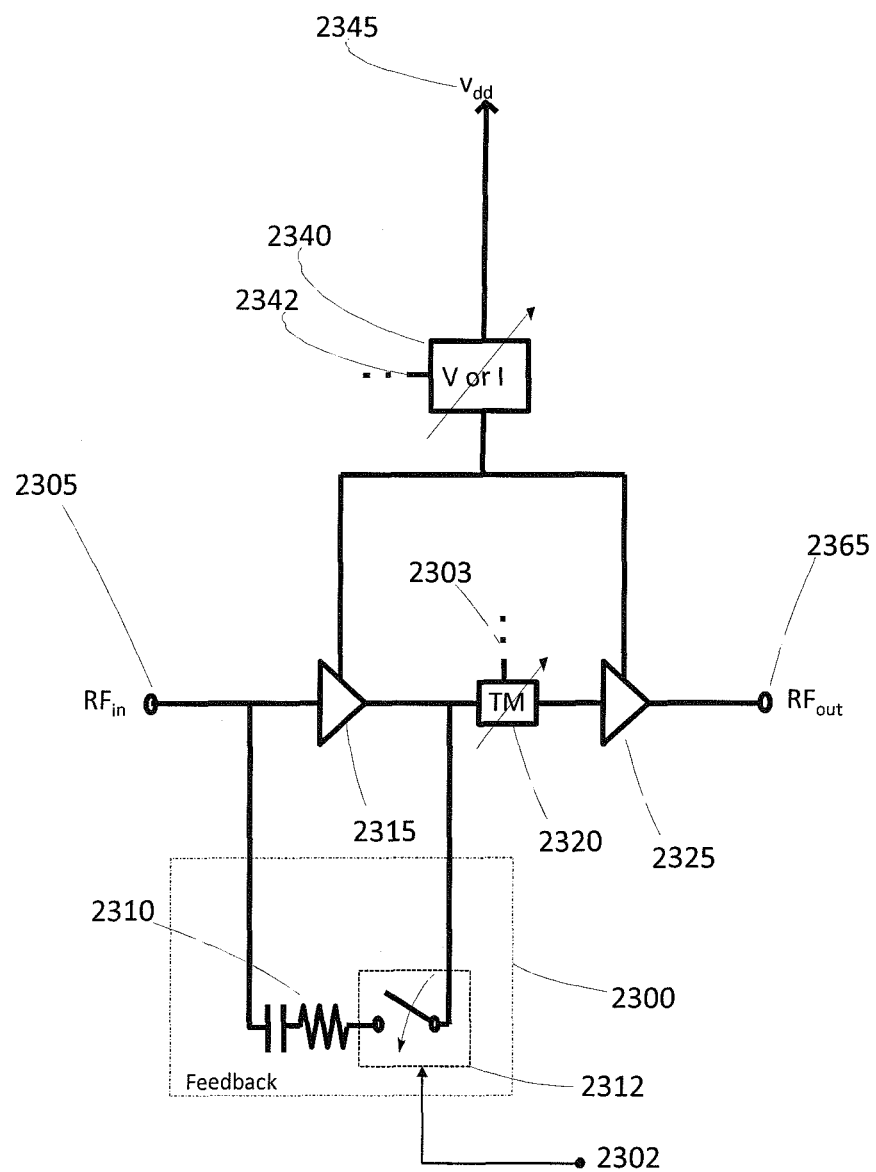
FIG. 24 shows an embodiment of the present disclosure where a feedback network is connected to an amplifier arrangement, each amplifier sharing a common power source.

In another example, a two-stage amplification can be used wherein the first stage preconditions the input RF power level to the second stage such as to reduce switching of the second stage to the linear region of operation, thus enhancing overall power efficiency and linearity of the output stage; since minimum RF input power level to the second amplifier is increased by the first amplification stage, second amplifier will operate more time in the compression region for an increase in overall efficiency. In this configuration, both stages can be ET amplifiers, each with its own ET power supply and each fitted with a switchable feedback network for optimal overall performance. FIGS. 20-21 and FIG. 23, later described in detail, depict such embodiments. A person skilled in the art will understand that such a configuration is not limited to two stages and can easily be extended to multiple stages.

FIG. 20 shows an embodiment of the present disclosure where a feedback network (2100) is connected through a feedback path to an amplifier arrangement comprising a driver stage (2115) and a final stage (2125). Each of the amplifiers (2115, 2125) can be built by including a stacked arrangement of FETs in a cascode configuration as depicted by FIGS. 1-8. The amplifier arrangement of FIG. 20 further comprises an input terminal (2105) and an output terminal (2165). In other embodiments, it may be desired that the arrangement operate in differential signal mode, in which case alongside the input terminal (2105) and the output terminal (2165), the amplifier arrangement would also have, at each terminal, a respective complementary signal terminal.

The feedback network (2100) is used within a feedback path to create a feedback loop around the driver stage (2115), such as when the feedback loop is active, the output of the driver stage (2115) is taken and combined with the input of the same driver stage (2115) after being subjected to the transformation defined by the feedback network (2100). Such feedback loop is active when the switch (2112) is closed, thus engaging the feedback network (2100) into creating the loop. Control signal to switch (2112) is provided at terminal (2102). By way of example and not limitation, feedback network (2100) is comprised of the switch (2102) and RC series network (2110) in series.

As shown in FIG. 20, each of the driver stage (2115) and final stage (2125) is provided with a corresponding dynamic power source (2130) and (2140) respectively, each of them being, in turn, powered by supply voltages (2135) and (2145) respectively. The power sources (2130, 2140) can be variable voltage sources (e.g. a DC-DC converter) or variable current sources, and are controlled via control signals fed to corresponding input controls (2132, 2142) respectively.

A possible circuital connection between the amplifier stage (e.g. a driver stage or a final stage) and the dynamic power source is shown in FIG. 1, wherein a variable power supply provides bias power to the drain of the output transistor as well as to the gates $ETG_2$ and $ETG_3$ of the stacked transistors via a ladder resistor network. FIG. 8 shows another possible configuration of the amplifier stage wherein the biasing of the gates can be done through external supplies fed to the various gates. In both configurations, biasing for the gate of the input transistor may be done through $ETG_1$. A control signal (ctrl) to the variable power supply is used to dynamically adjust its output power level such as the output power level varies as a function of time.

Going back to FIG. 20, control signals fed to inputs (2132, 2142) can be used to set corresponding amplifier stages (2115, 2125) to independently operate in ET or non-ET modes. For example, in one embodiment, to set an amplifier stage to a non-ET mode, a fixed static control voltage is used to set a fixed supply to the amplifier stage, whereas a control voltage representing the envelope signal of the $RF_{in}$ signal is fed to the amplifier stage when an ET mode of operation is desired. A person of ordinary skill in the art will understand that this flexibility of controlling the power sources (2130, 2140) via control signals (2132, 2142), allows for dynamic switching between the two operational modes of a given amplifier stage (2115, 2125), given a corresponding control signal (2132, 2142) which dynamically switches between a static level and one representing the envelope signal. More such embodiments to control the amplifier's operation between these two modes are described in later paragraphs. It should be noted that the bias voltage of the cascodes can also be switched between operations in ET and non-ET modes.

Furthermore and as depicted in FIG. 20, by virtue of its switchable feedback network (2100) and the tunable matching network (2120) at its output stage, the configuration of amplifier (2115) provides the added advantage over the configuration of amplifier (2125) of allowing further control of the amplifier's (2115) overall response based on the mode of operation (ET or non-ET).

As previously noted, control signals for input controls (2132, 2142) can be generated within a transceiver unit, which typically generates the modulated RF input signal to the amplifier arrangement at input terminal (2105), and thus has full knowledge of the input data used to generate the RF signal. As such, the transceiver unit can be fitted with dedicated circuitry and lookup tables suitable to generate the desired control signals not only for the supply voltages (e.g. gates and drain bias supplies) but also for controlling the switch unit (2112) via input control (2102) and the tunable matching network unit (2120) via input control (2103). For example, when a control signal to input (2132) dictates an ET operational mode for the amplifier unit (2115), the transceiver unit concurrently generates a control signal (2102) to the switch unit (2112) to open the switch and a control signal (2103) to tunable matching network unit (2120) to optimize impedance matching between input stage to amplifier unit (2125) and output stage of amplifier unit (2115) when in ET mode. Alternatively, when control signal to input (2132) dictates a non-ET operational mode, control signals to close the switch unit (2112) and to set the tunable matching network unit (2120) for non-ET impedance matching are concurrently generated by such transceiver unit. In this case, the feedback network (2100) and tunable matching network unit (2120) determine the response of the amplifier. Furthermore and as previously mentioned, gate bias supplies to various transistors within the stack may additionally be adjusted, by same controller unit, to control amplifier's response in either modes of operation.

The person skilled in the art will understand that a transceiver unit is just one example of a controller capable of performing the task of configuration control for elements (2112, 2115, 2120) of FIG. 20. In general, any controller with sufficient processing power and with access to the RF input signal or corresponding baseband data is able to perform such task. The person skilled in the art may find other possible implementations for this task, using simple logic gates and/or more complex arrangements including CPLDs and FPGAs.

While the control signal used to control the output level of the variable power supply can steer a corresponding amplifier stage to operate in a desired region, due to limitations discussed earlier when operating in an ET mode, exclusive operation in more efficient compression region is not always possible as there will be instances where the input RF power level is smaller than the supply power level, since latter is bounded by the minimum preset level, causing the amplifier to operate in the non-compression (linear) region.

As such, the control signal fed to input (2132) of the variable power supply unit (2130) defines the operational strategy of the amplifier unit (2115) with respect to the input $RF_{in}$ signal fed to input (2105). In other words, the switching of the amplifier unit (2115) between operating in the compression and linear regions is not only function of the input control (2132), but also function of input $RF_{in}$ signal (2105). That is, when operating in the ET mode, for a given power level of the $RF_{in}$ signal (2105) at a given instance, compression occurs if such power is larger than the dynamic power supplied to the amplifier unit (2115), thus causing the amplifier to operate in the compression region. Alternatively, when power level of the $RF_{in}$ signal (2105) is below the threshold set by the variable power supply, compression does not occur and amplifier (2115) operates in the linear region. As previously mentioned, this switching of the amplifier operation from one region to the other is dependent on the modulation scheme used to generate the input RF signal and becomes more pronounced in cases where modulation schemes with high peak-to-average power ratio are used.

Considering the embodiment of FIG. 20, when amplifier unit (2115) is operating in an ET mode, a controller which at any given instant in time is aware of both the dynamic supply power level (e.g. via the corresponding control signal (2132)) and the $RF_{in}$ power level being fed to the amplifier unit (2115), can predict when switching between operation in the compression region and the linear region occurs for amplifier unit (2115). Therefore, such controller can generate timely control signals (2102, 2103) to dynamically configure amplifier stage via feedback network (2100) and tunable matching network (2120) for optimal operation, and thus reducing the undesired effects due to the change of the region of operation of the amplifier and as described in previous sections. In this case the switching and therefore associated controls may be provided to operate at speeds equivalent (or higher) to the modulation carrier frequency used to generate the $RF_{in}$ signal so to be able to react quickly and therefore reduce the time in which the amplifier is not optimized (e.g. amplifier operating in linear region and feedback network not switched in). This is in contrast to the switching between ET and non-ET modes described previously and for which a static control signal may be used as switching speed is not relevant. Under supervision of the same controller, adjustments to the gates bias supplies of the various transistors within the stack for controlling output linearity of the amplifier stage when operating in each region is also possible (e.g. FIGS. 8, 30).

The above changes in amplifier configuration and various adjustments affecting its operation may engender some undesired effects measurable at the output signal of the amplifier. In one embodiment, these undesired effects may be further controlled by pre-distortion (e.g. phase, amplitude) of the input RF signal to the amplifier stage, in a manner to compensate for these effects. Simulation results may be used to create lookup tables which may be subsequently used by the controller during operation. These lookup tables may include mapping of the various changes and adjustments to pre-distortion coefficients to be applied to the input RF signal. FIG. 30 shows an exemplary system configuration for proposed embodiment, wherein a transceiver is used as main controller.

Although FIG. 20 shows a particular arrangement of the driver stage (2115), the final stage (2125) and the feedback network (2100), it should be noted that alternative arrangements could also be implemented, as depicted by FIGS. 21-25.

In a similar manner and as depicted in FIG. 21, a feedback network (2100) can also be implemented to optimize response of the final stage (2125) when operated in the linear region. In this case the feedback network (2100) is optimized based on the electrical characteristics of the amplifier (2125), which may be different from the characteristics of amplifier (2115).

FIG. 23 depicts an embodiment wherein both amplifiers (2115, 2125) are fitted each with a feedback network (2100, 2100a) selected to optimize response of each amplifier when operating in the linear region. In this case, feedback network (2100) is used to optimize response of amplifier (2115) and feedback network (2100a) is used to optimize response of amplifier (2125). Each of the feedback networks can independently be switched in and out using the dedicated switch control signals (2102, 2102a) which control the state of the switches (2112, 2112a). This configuration allows the flexibility to independently operate each amplifier in ET mode or non-ET mode, as well as optimizing operation of each amplifier when operating in their respective regions. Tunable matching network (2120) with associated control signal (2103) are used for matching output stage impedance of the arrangement composed by (2115, 2100) with the input impedance of the following stage composed of (2125, 2100a) for optimum power transfer between the two stages irrespective of their operating regions. To be noted that in this configuration the second amplifier (2125) is also fitted with a tunable matching network (2120a) at its output. Under control of (2103a) this network can be tuned for optimum power transfer between the arrangement composed of (2125, 2100a) and the subsequent stage not shown in the figure (e.g. antenna). Although not shown explicitly in the figure, controls (2132, 2142) may also be used to adjust various gate biases as needed.

Figure 22:
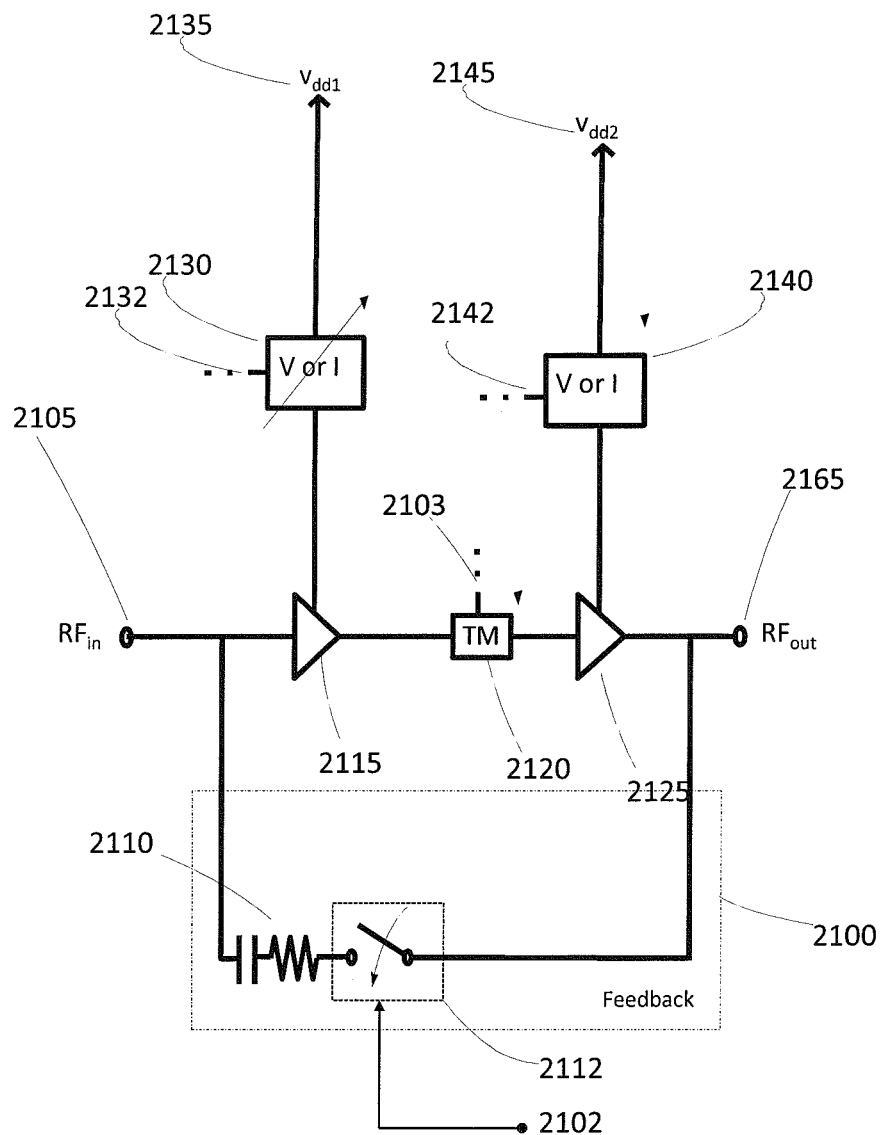

In yet another embodiment and as depicted by FIG. 22, a feedback network (2100) is used to create a single feedback loop around the combination of amplifiers (2115, 2125) and tunable matching network (2120) to again optimize overall response (e.g. linearity, phase, gain, stability) of corresponding arrangement when operated in the linear region.

Furthermore, although two amplifiers are currently shown in FIGS. 20-23, it is also possible to use more than two amplifiers such as in cases where the arrangement, for example, contains a pre-driver stage, a driver stage and a final stage.

In FIGS. 20-23, a tunable matching network (2120) is connected between the driver stage (2115) and the final stage (2125). It should be noted that the tunable matching network (2120) need not necessarily be present only in the arrangement as shown in these figures. As such, it is possible that other embodiments place the tunable matching network before the driver stage (2115) or after the final stage (2125) (e.g. FIG. 23). Furthermore, there may be embodiments where multiple tunable matching networks, each with dedicated control input, can be used in-between stages, with the main goal of adaptive impedance matching amongst stages subjected to mode/region changes and/or for modifying the load lines of the amplifier stage and thus controlling gain (e.g. $G_{voltage} \approx g_m \times R_{Load}$).

In the above embodiments a switch unit is used to activate or de-activate a feedback loop around an amplifier stage with the overall goal of controlling differences in the amplifier's response function when the amplifier's region of operation changes from linear to compression. Additionally, it was noted that in a two stage configuration (e.g. a driver stage followed by a final stage), the first stage amplifier gain when operating in the linear region (feedback network is engaged) can be selected such as to reduce the switching of the final stage to the linear region, thus increasing the time the final stage operates in the more efficient compression region.

Figure 25:
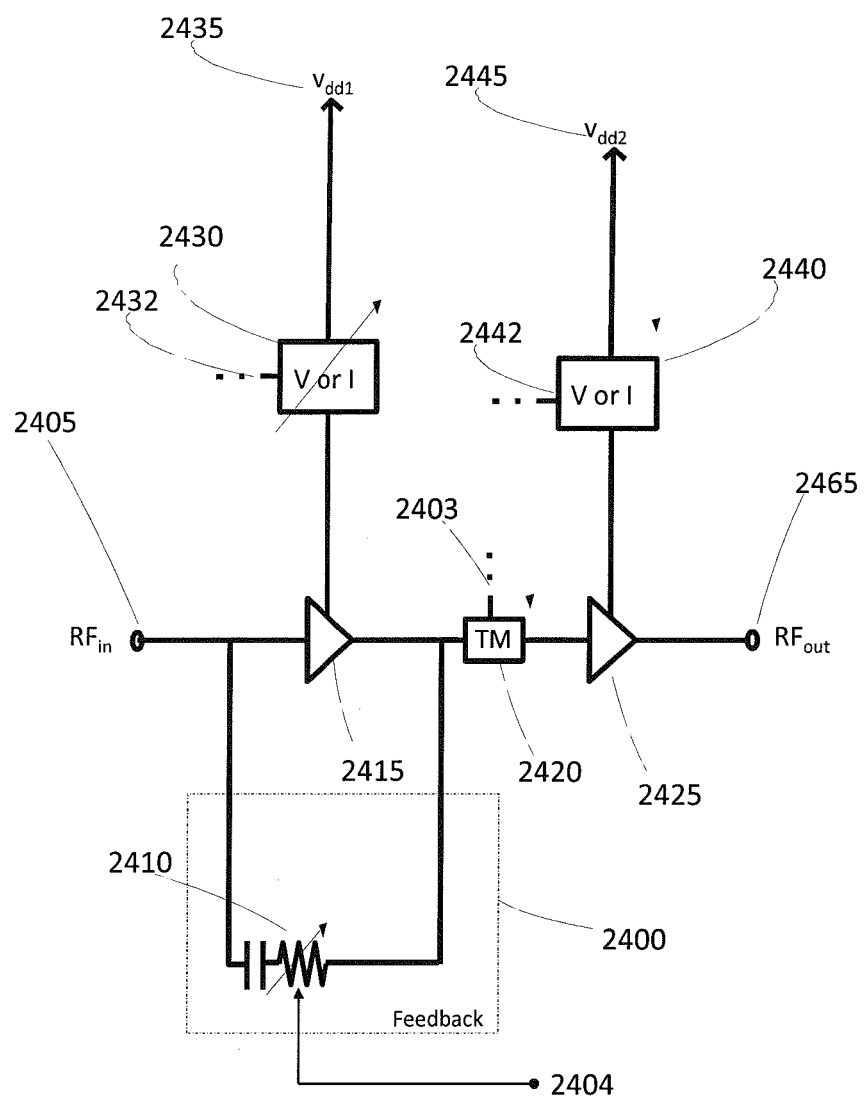
FIG. 25 shows an embodiment where a variable feedback resistor is used for further flexibility in tuning the feedback network. In particular, instead of using a switch as depicted in FIGS. 21-22 and FIG. 24, the variable resistor can be used to reduce the effect of the feedback network by being set at a high value.

In yet another embodiment of the present disclosure, as shown in FIG. 25, the feedback network (2400) includes a variable resistor (2410) which value can be controlled using a control signal fed to the input control terminal (2404). Here, instead of having the feedback network (2400) included or excluded in the feedback path to the driver (2415) by a controlled switch unit, the variable feedback resistor's (2410) value is controlled in order to adjust the response of the driver stage (2415) when operating in each region. For example, when operating in the linear region, the resistance value may vary within a first range suitable for a lower gain of the amplifier stage, and when operating in the compression region the resistance value may vary within a second range suitable for a higher gain of the stage. Resistance value of this resistor may either be continuously variable or variable in discrete steps under control of (2404). This embodiment allows for all the benefits of the prior embodiments, with the added benefit of fine tuning the amplifier gain via incremental resistor changes. Additionally, this embodiment allows for smooth transition between the two regions by gradually varying the resistance value (e.g. from a high value when in the compression region to a low value when in the linear region) and thus removing possibility of glitches and other related undesired effects arising from an abrupt change of the feedback configuration. Finally, this feature can also be advantageous when the amplifier is subjected to different input RF modulation schemes, each requiring a different first stage gain in order to improve efficiency of the final stage (so increase operation time in the compression region).

The person skilled in the art will know that he feedback function or variable gain function can be realized in various ways. For example, the feedback can be in the form of a shunt resistor from the source of the input device to ground (degeneration), or a variable gain amplifier topology, many of which are common in the industry. The feedback can be switched, variable, or variable and switched.

Figure 33:
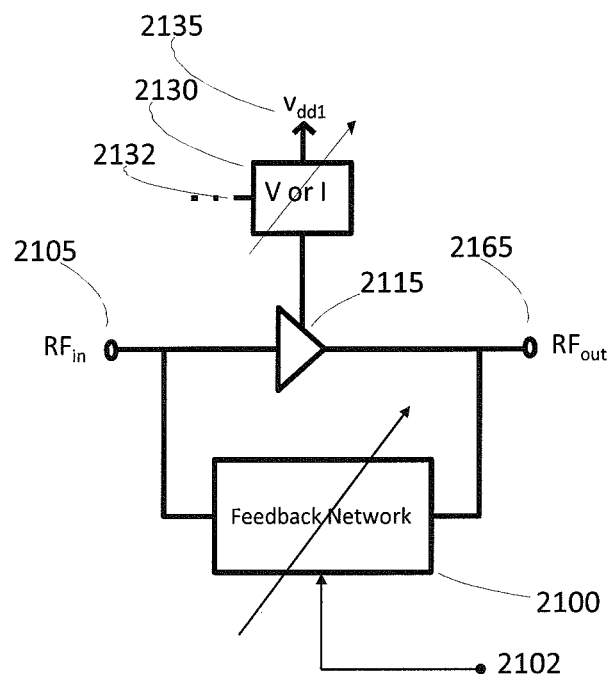
FIG. 33 shows an embodiment of the present disclosure for a tunable feedback network.

It should be noted that although the inventors have discussed a "feedback network" as a means to optimize and adapt gain/response of an amplifier stage when switching between regions of operation (e.g. linear region vs. compression region), for the sake of simplicity and not by limitation of the embodiments, all figures show the feedback network as an RC series network with the addition, in some cases, of a switch. A person skilled in the art will understand that the presented embodiments allow for various types of feedback networks, whether tunable or fixed and/or using active or passive elements, to be used, based on the desired overall response of the corresponding amplifier stage and governed by known amplifier feedback design techniques. Tuning of such a feedback network is merely limited by the elements comprised in the network and can be easily adapted for given the built-in intelligence in the controller. FIG. 33 shows an embodiment of the present disclosure for a tunable feedback network.

Figure 31:
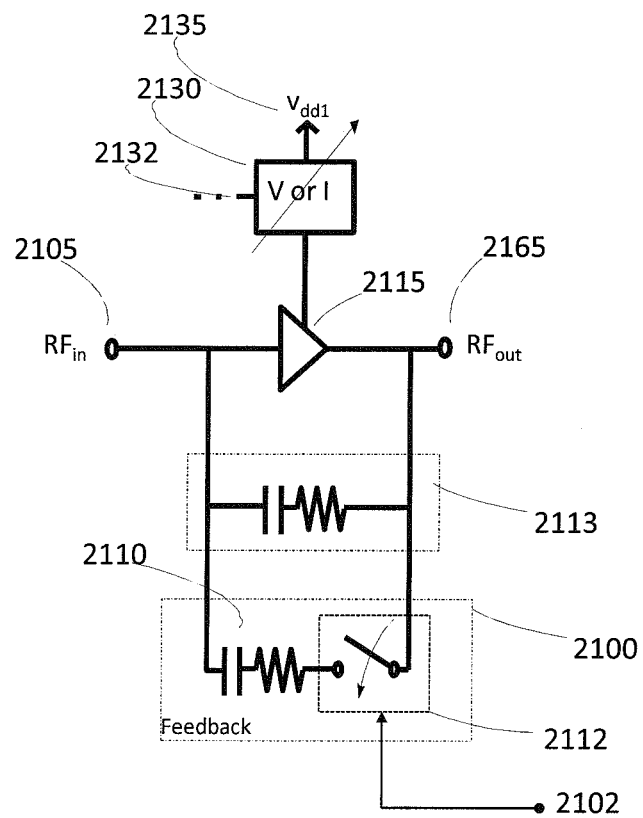
FIG. 31 shows an alternative embodiment with a fixed feedback loop in addition to the switchable feedback network.
Figure 32:
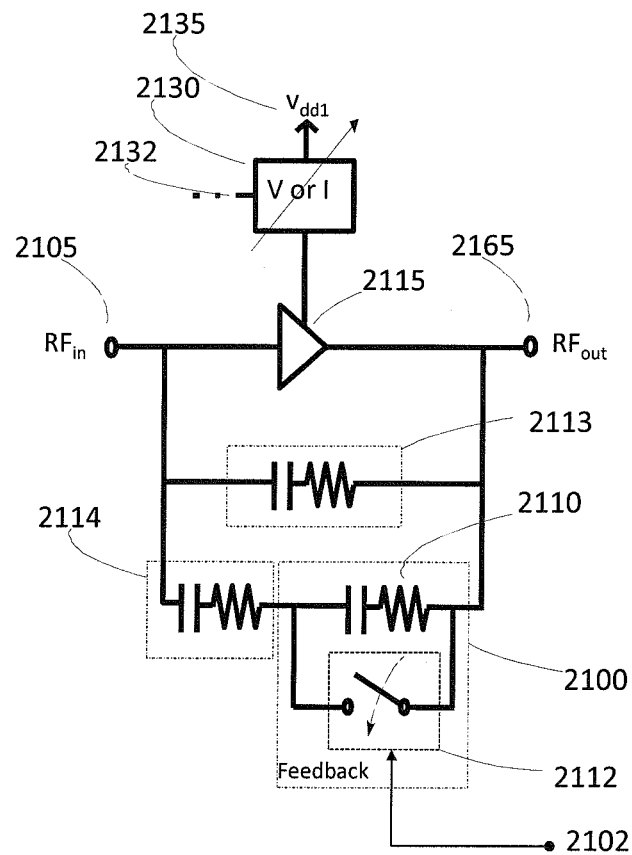
FIG. 32 shows an alternative embodiment with a fixed feedback loop and a switchable feedback network with an additional network in series.

Furthermore, it should also be noted that although FIGS. 20-23 and FIG. 24 do not show a feedback loop (e.g. open loop) when the amplifier is in ET mode or when it operates within the compression region, in practice however, the implementation may include some active feedback components around the amplifier, whether specifically dictated by design requirements or due to parasitic effects at operating frequencies (e.g. due to corresponding circuit layout). The embodiment presented in FIG. 25 provides a fixed active feedback path and the adjustable variable resistor (2410) may be used in any mode or region of operation to control the response of the amplifier arrangement. FIGS. 31-32 show other possible embodiments.

In FIG. 31, the first stage arrangement of FIG. 20 is shown with the addition of a fixed feedback loop (2113), which may be contributed to parasitic effects as discussed earlier. When the amplifier unit (2115) operates in the linear region, the feedback network (2100) is switched in (switch (2112) close) and thus the overall feedback network around the amplifier stage becomes the equivalent network comprised of the two networks (2100, 2113) put in parallel. Design implementation will therefore take into account contribution of network (2113).

In FIG. 32, in addition to the fixed network (2113) of FIG. 31, an additional network (2114) is shown. Network (2114) can be a design requirement for the case where the amplifier unit (2115) operates in the compression region. When operating in the compression region, the switch (2112) is closed, thus reducing feedback network (2100) to a low resistance resistor (equivalent circuit of the closed switch). In this case, the effective feedback network around the amplifier unit (2115) can be approximated by the equivalent network comprised of the two networks (2113, 2114) in parallel. When the amplifier (2115) operates in the linear region, the network (2100) is inserted in the feedback loop by opening the switch (2112). In this case the effective feedback network around the amplifier unit (2115) becomes the equivalent network comprised of the two networks (2100, 2114) in series, in parallel with the network (2113). Here again, well known amplifier feedback design techniques can be used to derive the component values for each of the networks, once the parasitic network (2113) is identified. It should be noted that in the case of the FIG. 32, for operation in the linear region the switch (2112) needs to be open, and not close as it was the case in all other design examples.

As previously discussed, the term "ET" mode can refer to the mode of operation where one or more bias voltages or bias currents are varied as a function of an envelope signal. Such mode can be used to cause the envelope tracking amplifier to operate in a compression region thereby increasing amplifier efficiency. Also, the term "non-ET" mode can refer to the mode of operation where no bias voltages and no bias currents are varied (e.g. as a function of an envelope signal). Such mode can be used to cause the envelope tracking amplifier to operate in a linear region.

Going back to FIG. 1, it shows an example embodiment according to the present disclosure of an envelope tracking amplifier (100) capable of adapting between ET mode and non-ET mode. The ETPS (180) of FIG. 1 is influenced by a control signal ctrl (190) generated externally from the envelope tracking amplifier (100). The control signal ctrl (190) provides a time-varying envelope signal to the ETPS (180), which may indicate a desired mode of operation (ET mode or non-ET mode). Based on the control signal ctrl (190), the ETPS (180) provides to the stack of FETs a corresponding power (envelope tracking/variable power supply or a non-envelope tracking/constant power supply). Although control signal ctrl (190) appears to provide input only to ETPS (180), implementations could also include related signals from control signal ctrl (190) to provide appropriate secondary control signals to related switches and tunable elements within an envelope-tracking amplifier arrangement and to related switches and tunable elements externally connected to the envelope tracking amplifier arrangement to appropriately configure the overall behavior of one or more envelope-tracking amplifiers (or configure an envelope tracking embodiment) to operate in a desired mode of operation (ET or non-ET mode). Furthermore, although the control signal, as depicted in FIG. 1, is generated externally from the envelope tracking amplifier (100), other embodiments could incorporate methods or implementations where such control signals can be generated within the envelope tracking amplifier (100).

In one embodiment, the amplifier system would be switched from ET mode to non-ET mode of operation when the input and thus output power level drops to a point that the power consumption in the ETPS is more than the power it saves. As an example, the amplifier may operate in ET mode from the maximum average output power down to the maximum average power–10 dB. At that time the ETPS would be switched off, bypassed, or switched to an average power tracking mode, (average power tracking mode is one where a DC-DC converter slowly follows the average power of the amplifier and an analog error amp would not be required). The non-ET mode would be used at this power and all lower power levels. The example of Pmax–10 dB is an example. The actual value depends on the system optimization, including amplifier efficiency with and without ET and the power consumption of the ETPS.

A transceiver can be such an example of a source that could be used to provide control signals to the envelope tracking amplifier (100) indicating a desired mode of operation and thereby configure the envelope tracking amplifier (100) to adapt to the desired mode of operation. The transceiver used to provide an input signal to the envelope tracking amplifier (100) could know a desired mode of operation for a particular input signal being provided. Thus an embodiment could be imagined where the transceiver also provides control signals to the ETPS and/or related switches and tunable elements of an embodiment to configure the embodiment to operate accordingly.

Figure 34:
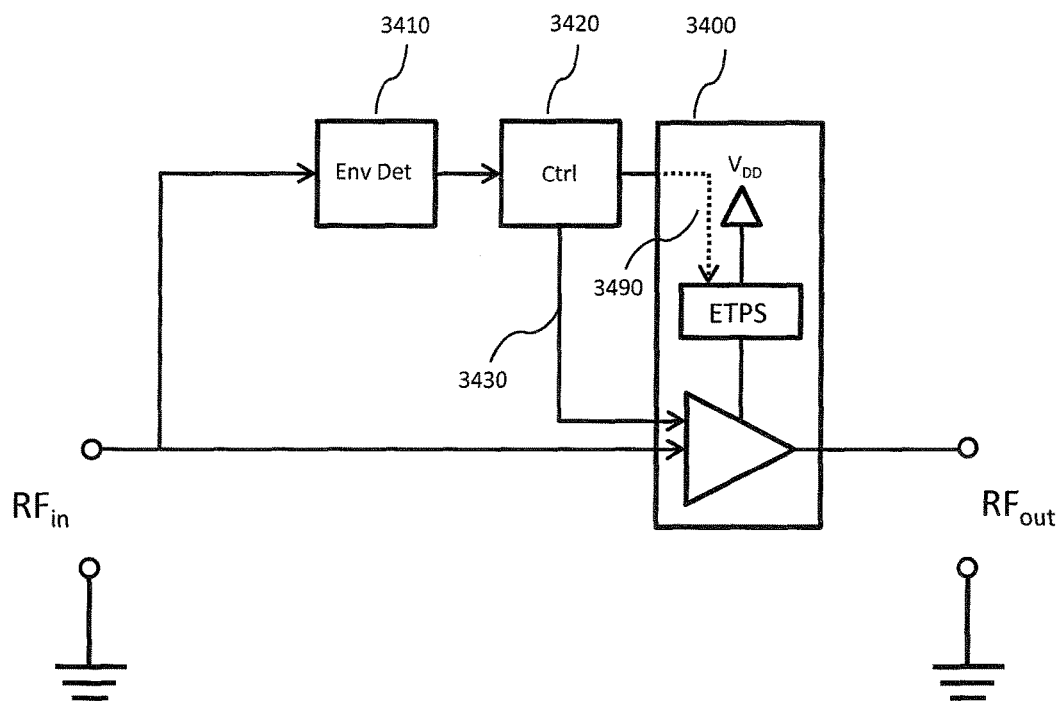
FIG. 34 shows an example embodiment according to the present disclosure with an envelope tracking amplifier (e.g. the envelope tracking amplifier shown in FIG. 1 or 8), an envelope detector and a control unit.

FIG. 34 shows an example embodiment according to the present disclosure comprising an envelope tracking amplifier (3400) (e.g. the envelope tracking amplifier (100) shown in FIG. 1), an envelope detector (3410) and a control unit (3420). The envelope detector (3410) can comprise the implementation shown in FIG. 2 or can be implemented in any manner that is within the capability of a person skilled in the art. An input signal (e.g. an RF signal) can be fed to both to the input port of the envelope tracking amplifier (3400) as well as the envelope detector (3410). The envelope signal from the envelope detector (3410) can be fed to the control unit (3420). The control unit (3420) can produce the control signal (3490) based on the envelope signal from the envelope detector (3410). As discussed above, the control signal ctrl (190) of FIG. 1 is used to indicate to the ETPS (180) of FIG. 1 what type of power (variable supply power or constant supply power) to provide to the stack of FETs given a desired mode of operation (envelope tracking or non-envelope tracking). The control signal (3490) of FIG. 34, generated by the control unit (3420) can be an example of an external generator of the control signal ctrl (190) of FIG. 1. Additionally, a baseband signal, such as an in-phase and quadrature phase Cartesian representation, can also be used to create the envelope signal. In an alternative embodiment, the envelope signal is fed directly to the envelope tracking amplifier (3400), in particular to the ETPS (180) and used as the control signal (3490).

Furthermore, the control unit (3420) can also provide one or more secondary control signals (3430) to other components (e.g. a configuration arrangement comprising switches and/or tunable elements such as tunable resistors and tunable capacitors) within the envelope tracking amplifier (3400). The one or more secondary control signals (3430) can configure one or more switches and/or one or more tunable components within the envelope tracking amplifier (3400) described below such that the one or more switches and/or one or more tunable components are adapted to operate according to the desired mode of operation.

As stated above, other devices external to the envelope tracking amplifier can provide one or more control signals to the ETPS (180) and/or related switches and tunable elements. For example, a transceiver can be used to provide an input signal to the envelope tracking amplifier. Since the transceiver would know what is being provided to the envelope tracking amplifier, the transceiver could also provide an indication (either through an envelope signal and/or control signal) to the ETPS (180) and/or related switches and tunable elements to configure the envelope tracking amplifier to operate in a desired mode of operation (ET mode or non-ET mode) adapted for the input signal provided.

The envelope tracking amplifier (100, 800) shown in FIGS. 1 and 8 can both be connected to additional circuitry that is configured to enable an amplifier arrangement comprising the envelope tracking amplifier to adapt between operation in an ET mode or in a non-ET mode. By way of example, and not of limitation, the additional circuitry can comprise one or more switches, one or more passive elements (e.g. resistors or capacitors), one or more active elements (e.g. one or more FETs or amplifiers), or some combination thereof. Furthermore, secondary control signals (3430) discussed above, different from the control signal (3490), can be generated to configure other elements besides the ETPS (180) influencing, thereby assisting the envelope tracking amplifier to adapt between operation in the ET mode or in the non-ET mode. Numerous embodiments comprising an envelope tracking amplifier (such as the envelope tracking amplifiers (100, 800) shown in FIG. 1 or 8) connected to additional circuitry that provides additional functionality are presented below.

As stated above, it is desirable to have an envelope tracking amplifier be configurable to operate between operating in ET and non-ET mode. In such situations the envelope tracking amplifier (such as the envelope tracking amplifier (100) of FIG. 1) can be configured to adapt between ET mode and non-ET mode by adjusting the dynamic bias voltages applied to the gate and drain of the stack of FETs ($ET_{RD3}$ and $ET_{DR}$). For example, for non-ET mode, the envelope tracking amplifier (100) of FIG. 1 can have the second dynamic bias voltage $ET_{DR}$ be held at a fixed value. Furthermore, fixed gate bias voltages $ET_{G1}$, $ET_{G2}$ and $ET_{G3}$ are also provided to the gate bias terminals. It should be noted that selection of dynamic bias voltages to operate an envelope tracking amplifier in the non-ET mode described in this paragraph may also be applied to envelope tracking amplifiers comprising a number of stacked transistors other than three. It should also be noted that embodiments, within the scope of the present disclosure, could be implemented where the DC gate bias voltage stays the same or changes when the mode of the envelope tracking amplifier is switched. Furthermore, the decision to change or maintain the DC gate bias voltage can be made in conjunction with or separate from the state of a tunable matching network based on an indicated mode of operation. A person skilled in the art will not require further explanation or diagrams to understand such embodiments.

In some other embodiments switching between other modes, not just ET and non-ET may be desired. This may include such modes as polar, ET, envelope following, and fixed supply.

Figure 35:
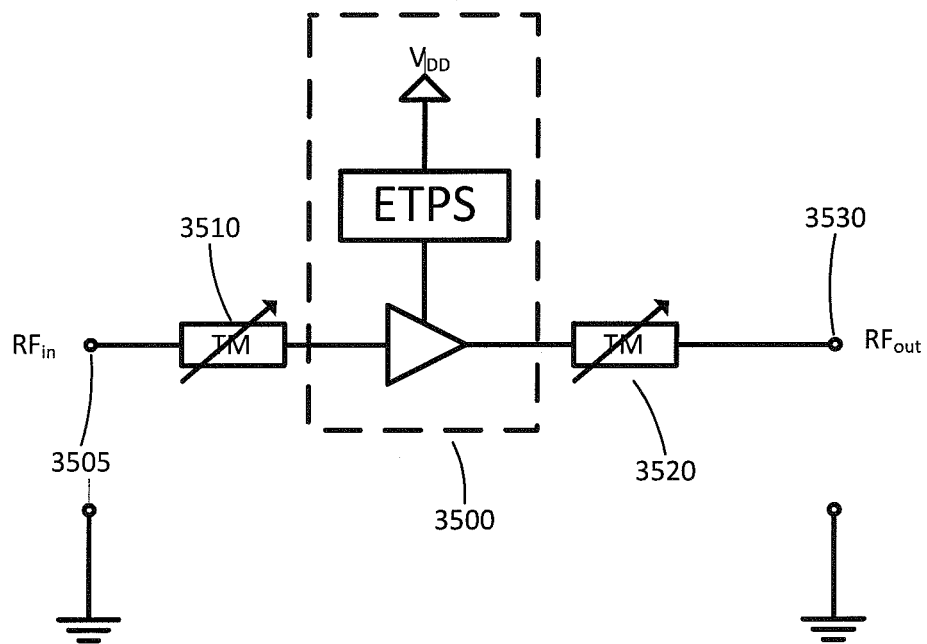
FIGS. 35-37 shows different embodiments according to the present disclosure used to configure an envelope tracking amplifier between ET and non ET mode.
Figure 36:
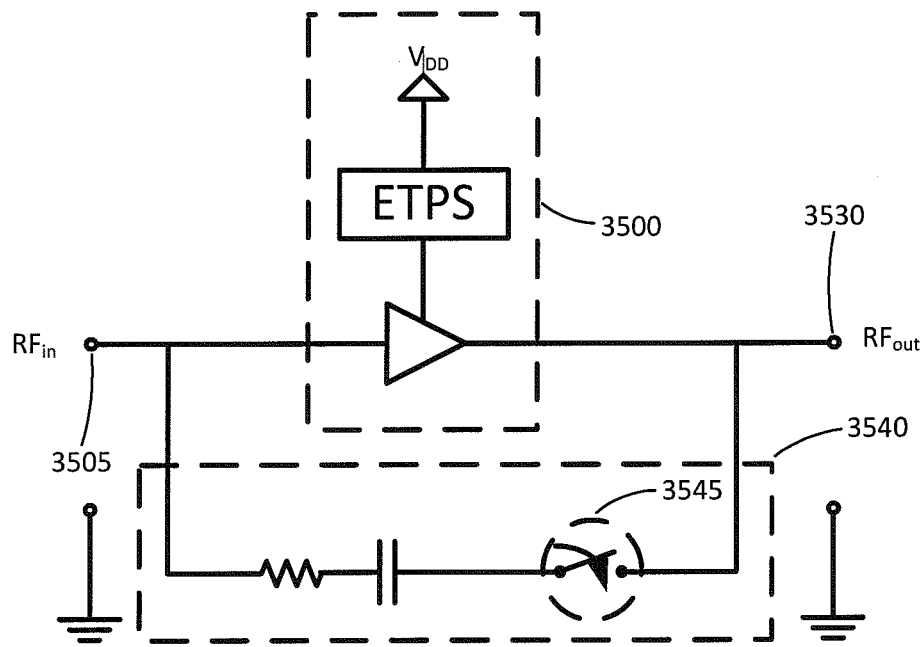
Figure 37:
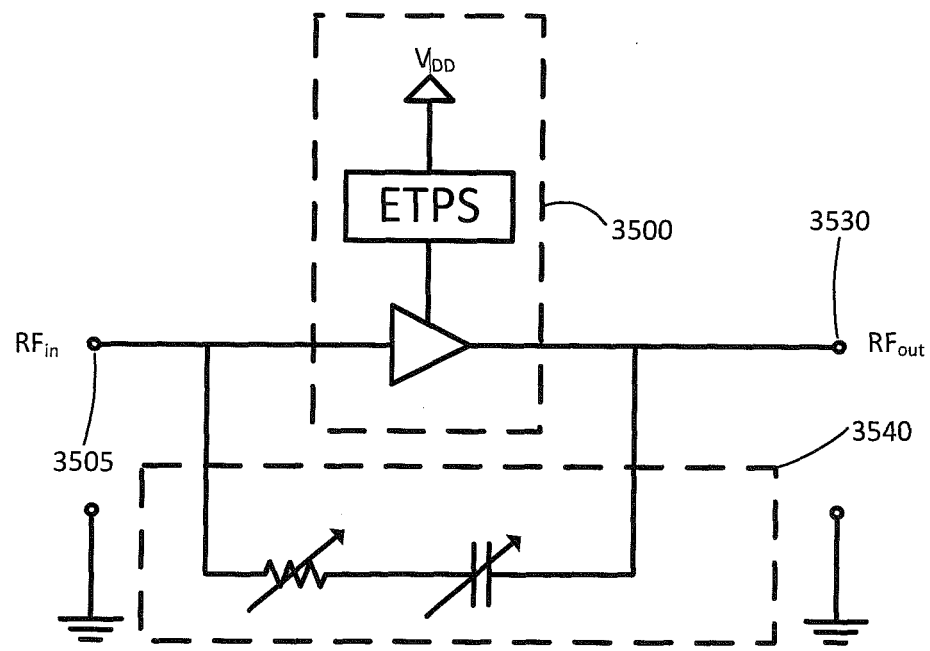

FIGS. 35-37 show different embodiments according to the present disclosure used to configure an envelope tracking amplifier (3500) between operation in ET and non-ET mode. FIG. 35 utilizes an input tunable matching network (3510) and an output tunable matching network (3520). The input tunable matching network (3510) can be tuned to provide impedance matching between an input terminal (3505) and an input of the envelope tracking amplifier (3500). The output tunable matching network (3520) can be tuned to provide impedance matching between an output terminal (3530) and an output of the envelope tracking amplifier (3500). Either or both of the tunable matching networks can be tuned appropriately, based on an envelope signal, depending on whether the ET mode or the non-ET mode of operation is desired for the envelope tracking amplifier (3500) as each mode of operation could desire a different type of impedance matching. This is the case as it is possible that the network, between ET mode and non-ET mode, each have a different optimal match.

FIGS. 36 and 37 utilize a resistor-capacitor feedback loop (3540) to configure the envelope tracking amplifier (3500) between operation in ET and non-ET mode. In FIG. 36, a resistor-capacitor feedback loop (3540) is shown whereby a feedback switch (3545) controls when the resistor-capacitor feedback loop (3540) is used. Depending on the desired mode of operation, the feedback switch (3545) can be open or closed to disable or enable, respectively, the use of the resistor-capacitor feedback loop (3540). The resistor-capacitor feedback loop (3540) can be used to adjust the gain of the envelope tracking amplifier (3500) based on a desired mode of operation Alternatively, FIG. 37 shows another resistor-capacitor feedback loop (3540) except that in this embodiment the resistor and capacitor elements are tunable. Depending on the desired mode of operation, the resistor and capacitor elements of the resistor-capacitor feedback loop (3540) can be tuned to configure the envelope tracking amplifier (3500) to operate in ET or non-ET mode.

Generally speaking, embodiments comprising a plurality of amplifiers that are operatively connected in cascade, where one or more of the amplifiers are envelope tracking amplifiers, configured to switch between the ET mode and the non-ET mode, can be accommodated by using one or more switches to selectively include or bypass one or more amplifiers from among the plurality of amplifiers. When operating in the ET mode, appropriate operation of the switches can increase the total number of amplifiers present in a signal amplification path. Conversely, when operating in the non-ET mode, appropriate operation of the switches can decrease the total number of amplifiers present in the signal amplification path. The term "signal amplification path" can refer to a path which an input signal flows through while being amplified by successive amplifiers operating in cascade. Numerous embodiments that operate by using switches to selectively include or omit one or more amplifiers in the signal amplification path are possible, two of which will be described below. Implementations of such embodiments are alternative ways to configure a particular embodiment to operate according to a desired mode of operation (ET or non-ET mode).

Figure 38:
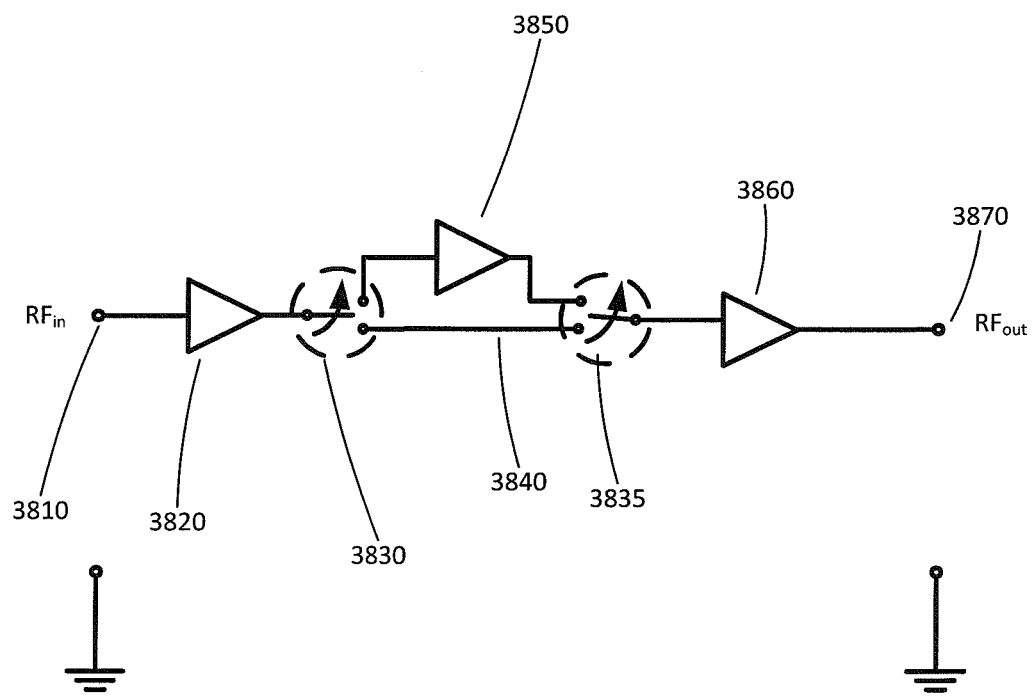
FIG. 38 shows an embodiment according to the present disclosure with an input terminal, a first amplifier, a first switch, a second amplifier, a through circuit, a third amplifier, a second switch and an output terminal.

FIG. 38 shows an embodiment according to the present disclosure that can be used to configure a plurality of amplifiers to adapt between operating in ET and non-ET mode. The embodiment of FIG. 38 comprises an input terminal (3810), a first amplifier (3820), a first switch (3830), a second amplifier (3850), a through circuit (3840), a third amplifier (3860), a second switch (3835) and an output terminal (3870). An input port can comprise the input terminal (3810) and ground, while an output port can comprise the output terminal (3870) and ground. In the embodiment shown in FIG. 38, one or more of the amplifiers (3820, 3850, 3860) can be an envelope tracking amplifier such as the envelope tracking amplifier (100) shown in FIG. 1 or the envelope tracking amplifiers 800, 800A shown in FIG. 8 and FIG. 8A. The first switch (3830) can be operated to select either the second amplifier (3850) or the through circuit (3840). The second switch (3835) would be enabled at the same time to follow the selection of the first switch (3830) so that one path is chosen while the other path is completely removed. For operation in the non-ET mode, the first and second switches (3830, 3835) can be operated to select the through circuit (3840), allowing signal flow from the input terminal (3810) to the output terminal (3870) to bypass the second amplifier (3850). For operation in the ET mode where a higher gain may be required to keep the amp in compression and/or compensate for the reduced gain when in compression, the first and second switches (3830, 3835, respectively) can be operated to select the second amplifier (3850), thereby including all three amplifiers (3820, 3850, 3860) in a signal amplification path that begins at the input terminal (3810) and ends at the output terminal (3870) where such signal amplification path is configured to operate for ET mode.

Alternatively, a second through path can be added to the embodiment shown in FIG. 38 to allow an input signal to be routed through the first amplifier (3820) or bypass the first amplifier (3820) in addition to features already described that allow inclusion or bypassing of the second amplifier (3850) as described above. In other embodiments, the first and second switches (3830, 3835) and the through path (3840) are applied only to the first amplifier (3820) such that only the first amplifier (3820) can be included or bypassed, depending on switch operation. Additional embodiments include a switch and a through path that are connected to the third amplifier (3860) in a similar manner that allows the third amplifier (3860) to be bypassed depending on the mode of operation, either alone or in combination with features previously described that allow inclusion of or bypassing of the first amplifier (3820) and the second amplifier (3850). Alternative embodiments comprise two, four, or more amplifiers. Such alternative embodiments may be configured to allow including or bypassing one or more of the amplifiers depending on operation of one or more corresponding switches. A person skilled in the art will not require further explanation or diagrams to understand such embodiments.

Figure 39:
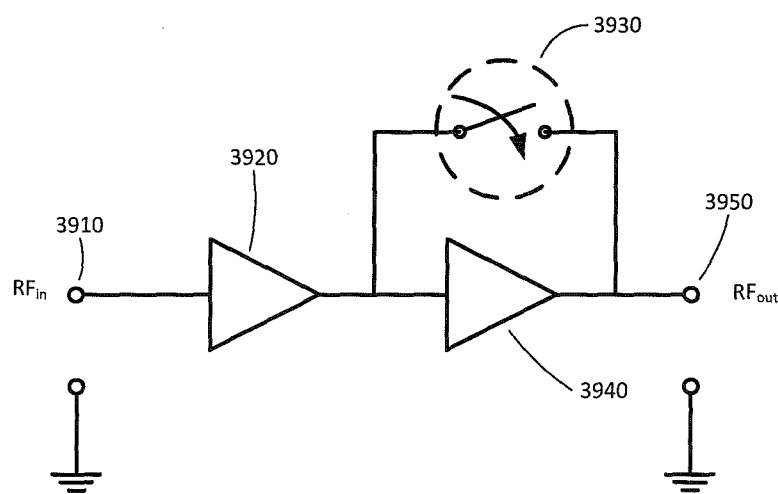
FIG. 39 shows an embodiment according to the present disclosure with an input terminal, a first amplifier, a second amplifier, a path with a switch, and an output terminal.

FIG. 39 shows another embodiment that can be used to configure an operation of an amplifier between ET mode and non-ET mode. In particular, FIG. 39 shows an input terminal (3910), a first amplifier (3920), a second amplifier (3940), a path with a switch (3930), and an output terminal (3950). Either or both amplifiers (3920, 3940) can be envelope tracking amplifiers. For the ET mode, the switch (3930) can be opened to include the second amplifier (3940) in a signal amplification path between the input terminal (3910) and the output terminal (3950). For the non-ET mode, the switch (3930) can be closed to omit the second amplifier (3940) from the signal amplification path between the input terminal (3910) and the output terminal (3950). In addition to the aforementioned switch operation, for the non-ET mode, the second amplifier (3940) can be disabled (e.g. by switching off its power supply or by adjusting bias circuits to put the circuit in a low power standby mode).

Figure 40:
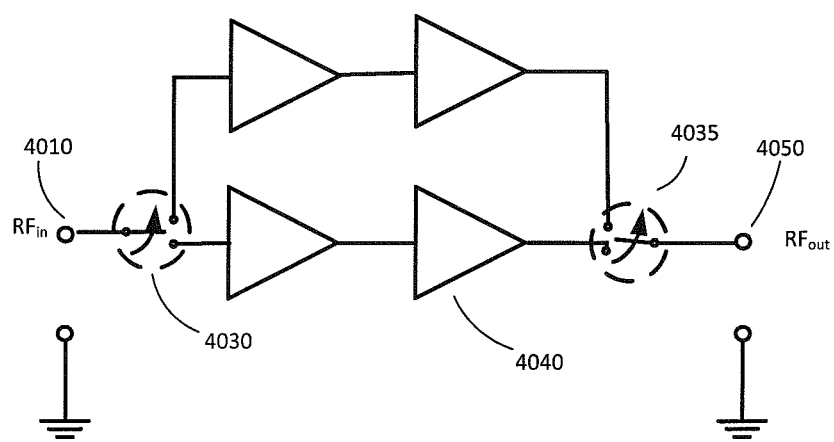
FIG. 40 shows an alternative embodiment of FIG. 39, where a switch can enable one of two different paths comprising amplifiers, each path having different amplification.

Furthermore, FIG. 40 shows an alternative embodiment to the embodiment seen in FIG. 39 comprising input terminal (4010), an output terminal (4050), a first switch (4030) and a second switch (4035) can be used to select between two possible paths wherein the two possible paths comprise one or more amplifiers (4040). The plurality amplifiers (4040) can be envelope tracking amplifiers. For ET mode (including modes such as envelope following and polar) or non-ET mode (e.g. linear operation), the first and second switches (4030, 4035) would be used to select one of the two paths, where one path could be configured for ET mode and the other path configured for non-ET mode by tuning the parameters of the one or more amplifiers belonging to a particular path. Selection of a particular path would configure the overall embodiment according to the desired mode of operation (ET or non-ET mode). In some embodiments this selection can be made based on certain operating parameters, such as input and/or desired output power level. For example, the ET path can be used at high output power levels (Pmax to Pmax−10 dB, for example), and the linear or non-ET path can be used at the lower power levels. Additionally, an input tunable matching network and/or an output tunable matching network (not shown) could be provided for one or both possible paths shown in FIG. 40. Such arrangements could be implemented in a similar manner as shown in the embodiment of FIG. 35.

Returning to FIG. 39, the path with the switch (3930) can be configured to pass a signal unaltered when the switch (3930) is closed, enabling an input signal (e.g. an RF signal) applied to the input terminal (3910) to be amplified only by the first amplifier (3920) when the switch (3930) is closed and the second amplifier (3940) is disabled. Alternatively, the path with the switch (3930) can be placed parallel to the first amplifier (3920) in order to selectively utilize or bypass the first amplifier (3920) for operation in the ET mode or the non-ET mode, respectively, together with appropriately enabling or disabling the first amplifier (3920) as previously discussed with respect to the second amplifier (3940). Other embodiments may comprise three or more amplifiers with one or more paths with switches to selectively include or omit, from a signal amplification path, one or more amplifiers in correspondence of the one or more paths with switches depending on whether the ET mode or the non-ET mode of operation is desired. Such an example of other embodiments can be seen in FIG. 40.

When switching between ET mode and the non-ET mode, a resistance value and/or a capacitance value present at a gate of any FET in a stack of FETs used in constructing an envelope tracking amplifier, except a first FET (e.g. the first FET (115) in FIG. 1) to which an input signal (e.g. an RF signal) is applied, can be configured as a function of a desired mode of operation (ET mode or non-ET mode). Numerous embodiments that operate by adjusting a resistance value and/or a capacitance value present at a gate of any FET in a stack of FETs used in constructing an envelope tracking amplifier are possible, two of which are discussed below. Also, as previously mentioned, the concept of switching between ET mode and non-ET mode can also be extended to other modes, such as polar, envelope following or other.

Figure 41:
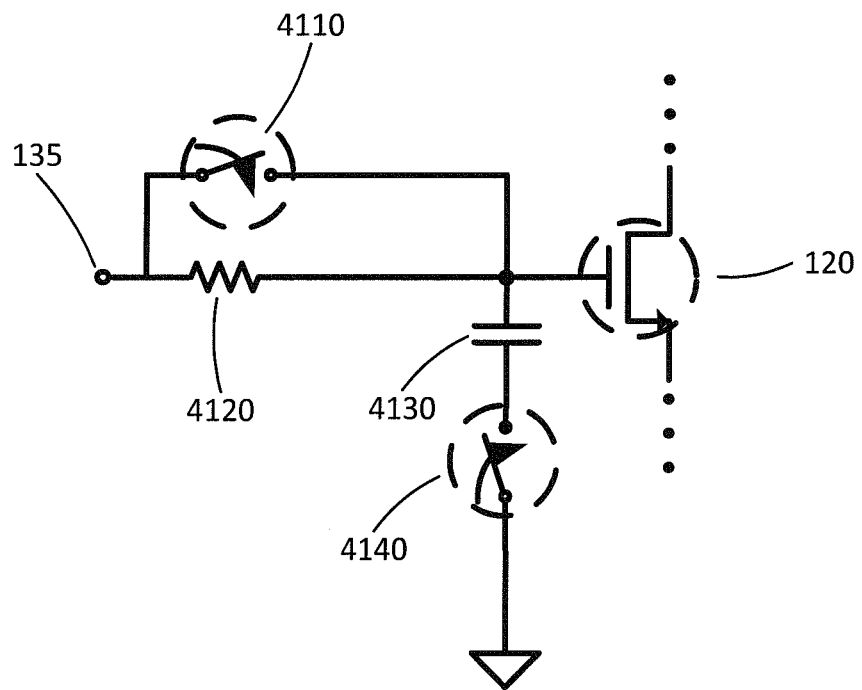
FIG. 41 shows an embodiment according to the present disclosure of a switchable gate bias network that can be connected, for example, to the second FET shown in FIG. 1.

FIG. 41 shows an embodiment according to the present disclosure of a switchable gate bias network that can be connected, for example, to the second FET (120) or the third FET (155) shown in the embodiment of FIG. 1. In the embodiment shown in FIG. 41, the switchable gate bias network comprises a gate resistor switch (4110), a gate resistor (4120), a gate capacitor (4130), and a gate capacitor switch (4140). Operation of the gate resistor switch (4110) can effectively include or omit the gate resistor (4120) in a path between the second gate bias terminal (135) and the gate of the second FET (120) of FIG. 1. Similarly, operation of the gate capacitor switch (4140) can effectively include or omit the gate capacitor (4130) in a path between the gate of the second FET (120) of FIG. 1 and ground. Operation of the gate resistor switch (4110) and the gate capacitor switch (4140) may be determined by whether the ET mode or the non-ET mode of operation of the envelope tracking amplifier (100) of FIG. 1, for example, is desired.

For the ET mode operation, as seen in FIG. 41, the gate resistor switch (4110) can be closed, thereby providing a low resistance path that bypasses the gate resistor (4120), effectively removing the gate resistor (4120) from the path between the second gate bias terminal (135) and the gate of the second FET (120) of FIG. 1. For the non-ET mode operation, the gate resistor switch (4110) can be opened, effectively including the gate resistor (4120) in the path between the gate bias terminal (135) and the gate of the second FET (120) of FIG. 1. For the non-ET mode operation, the gate capacitor switch (4140) can be closed, effectively including the gate capacitor (4130) in the path between the gate of the second FET (120) and ground of FIG. 1. For the ET mode operation, the gate capacitor switch (4140) can be opened, effectively removing the gate capacitor (4130) from the path between the gate of the second FET (120) and ground of FIG. 1. The above description provides a number of ways to provide a particular bias to the gate of the second FET (120) for the purpose of configuring the particular FET so as to have the overall envelope-tracking amplifier operate in ET or non-ET mode. Similar arrangements and behaviors for the gate resistor switch and the gate capacitor switch can be included for all FETs except for the first FET, which is biased in a different way as described later.

With reference to the embodiment shown in FIG. 41, either or both of the gate resistor switch (4110) and the gate capacitor switch (4140) can be a stacked switch (e.g. a switch comprising stacked transistors) in order to allow power handling capability greater than a power handling capability of a switch comprising a single transistor because a voltage present at the gate of the second FET (120) or a higher FET of FIG. 1 may be sufficiently high that a switch comprising a single transistor would not be appropriate. Other alternative embodiments that may include the gate resistor switch (4110) and the gate capacitor switch (4140) can implement those switches as stacked switches for similar reasons. Reference can be made for example to U.S. Pat. No. 7,910,993 B2, issued on Mar. 22, 2011, entitled "Method and Apparatus for Use in Improving Linearity of MOSFETs Using an Accumulated Charge Sink", and U.S. Pat. No. 8,129,787 B2, issued on Mar. 6, 2012, entitled "Method and Apparatus for Use in Improving Linearity of MOSFETs Using an Accumulated Charge Sink", both of which are incorporated herein by reference in their entirety.

Figure 42:
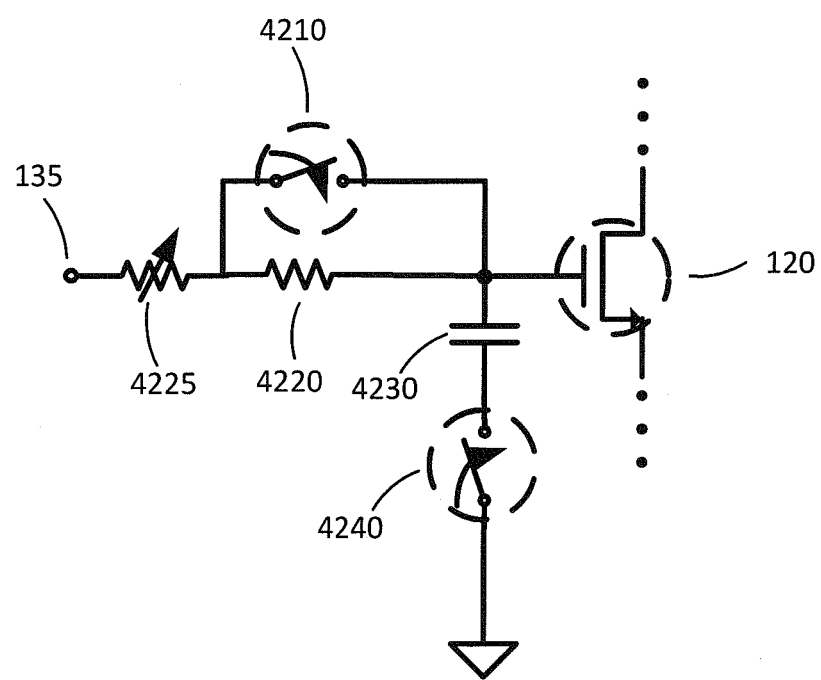
FIG. 42 shows the embodiment of FIG. 41 with the additional feature of an adjustable resistance.

Another alternative can be seen in FIG. 42 where an additional resistor (4225) is included to the embodiment seen in FIG. 41. The additional resistor (4225) can be tunable as well. The purpose of resistor (4225) is to ensure that if gate resistor switch (4210) is closed (thereby bypassing the gate resistor (4220)), the embodiment as seen in FIG. 42 will still provide a resistance (through the additional resistor (4225)) at the gate of the FET (120) of FIG. 1. In the event that the gate resistor switch (4210) is open, the additional resistor (4225) can be tuned to have a 0 value thereby producing an effectively similar arrangement as seen in FIG. 41.

Figure 43:
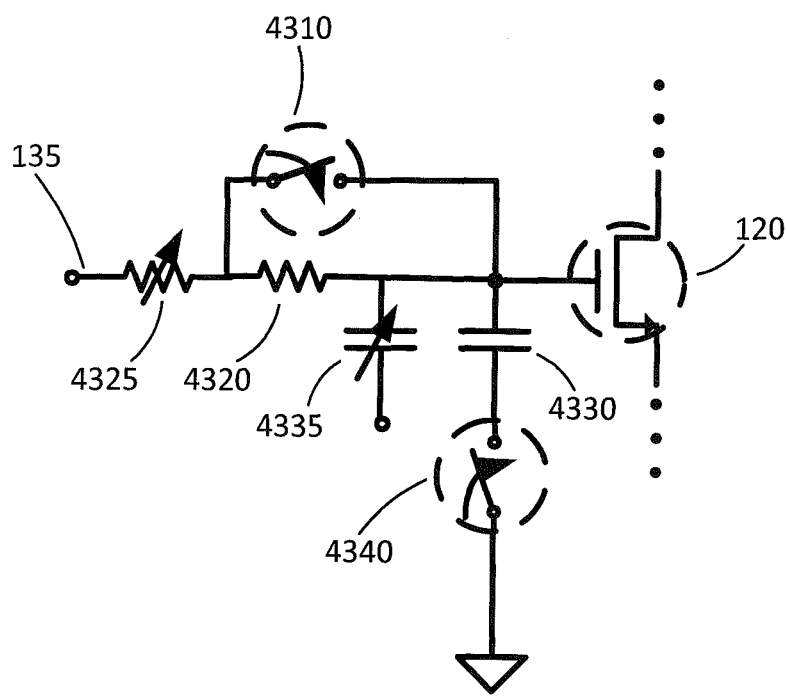
FIG. 43 shows the embodiment of FIG. 41 with the additional features of adjustable resistance and capacitance.

Furthermore, FIG. 43 provides another alternative where an additional capacitor (4335), which can also be tunable, is provided. Similar to the additional resistor (4225) in FIG. 42, the additional capacitor (4335) seen in FIG. 43 can be used to ensure that there will always be a capacitance available even if the gate capacitor switch (4340) is open. Further details regarding tunable reactive elements, including tunable capacitors and tunable inductors, may be found, for example, in International Application No. PCT/US2009/001358, entitled "Method and Apparatus for Use in Digitally Tuning a Capacitor in an Integrated Circuit Device," filed on Mar. 2, 2009, and in U.S. patent application Ser. No. 13/595,893 entitled "Method and Apparatus for Use in Tuning Reactance in an Integrated Circuit Device", filed on Aug. 27, 2012, both incorporated herein by reference in their entirety.

Figure 44:
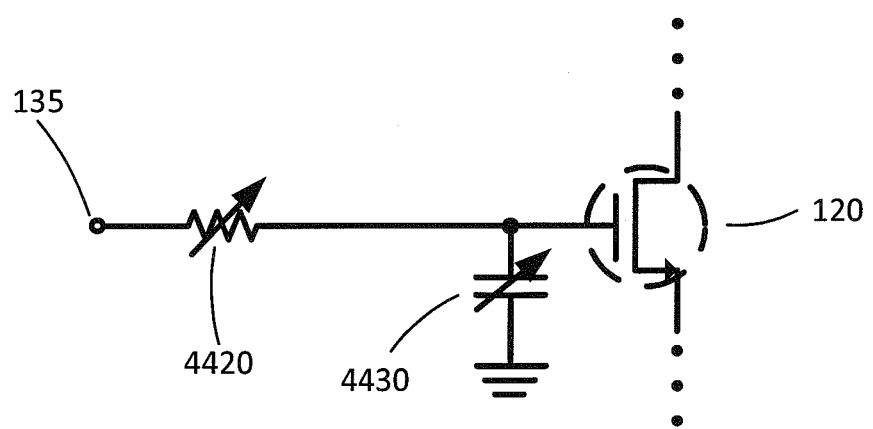
FIG. 44 shows an embodiment according to the present disclosure of a tunable gate bias network that can be connected, for example, to the second FET or the third FET shown in FIG. 1 or 8.

FIG. 44 shows an embodiment according to the present disclosure of a tunable gate bias network that can be connected to the second FET (120) or the third FET (155) shown in FIG. 1. This embodiment, as seen in FIG. 44, is an alternative where switches and accompanying passive elements (gate resistor and/or capacitor) can be replaced with tunable elements that have values that can be controlled. In the embodiment shown in FIG. 44, the tunable gate bias network comprises a tunable gate resistor (4420) connected between the second gate bias terminal (135) and the gate of the second FET (120) in addition to a tunable gate capacitor (4430) connected between the gate of the second FET (120) of FIG. 1 and ground or other suitable reference voltage. For the ET mode operation, the tunable gate resistor (4420) can be set to a low value, whereas for operation in the non-ET mode, the tunable gate resistor (4420) can be set to a high value. For the non-ET mode operation, the tunable gate capacitor (4430) can be set to a high value, whereas for operation in the ET mode, the tunable gate capacitor (4430) can be set to a low value (e.g. corresponding to a high signal impedance, where the term "signal impedance" can refer to an impedance presented to a time varying signal). These tunable gate resistors and capacitors can be used to alternatively bias a FET to configure the envelope tracking amplifier, where the configuring of the envelope tracking amplifier is thereby able to adapt its operation as the mode of operation of the embodiment changes between ET and non ET mode.

Alternately, the embodiments shown in FIGS. 41, 42, 43 and 44 can be combined in various ways to create other embodiments. By way of example, and not of limitation, the gate resistor switch (4110) of FIG. 41 can be added to the embodiment shown in FIG. 44, connected in a manner similar to the embodiment shown in FIG. 41. Alternatively, the tunable gate capacitor switch (4140) of FIG. 41 can be added to the embodiment shown in FIG. 44. Similar alteration or replacement of both the tunable gate resistor (4420) and the tunable gate capacitor (4430) can result in yet other embodiments.

Figure 45:
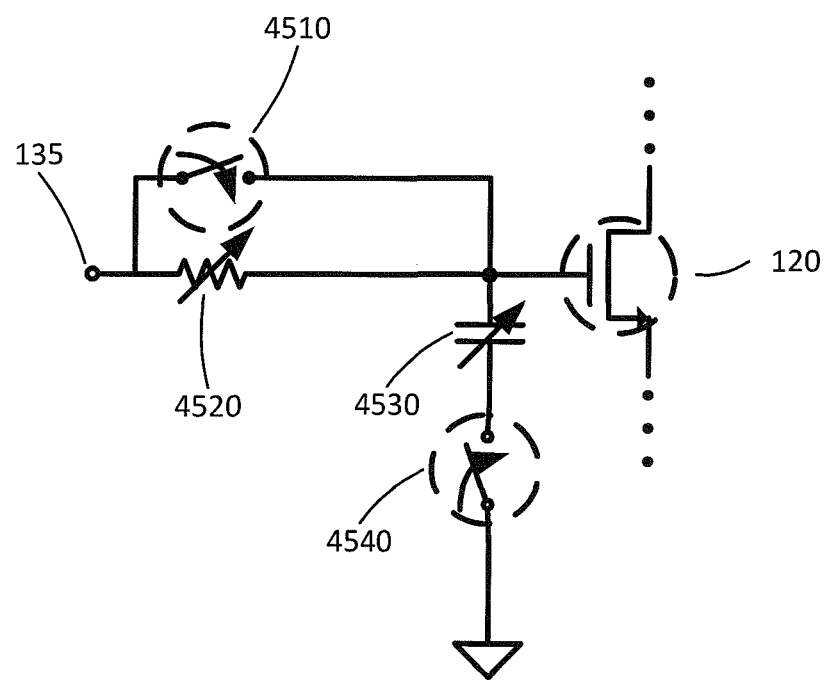
FIG. 45 shows an embodiment according to the present disclosure with the tunable gate resistor, the gate resistor switch, the tunable gate capacitor, and the gate capacitor switch that are shown in FIGS. 40-44.

FIG. 45 shows an embodiment according to the present disclosure comprising the tunable gate resistor (4520), the gate resistor switch (4510), the tunable gate capacitor (4530), and the gate capacitor switch (4540). A person skilled in the art will not require further explanation or diagrams to understand such embodiments as presented in the preceding two paragraphs.

The embodiment shown in FIGS. 44 and 45, as well as alternatives that have been explained above but not shown in figures, may also be applied to the third FET (155) in FIG. 1 or 8 as well as any FET among stacked FETs used to build an envelope tracking amplifier except for a first FET (e.g. the first FET (115) in FIG. 1) to which an input signal (e.g. an RF signal) is applied. Either or both of the gate resistor switch (4510) and the gate capacitor switch (4540) of FIG. 45, for example, can be a stacked switch in order to allow power handling capability greater than the power handling capability of a switch comprising a single transistor because a voltage present at the gate of the second FET (120) or a higher FET may be sufficiently high that a switch comprising a single transistor would not be appropriate.

Figure 46:
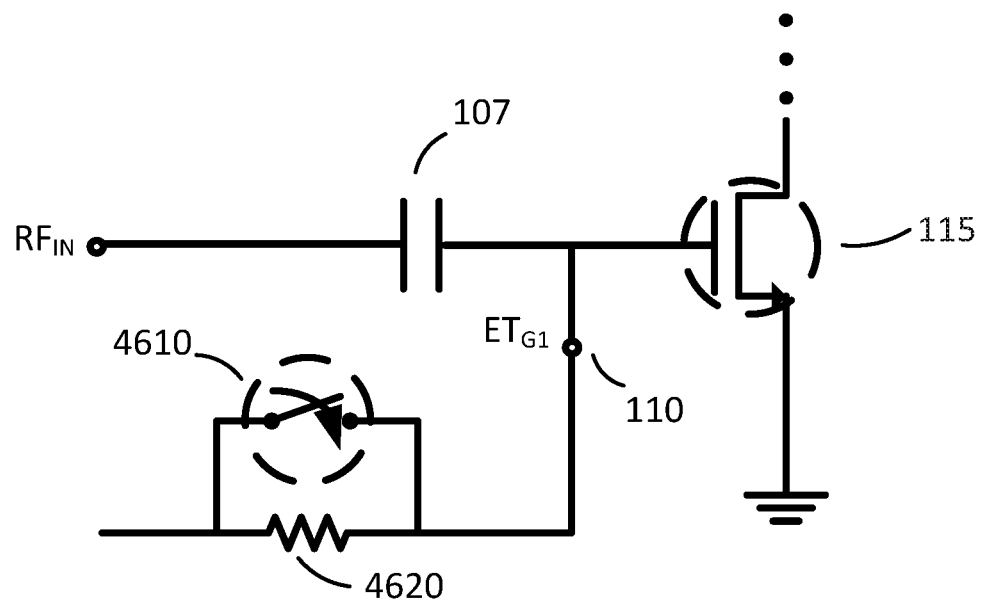
FIG. 46 shows an embodiment according to the present disclosure of a switchable gate network that can be connected to any FET, including a first FET of an envelope tracking amplifier (e.g. the first FET of the envelope tracking amplifier shown in FIG. 1) to which an input signal (e.g. an RF signal) is applied.

FIG. 46 shows an embodiment according to the present disclosure of a switchable gate network that can be connected the first FET (e.g. the first FET (115) in FIG. 1) to which an input signal (e.g. an RF signal, $RF_{IN}$) is applied. The embodiment shown in FIG. 46 comprises a gate resistor (4620) similar to the gate resistor (4120) shown in FIG. 41 and a gate resistor switch (4610) similar to the gate resistor switch (4110) shown in FIG. 41 that can be connected in a path between the input signal and a gate of the first FET to which the input signal is applied (110), while omitting a gate capacitor similar to the gate capacitor (4130) and a gate switch similar to the gate switch (4140) of FIG. 41. In the embodiments where the gate resistor (4620) and the gate resistor switch (4610) are applied to FETs other than a first FET (e.g. the first FET (115) in FIG. 1 or FIG. 34) to which an input signal (e.g. an RF signal) is applied, the gate resistor switch (4610) can be a stacked switch (e.g. a switch comprising stacked transistors) in order to allow power handling capability greater than a power handling capability of a switch comprising a single transistor because a voltage present at the gate of the second FET (120) or a higher FET may be sufficiently high that a switch comprising a single transistor would not be appropriate. Other alternative embodiments that include the gate resistor switch (4610) can implement the gate resistor switch (4610) as a stacked switch for similar reasons.

Figure 47:
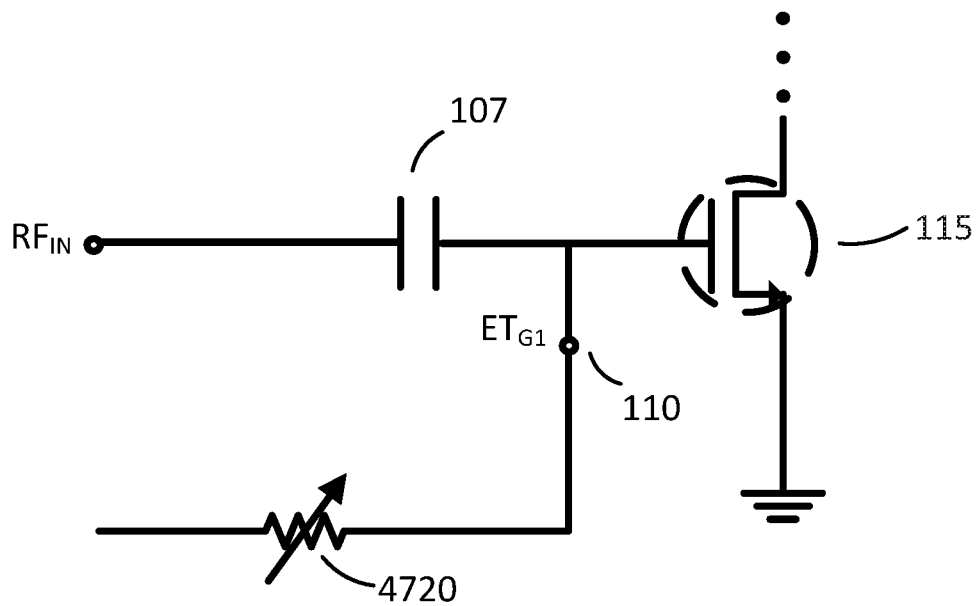
FIG. 47 shows an embodiment according to the present disclosure of a tunable gate network that can be connected to any FET, including a first FET to which an input signal (e.g. an RF signal) is applied (e.g. the first FET in FIG. 1 or 8).

FIG. 47 shows an embodiment according to the present disclosure of a tunable gate network that can be connected to the first FET (e.g. the first FET (115) in FIGS. 1, 3, 4, 6 and 8) to which an input signal (e.g. an RF signal) is applied. The tunable gate network can comprise a tunable gate resistor (4720) that can be connected in a path between the input signal and a gate of the first FET to which the input signal is applied (110), while omitting a tunable gate capacitor similar to the tunable gate capacitor (4530) of FIG. 45. For the ET mode operation, the tunable gate resistor (4720) of FIG. 47 can be set to a low value, whereas for operation in the non-ET mode, the tunable gate resistor (4720) of FIG. 47 can be set to a high value.

Figure 48:
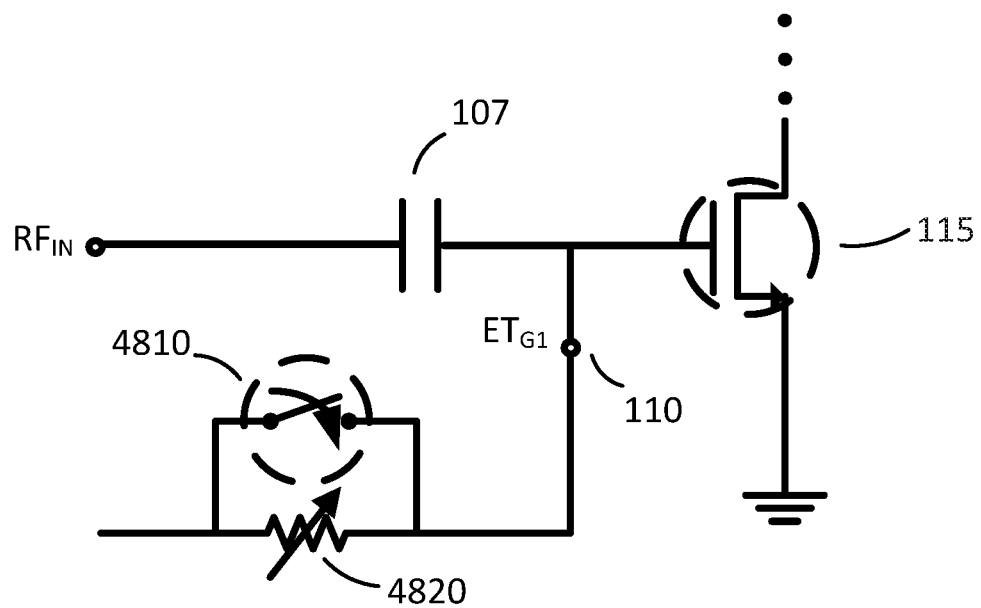
FIG. 48 shows an embodiment according to the present disclosure with the gate resistor switch and the tunable gate resistor that are shown individually in FIGS. 46 and 47, respectively.

Alternatively, the gate resistor switch (4610) of the embodiment shown in FIG. 46 can be added to the embodiment shown in FIG. 47 and connected in a manner similar to the embodiment shown in FIG. 46. FIG. 48 shows an embodiment according to the present disclosure comprising the gate resistor switch (4810) and the tunable gate resistor (4820). In the previous embodiments the gate resistor and the gate resistor switch were applied to FETs other than a first FET (e.g. the first FET (115) in FIG. 1). FIG. 48 shows the gate resistor (4820) and the gate resistor switch (4810) applied to the first FET (e.g. the first FET (115) in FIG. 1) to which an input signal (e.g. an RF signal) is applied. The gate resistor switch (4810) can be a stacked switch (e.g. a switch comprising stacked transistors) in order to allow voltage handling capability greater than the voltage handling capability of a switch comprising a single transistor because a voltage present at the gate of the second FET (120), for example of FIG. 1, or a higher FET may be sufficiently high that a switch comprising a single transistor would not be appropriate. A person skilled in the art will not require further diagrams or explanation to understand the embodiments presented in FIG. 46-48, and will also understand the advantage the embodiment of FIG. 47 has over the other two, mainly due to the practicality of the implementation.

Generally speaking, when switching between the ET mode and the non-ET mode, an effective number of FETs in a stack of FETs used to construct an envelope tracking amplifier can be configured based on the selected mode of operation. By way of example, and not of limitation, if the ET mode of operation is desired and higher amplification is needed (e.g., a higher output power from the variable power supply across the stack of FETs), an effective number of FETs in the stack of FETs used to construct an envelope tracking amplifier can be increased. Conversely, if the non-ET mode of operation is desired, the effective number of FETs in the stack of FETs used to construct an envelope tracking amplifier can be decreased. Selection of a desired number of FETs to be active can be provided based on a particular biasing of individual FETs of the stack of FETs. Numerous embodiments that operate by changing the effective number of FETs in the stack of FETs used to construct the envelope tracking amplifier are possible, two of which are presented in the following paragraphs.

Figure 49:
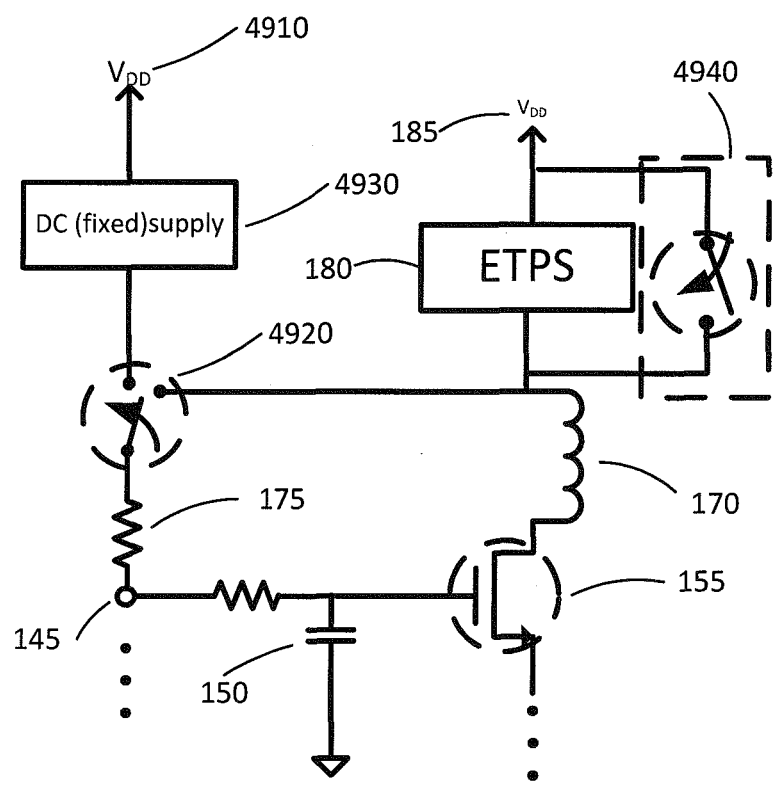
FIG. 49 shows an embodiment according to the present disclosure of an alternative biasing arrangement for the third FET shown in FIG. 1.

FIG. 49 shows an embodiment according to the present disclosure of an alternative biasing arrangement for the third FET (155) as shown in FIG. 1. In the embodiment shown in FIG. 49, an upper terminal of the third resistor (175) is connected to a supply switch (4920). The supply switch (4920) can be operated to connect the upper terminal of the third resistor (175) to either the ETPS (180) or to a fixed DC supply (4930), both of which can be connected to draw power from a voltage source $V_{DD}$ (185, 4910). If the ET mode of operation is desired, the upper terminal of the third resistor (175) can be connected to the ETPS (180). If the non-ET mode of operation is desired, the upper terminal of the third resistor (175) can be connected to the fixed DC supply (4930), which supplies a high DC bias voltage (constant power supply) to the gate of the third FET (155) that can bias the third FET (155) to operate in the triode region. Operation of the third FET (155) results in the third FET acting as a resistor rather than an amplifier. Additionally, fixed power is supplied to the drain of the stack of three FETs in non-ET mode. This can be achieved either by providing a direct connection from the DC supply (4930) to the stack of three FETs. Alternatively, a bypass circuit (4940) can be implemented with the ETPS (180) such that a bypass mode can be enabled allowing the voltage supply $V_{DD}$ (185) to be supplied to the stack of three FETs effectively providing a constant power for non-ET mode and removing the ETPS (180) from the arrangement. FIG. 49 thus presents two distinct embodiments of the present disclosure. First, a method to switch the device (155) to triode region of operation and thus to effectively remove it from the amplification stage. Second, a method to switch between ET mode and non-ET mode by switching the path to the gate of the cascode.

Biasing the third FET (155) to operate in the triode region (and thus having the third FET (155) act as a resistor rather than an amplifier) reduces the effective number of FETs in the stack of FETs used to construct the envelope tracking amplifier (100) of FIG. 1. In general, an n-channel FET with an applied gate to source voltage that is higher than a drain to source voltage of the n-channel FET by an amount greater than or equal to a threshold voltage of the n-channel FET can function as a resistor (triode) with a value that is a function of the applied gate to source voltage.

Modifications similar to the embodiment shown in FIG. 49 can also be made, for example, to the second FET (120) of FIG. 1 as well as any FET in a stack that is used to construct an envelope tracking amplifier, except for a first FET (e.g. the first FET (115) in FIG. 1) to which an input signal (e.g. an RF signal) is applied. The embodiment shown in FIG. 49 can also be applied to the envelope tracking amplifier (800) shown in FIG. 8 by omitting the third resistor (175) of FIG. 1 and configuring the arrangement such that the switch (4920) of FIG. 49 selects, as a bias voltage to be applied to the third gate bias terminal (145), between a high bias voltage (e.g. supplied by the fixed DC supply (4930)) that can bias the third FET (155) to operate in the triode region and a dynamic bias voltage that is supplied either by the ETPS (180) of FIG. 1 or a separate controller (not shown).

Figure 50:
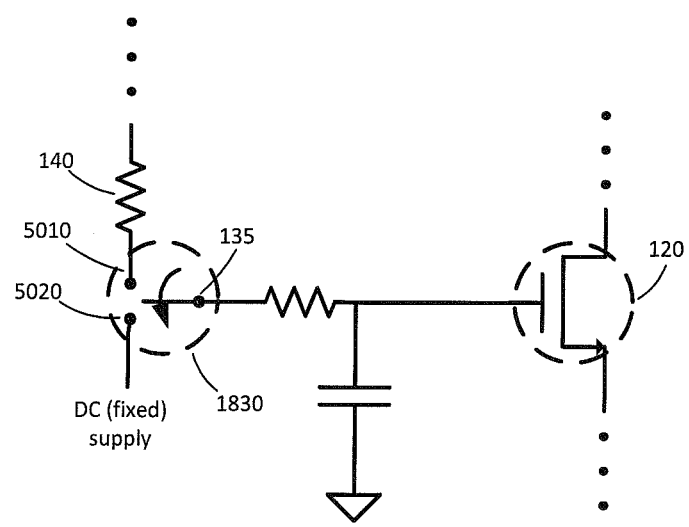
FIG. 50 shows an embodiment according to the present disclosure of a switchable biasing arrangement applied to the second FET of FIG. 1.

FIG. 50 shows an embodiment according to the present disclosure of a switchable biasing arrangement similar to the embodiment shown in FIG. 49 applied to the third FET (155) that is applied instead to the second FET (120). A supply switch (5030) can be operated to connect the second gate bias terminal (135) to an ET mode select terminal (5010) that further connects to the second resistor (140) of the bias network shown in FIG. 1 for the ET mode. Alternatively, for the non-ET mode, the supply switch (5030) can be operated to connect the gate bias terminal (135) to a high bias voltage terminal (5020), where such terminal (5020) is at a fixed bias voltage (e.g. supplied by a fixed voltage source) that when applied to the gate of the second FET (120) is adapted to bias the second FET (120) in the triode region, thus causing the second FET (120) to function as a resistor instead of an amplifier. Similar to the discussion of the embodiment shown in FIG. 49, biasing the second FET (120) to function as a resistor instead of an amplifier reduces the effective number of FETs in the stack of FETs used to construct the envelope tracking amplifier (100) of FIG. 1. Alternatively, the embodiment shown in FIG. 50 can also be used in conjunction with the envelope tracking amplifier (800) shown in FIG. 8 by omitting the second resistor (1840) of FIG. 50 and configuring the arrangement such that the supply switch (5030) selects, as a bias voltage to be applied to the second gate bias terminal (135), between a high bias voltage that can bias the second FET (120) to operate in the triode region and a dynamic bias voltage that is supplied either by the ETPS (180) of FIG. 1 or a separate controller (not shown).

Figure 51:
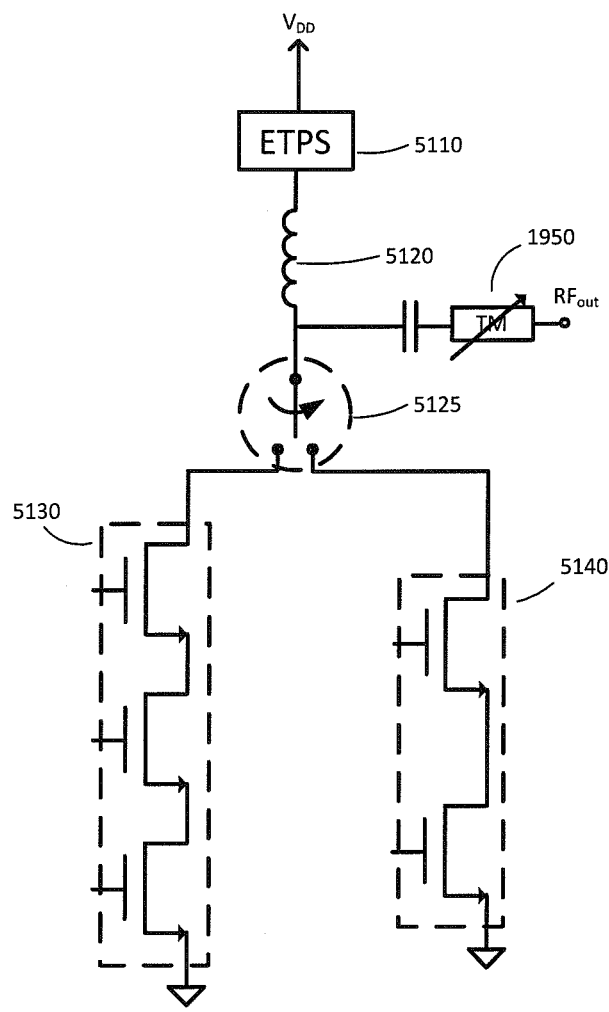
FIG. 51 shows an embodiment according to the present disclosure of an arrangement comprising a first stack of three FETs, a second stack of two FETs, a switch that can be operated to select one of the two stacks, an inductor, and an Envelope Tracking Power Supply (ETPS) that is connected to a voltage supply $V_{DD}$, where the inductor serves as an RF choke and is placed in a path between the ETPS converter and whichever stack is selected.

With the above two embodiments, biasing a gate voltage of the FET is used to reduce the stack height. Alternatively, embodiments could be provided where amplifier arrangements of different stack heights are chosen directly. For example, FIG. 51 shows an embodiment according to the present disclosure of an amplifier arrangement comprising a first stack (5130) comprising three FETs, a second stack (5140) comprising two FETs, a stack switch (5125) that can be operated to physically select one of the two stacks (5130, 5140), an inductor (5120), and a ETPS (5110) that is connected to a voltage supply $V_{DD}$, where the inductor serves as an RF choke and is placed in a path between the ETPS (5110) and whichever stack is selected. For the ET mode, the stack switch (5125) can be operated to select the first stack (5130), because the ET mode may require a higher DC voltage across the stack of FETs than the non-ET mode. For the non-ET mode, the stack switch (5125) can be operated to select the second stack (5140). In some embodiments, the first stack (5130) further comprises elements (e.g. as described previously) appropriate to the envelope tracking amplifier (100) shown in FIG. 1, the envelope tracking amplifier (800) shown in FIG. 8, or other envelope tracking amplifiers that comprise stacked transistors. Alternatively, the first stack (5130) may comprise four or more transistors, while the second stack (5140) can comprise any number of transistors that is fewer than a number of transistors in the first stack (5130). By way of further example, and not of limitation, the first stack (5130) may comprise two transistors, while the second stack (5140) can be reduced to a single transistor (e.g. no longer a stack).

As seen in FIG. 51, both the first stack (5130) and the second stack (5140) utilize one tunable matching network (1950) prior to an output of the amplifier arrangement. Although use of a single shared tunable matching network (1950) can save space during implementation, this embodiment may make the tunable matching network more challenging. This is because the choke (5120) would be common to both stacks and possibly not optimized for either. As a result, the tunable matching network (1950) may have to cover a wider tuning range.

Figure 52:
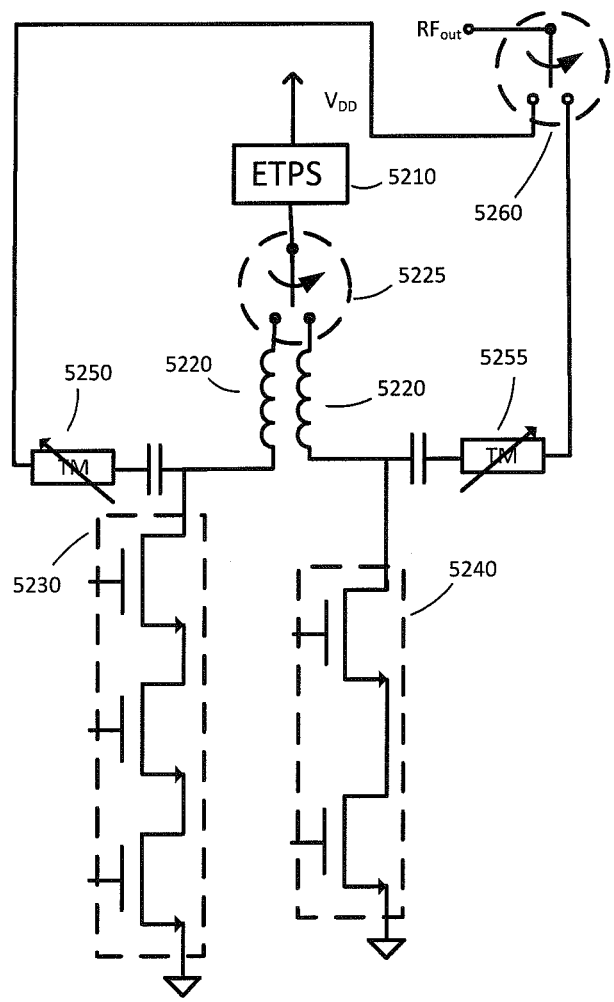
FIG. 52 shows an embodiment similar to FIG. 51, except that the switch used to select one of the two stacks is placed prior to the RF choke (thereby requiring separate RF chokes for each stack).

FIG. 52 shows an embodiment similar to FIG. 51 except that the stack switch (5125) of FIG. 51 is now directly connected to the ETPS (5110) of FIG. 51. The inductor (5220) is no longer in direct connection with the ETPS (5210) but rather is part of the first stack and second stack of FETs (5230, 5240). The re-arrangement of the inductor (5120; 5220) and the stack switch (5125; 5225) influences matching for the embodiment seen in FIGS. 51 and 52. For example, as stated above in FIG. 51, given the location of the inductor (5120) and the stack switch (5125), a shared matching can be provided for the first stack (5130) and the second stack (5140). However, as seen in FIG. 52, because the stack switch (5225) and the inductor (5220) is now swapped with respect to the relationship seen in FIG. 51, the first stack (5230) and the second stack (5240) may have separate tunable matching networks (5250, 5255).

As discussed above in FIG. 51, the first stack (5130) and the second stack (5140) may each desire a different output match. However, the embodiment uses a single sharable tunable matching network (1950) which may not be able to provide a desired matching for both stacks. On the other hand, the embodiment in FIG. 52 allows for the use of separate tunable matching networks (5250, 5255) for the first stack (5230) and the second stack (5240). Although such an embodiment could use more space during implementation compared to the embodiment of FIG. 51, the embodiment of FIG. 52 would allow a desired matching to be provided to both the first stack (5230) and the second stack (5240). An ability to provide the desired matching to both the first stack (5230) and the second stack (5240) is a further advantage the embodiment of FIG. 52 has over the embodiment of FIG. 51. However, FIG. 52 has a lot more complexity and thus cost. These factors need to be considered in the selection of the implementation strategy.

Given that the embodiment of FIG. 52 has two tunable matching networks (5250, 5255) for each of the two stacks (5230, 5240), an output switch (5260) has been added to select an appropriate output based on which stack the stack switch (5225) selects. The selected output by the output switch (5260) would be provided to a load (e.g. an antenna) or any additional circuitry to which the embodiment of FIG. 52 may be connected to.

For all of the embodiments previously discussed in the present disclosure in relation to switching an amplifier operation mode between ET and non-ET, control of switches and/or tuning of tunable elements can be performed by control signals that are provided by a transceiver, a microprocessor (e.g. a control unit of a cell phone or wireless device), a control circuit corresponding to any amplifier within a given embodiment, or some other unit that is configured to provide appropriate control signals, whether implemented in hardware (e.g. simple/complex digital logic, analog), software and/or a combination thereof. Any and all parts of these various embodiments can be monolithically integrated for better overall performance as well as reduced manufacturing cost, assembly cost, testing cost and form factor.

Going back to FIG. 1, a person skilled in the art will recognize that due to the high output power requirement of a cascode amplifier stage, the drain voltage supplied to transistor (155) should be of high current capability, whereas corresponding gate bias voltages (i.e. $ET_{G1}$, $ET_{G2}$, $ET_{G3}$) need not. In a practical sense, this high current requirement for the drain voltage imposes close proximity of the corresponding generation circuitry to the cascode stage. In most embodiments generation of the drain voltage is performed within the ETPS.

Furthermore and as discussed in prior embodiments, in order to optimize operation (e.g. linearity, efficiency, ACLR) of the amplifier (100) in the envelope tracking mode, each of the bias voltages $ET_{G1}$, $ET_{G2}$, $ET_{G3}$ can independently be scaled, amplitude shifted, phase shifted, inverted, and/or subject to any mathematical operation (e.g. implemented by an op-amp circuit or lookup table) with relation to the bias voltage supplied to the inductor (170) prior to being applied to gate bias nodes (110, 135, 145). In some embodiments, the bias voltage $ET_{G1}$ may be held fixed while the other two bias voltages $ET_{G2}$ and $ET_{G3}$ vary as a function of the control voltage connected to the input terminal (190) of the ETPS (180), but with differing gains and/or phases. In yet another embodiment, $ET_{G3}$ may be set to a high voltage to put transistor (155) strongly in the triode region when the envelope voltage on its drain (through inductor 170) goes very low and thus removing transistor (155) from the cascode configuration, while decreasing $ET_{G2}$ to follow the envelope and maintain the cascode effect. These techniques can be applied to any or all of the gates in a stack and the stack can be anywhere from a stack of 1 to a stack of n (n>1, e.g. n=3, 4, 7, . . . ).

This added flexibility of independently and dynamically controlling the various gate bias voltages provides for better control of the response of the ET amplifier as compared to the traditional ET implementation, wherein only the drain voltage is controlled using an envelope signal. For example, knowing the operational characteristics of the ET amplifier with respect to its drain input voltage, one can further optimize using any one or combination of the controlling gate biases and create lookup tables to provide corrections to the gate biases based on the input voltage to the drain. Corrections can be made to optimize response of the ET amplifier for one or multiple of linearity, efficiency, output power and adjacent channel leakage ratio (ACLR) and using various strategies (e.g. keep one gate constant and correct for other two). These lookup tables can subsequently be used by some circuitry (e.g. waveform generation) to generate corrections during operation (e.g. increase output power request by a base station). Although these types of corrections can be completely predicted by the drain input or corresponding control signal, other type of corrections can be generated as well. For example:

Thermal memory effect, which affects the response of the amplifier due to accumulation of internal heat generated in response to the RF input signal level (amplifier hitting peak currents and voltages as a function of the RF input signal and the envelope) and frequency content can be predicted based on the RF input (e.g. integration of the envelope signal, running power average of the RF input signal, etc. . . . ) and thus can be compensated.

Heat generated within the amplifier as a consequence of the output power requirement and/or environmental conditions, which also affects the response of the amplifier, can be monitored (e.g. thermo-coupler, FIG. 74) and corrections be generated as a consequence.

Figure 74:
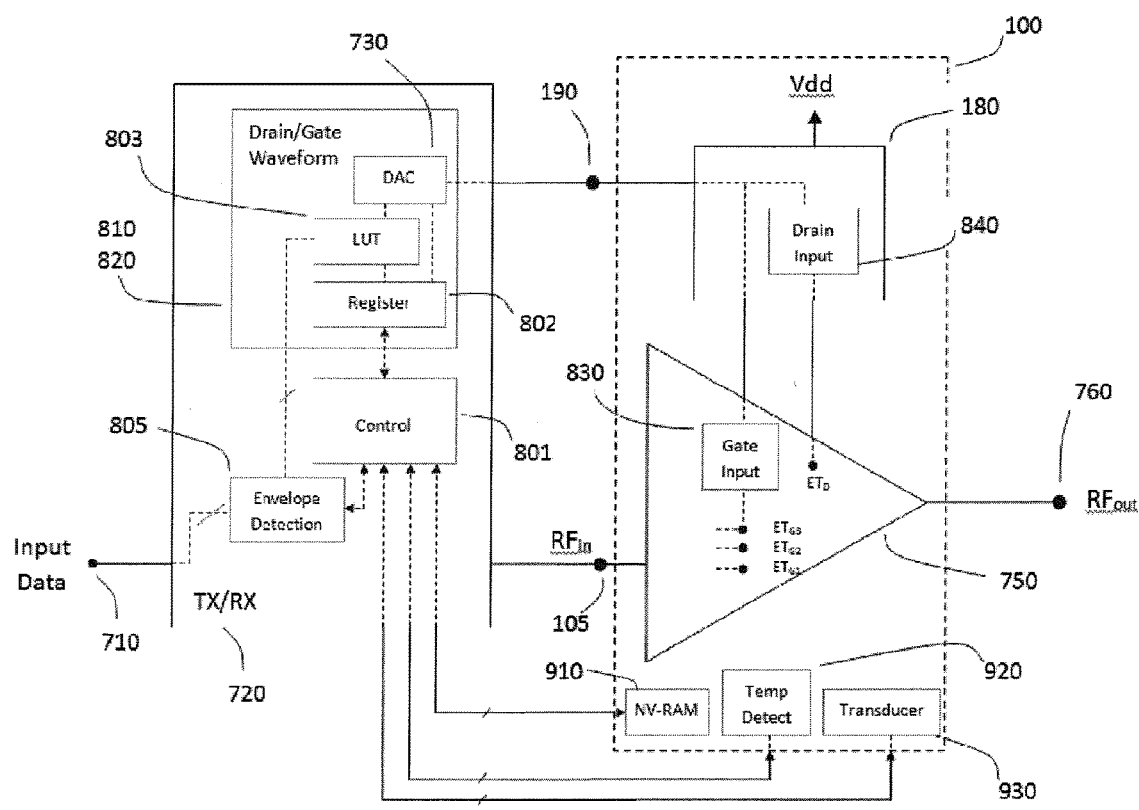
FIG. 74 shows an example embodiment according to the present disclosure wherein the ET amplifier further comprises Non-Volatile RAM (NV-RAM), temperature detector and other transducers used to report operating characteristics of the amplifier.

In such cases, the lookup tables described above may include additional dimensions to describe corrections based on the real time and/or estimated operating temperature of the amplifier. The person skilled in the art will see that same correction/compensation method can be used with respect to other parameters which may affect operation of the amplifier. FIG. 74 (further described later) shows the case where a temperature detection module (920) is used to monitor the real time operating temperature of the amplifier and feed this information back to a control unit (801) within a controller (720) (e.g. Transceiver unit) which in turn uses this information to control operation of a waveform generation module (810, 820). Latter waveform generation module in turn generates a control signal for the ETPS (180) supplying the amplifier (750). In a same manner and concurrently, transducer (930) may be used to correct/compensate for the parameter it is monitoring. This parameter may be any measurable within the amplifier, such as various threshold voltages, bias currents, bias voltages and other measurable parameters associated to the various components within the IC. The person skilled in the art will know about the batch to batch variability in IC manufacturing process and thus will appreciate the added value of the presented embodiment.

Going back to FIG. 1, the person skilled in the art will understand that this figure does not depict all the features described above and that additional circuitry may be used to accommodate for said features.

The envelope tracking amplifier (100) shown in FIG. 1 can be used as a driver, a final, or any other type of amplifier. The person skilled in the art will understand that the stack may comprise any number of FETs, as the embodiment shown in FIG. 1 uses three FETs merely as an example.

Figure 53:
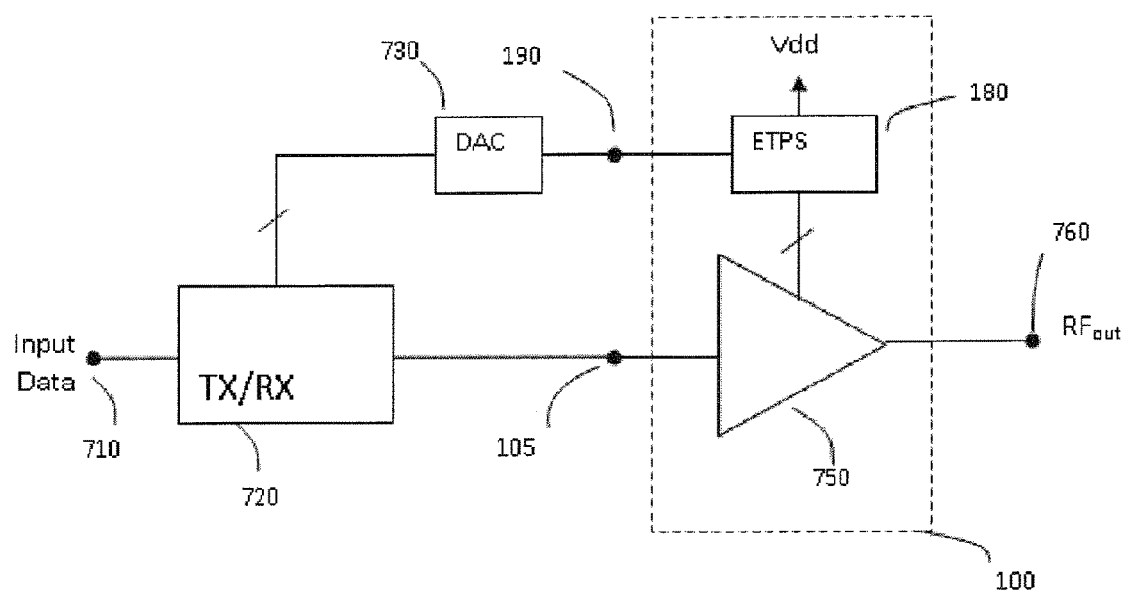
FIG. 53 shows an exemplary embodiment of the present disclosure wherein a DAC unit is used to generate controlling signals.

FIG. 53 shows an embodiment according to the present disclosure where the control signal (190) of FIG. 1 is explained in additional detail. Shown in FIG. 53 are an input node (710), a transceiver (720) whose input is connected to the input node (710), a digital to analog converter (DAC) (730) that is controlled by the transceiver (720), the envelope tracking amplifier (100) of FIG. 1, and an output node (760) that corresponds to an output of the envelope tracking amplifier (100).

For the sake of simplicity, the transceiver (720) of FIG. 53 is depicted in a transmit mode, wherein the Input Data presented to its input terminal (710) is processed within the transceiver to generate the analog output data signal RFin which is usually modulated in one of many transmission schemes, and fed to the input terminal (105) of the amplifier (100), wherein the RFin signal is further processed prior to final transmission. The input to the transceiver can be in analog or digital form. The analog signal will typically be in I&Q or Cartesian format. The envelope of the signal can be computed within the transceiver as SQRT(I 2+Q^2) which is the magnitude of the vector represented by (I,Q) components. If the data to the transceiver (720) is input in a digital form, the envelope can be computed within the transceiver (720) digitally or with analog techniques after the digital information is converted to analog in the RF modulation process. The person skilled in the art will understand that by virtue of its internal processing capability the transceiver (720) has other functions and connections besides what depicted in FIG. 53. It should also be noted that similar to the manner in which the transceiver (720) performs the task of converting the input data to the output analog stream RFin, if enabled by some design changes it can perform additional operations based on the input data and/or the RFin. In turn this generates additional output signals with known relationships with respect to these two signals. For example, if enabled by some design changes, the transceiver (720) can generate and output:

Analog waveforms with known phase and amplitude relationships with respect to RFin.
Analog waveforms with known phase and amplitude relationships with respect to the dynamic envelope of RFin.
Completely arbitrary analog waveforms.
Digital representation of any of the above, which can be derived either from RFin, directly from the input digital data or neither (case of arbitrary waveform).

In the embodiment shown in FIG. 53, the transceiver (720) is modified to output a digital representation of the envelope amplitude of RFin along with the control signals, which are fed to the external DAC unit (730). The DAC (730) uses its input digital signals, comprised of data and control signals, to generate an analog signal representing the envelope amplitude of the input RFin, which in turn is fed to the ETPS (180) input control terminal (190). The ETPS (180) uses the analog signal fed to its control terminal (190) as a means to control the various supply and biasing voltages fed to the amplifier (750) with the overall goal to optimize dynamic operation of the amplifier. For example, referring to FIG. 1, the ETPS (180) uses input (190) to generate a dynamic voltage with high current capability to feed transistor (155) drain terminal via inductor (170) and uses the same input (190) to generate a dynamic voltage with lower current capability to feed the gate terminals of transistors (120) and (155) via resistor (175). It is to be noted that the DAC unit (180) can also include a filter element at its output stage, so to filter out any undesired artifacts introduced by the digital-to-analog conversion process as well as to match input signal requirements to the ETPS (180).

Figure 54:
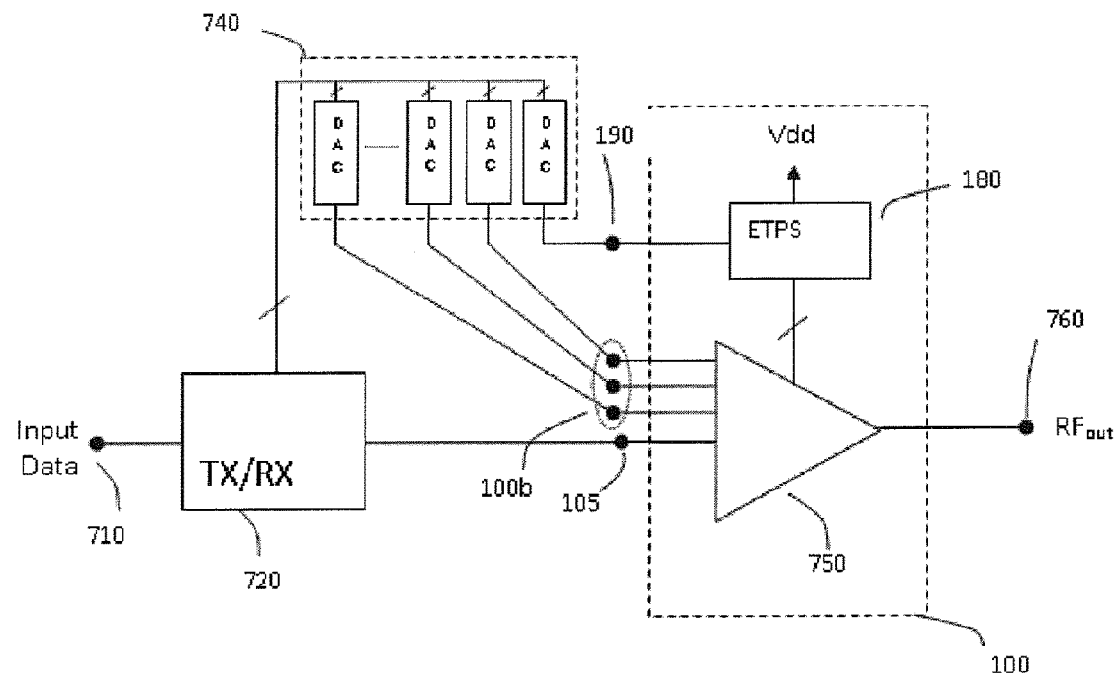
FIG. 54 shows an exemplary embodiment of the present disclosure wherein several DAC units are used to generate bias control signals.

FIG. 54 shows another embodiment according to the present disclosure wherein the DAC unit (730) of FIG. 53 is now replaced with module (740). Module (740) is connected at its input to the transceiver (720) and is connected at its output to input terminals (190) and (100b) of the envelope tracking amplifier (100). Module (740) is comprised of a plurality of DAC units, each similar in function to DAC (730) and each with a different set of input digital signals, comprised of data and control signals, generated by the transceiver (720).

Similar to the embodiment of FIG. 53, each of the DAC units comprised within the module (740), uses its input digital signals to generate an analog signal representing the envelop amplitude of the input RFin, which in turn is fed to one of the plurality of input nodes within input terminals (190) and (100b), thus providing the envelope tracking amplifier (100) with a plurality of analog control voltages internally used to set various supply and biasing voltages for optimal dynamic response of the amplifier. Compared to the embodiment of FIG. 53, this approach has the flexibility to generate analog control voltages with varying amplitude and phase relationships with respect to each other and with respect to the recovered envelope signal. Similar to the DAC unit (730) of FIG. 53, each of the DACs within module (740) can also include a filter element at its output stage, and which can be different for each DAC unit.

In one embodiment of FIG. 54 and with reference back to FIG. 8, terminal (190) is used to feed (low current) control voltage to dedicated circuitry within the ETPS unit wherein high current drain voltage for transistor (155) is generated, whereas terminal (100b) is used to directly feed the various gate bias voltages of the cascode transistors as depicted by FIG. 8. Note that in this configuration, resistors (130), (140)

and (175) previously shown in FIG. 1 are not present, as usage of these resistors may be dictated by the driving requirements of the driving circuitry. In another embodiment of FIG. 54, control voltage at (190) is used to generate gate and drain bias voltages within the ETPS unit (180) while control voltages at (100b) are used to provide incremental corrections to gate bias voltages (e.g. FIG. 9) via summing resistors connected to $ET_{G1}$, $ET_{G2}$ and $ET_{G3}$.

It should also be noted that the ETPS, as used throughout the present disclosure, needs to have sufficient bandwidth to accommodate the bandwidth of the amplitude component of the modulation, which is typically 5-10 times wider than the modulation bandwidth. The ETPS must have minimal distortion (amplitude and phase) over this bandwidth. It is common for the ETPS to be built using a DC-DC converter to provide the low frequency portion of the amplitude path and an analog amplifier for the high frequency portion, along with some analog control circuitry to control overall operation of the unit. The DC-DC converter has a higher efficiency than the analog amplifier, but suffers from challenges in bandwidth as well as spurs due to the switching nature of the DC-DC. The analog amplifier covers the DC-DC converter's shortfalls. Noise, in addition to the spurs, must also be considered. A faster DC-DC converter will improve the overall efficiency of the ETPS by requiring less help from the analog amplifier. In the limit case, the ETPS consists of solely of a DC-DC converter. Using a semiconductor process such as silicon on sapphire (SOS), or even silicon on insulator (SOI), reduces the parasitic capacitances and offers several device advantages that result in faster DC-DC converters.

Figure 55:
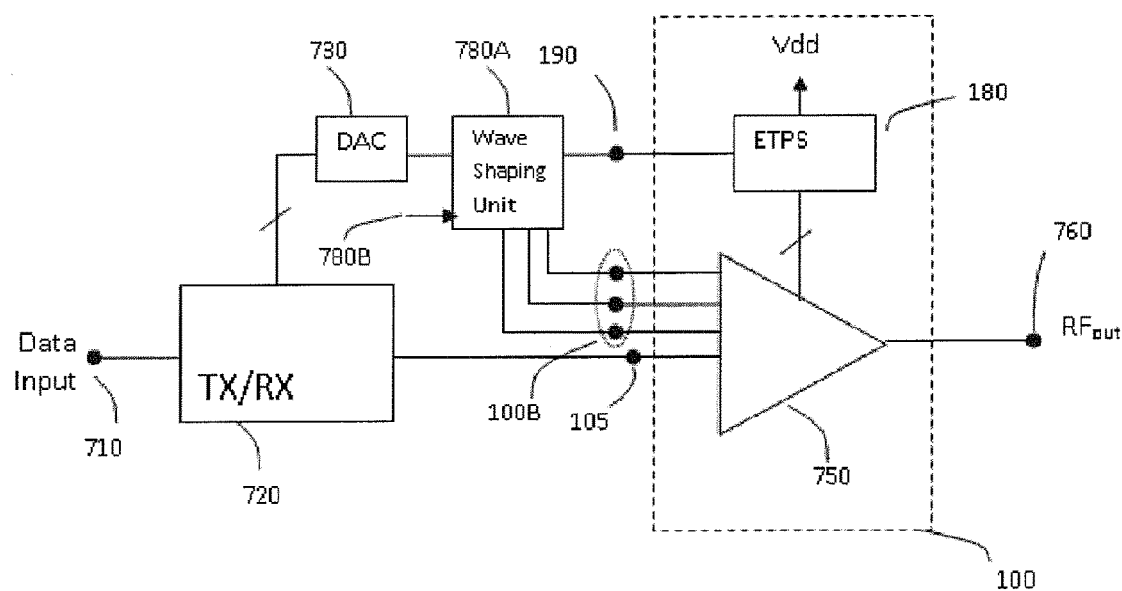
FIG. 55 shows an exemplary embodiment of the present disclosure wherein a wave shaping unit is used to generate bias control signals.

FIG. 55 shows another embodiment according to the present disclosure wherein a wave shaping unit is used to further generate independent analog control signals which are in turn used to feed various bias and supply voltages within the envelope tracking amplifier (100). In this embodiment, the DAC (730) output is connected to the input of the wave shaping unit (780A) which in turn through its plurality of outputs is connected to the envelope tracking amplifier (100) input terminals (190) and (100b), the latter input terminal being comprised of a plurality of input nodes. The wave shaping unit receives a single input voltage from the DAC unit (730), which is typically representative of the envelope amplitude of the RFin signal fed to the amplifier (100) at terminal (105), and it is programmed to generate using its internal waveform processing capability (e.g. analogue/digital signal processing, lookup tables), a set of independent output voltages based on the input voltage, with varying amplitude and phase relationships. These relationships, designed to further improve overall dynamic response of the amplifier (100) are either pre-programmed within the wave shaping unit or can be defined dynamically through a control input terminal (780B) to the wave shaping unit. Control data fed to the input terminal (780B) may originate from transceiver unit (720) or a separate control unit and may include information such mode/configuration selection and adjustments to the waveform processing such as offsets, gain and phase.

Figure 9:
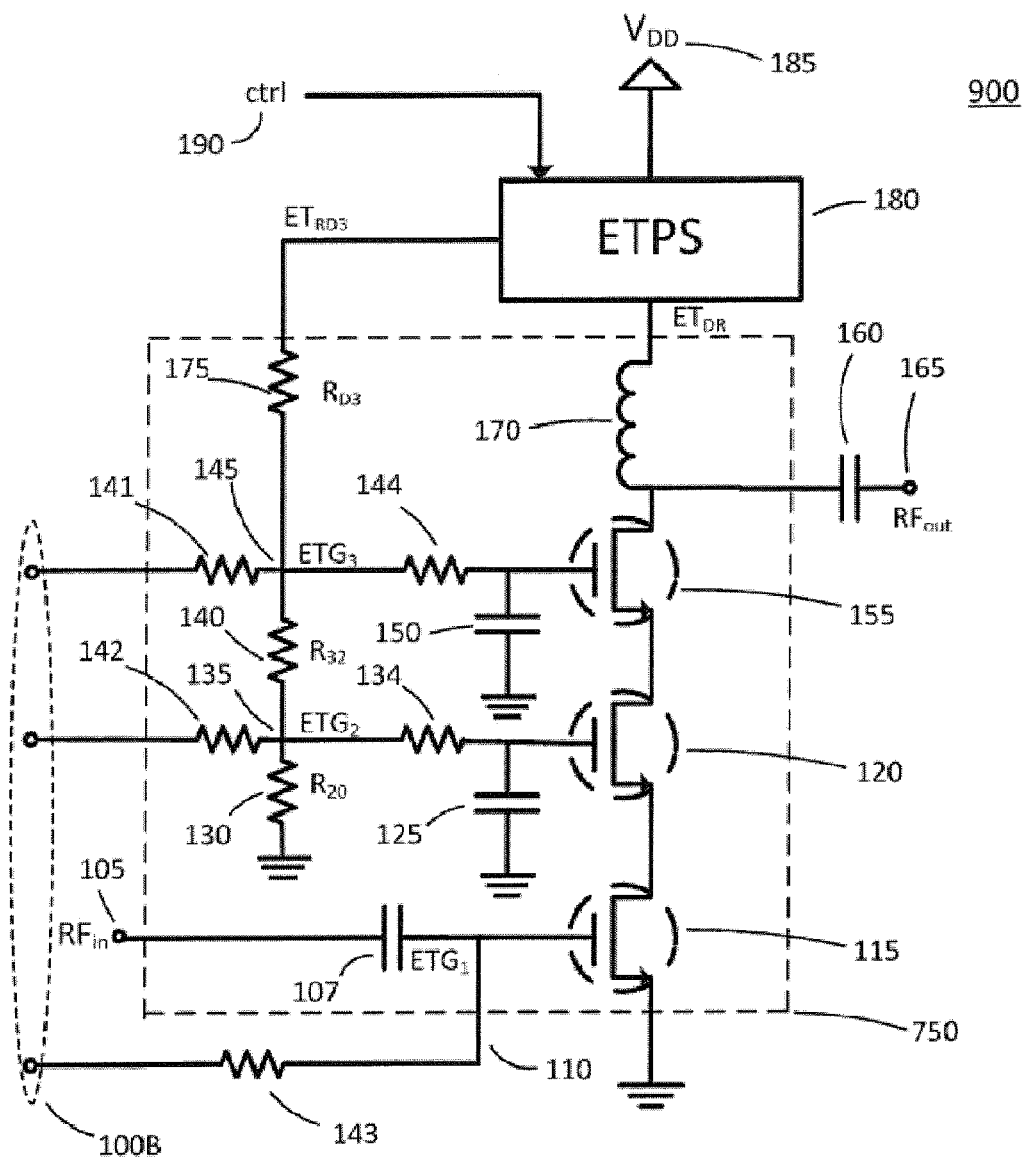
FIG. 9 shows an example embodiment according to the present disclosure of an envelope tracking amplifier with gates and drain modulation, wherein summing resistors are used to provide incremental corrections to gate biases in addition to gate biasing provided by the ETPS unit.

As it was the case in the embodiment depicted by FIG. 54, control voltages fed to terminals (190) and (100b) of the embodiment depicted by FIG. 55 can be internally used by the envelope tracking amplifier (100) in different ways and as supported by the internal electrical configuration of the amplifier (i.e. FIGS. 8 and 9).

The examples set forth above are provided to give those of ordinary skill in the art an overview of various control systems and methods related to the implementation of the envelope tracking method as related to the present disclosure. As mentioned before, these are only implementation examples and not limiting the scope of what the inventors regard as their disclosure.

Based on these examples, one can derive the following set of functional units and system functions to be implemented therein through some dedicated circuitry, which together implement the envelope tracking method. Any combination of these functional units may be integrated in one IC and/or module.

Functional Units:
   Transceiver (Tx/Rx)
   ET power supply (ETPS)
   Power Amplifier (PA)
   Waveform shaping unit (WS)

System Functions:
   Envelope detection:
     Generates a representation of the envelope signal in either digital or analog form based on the analog or digital Data input or the RFin signal.
   Gate waveform generation:
     Generates a representation of the Gate bias control signal in either digital or analog form. This is generally based on the envelope signal and a set of ET amplifier operating characteristics.
   Drain waveform generation:
     Generates a representation of the Drain bias control signal in either digital or analog form. This is generally based on the envelope signal and a set of ET amplifier operating characteristics.
   PA gate input generation:
     Generates the actual analog gate bias voltage to be fed to each of the gates of the cascade amplifier. This is generally based on the gate waveform generated by the gate waveform generation function and adapted to match input requirements to the various gates.
   PA drain input generation:
     Generates the actual analog drain bias voltage to be fed to the cascode amplifier. This is generally based on the drain waveform generated by the drain waveform generation function and adapted to match input requirements to the drain.

Figure 71:
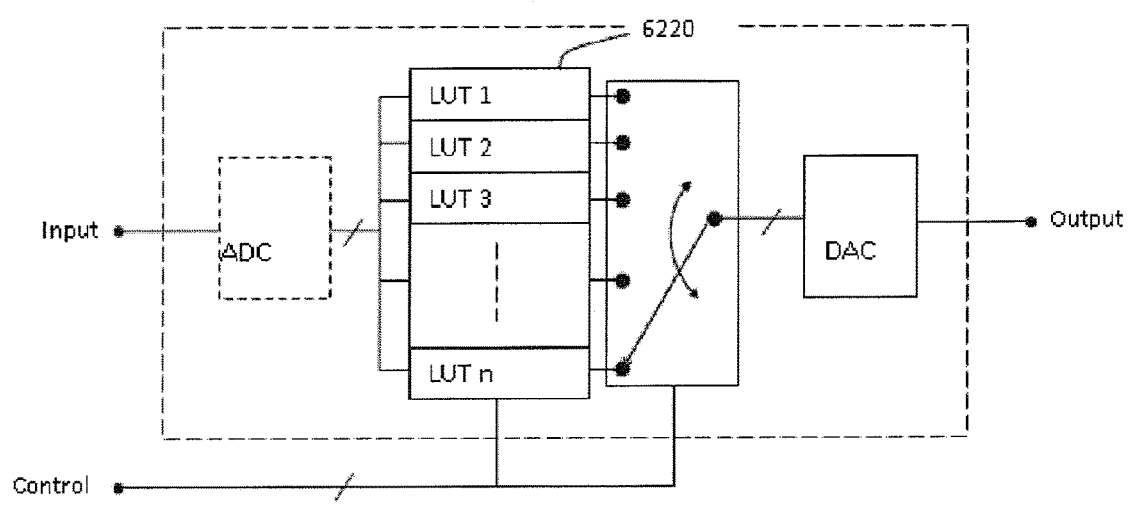
FIG. 71 shows an example embodiment of a waveform generator module wherein one of many lookup tables is selected to generate the output waveform.
Figure 72:
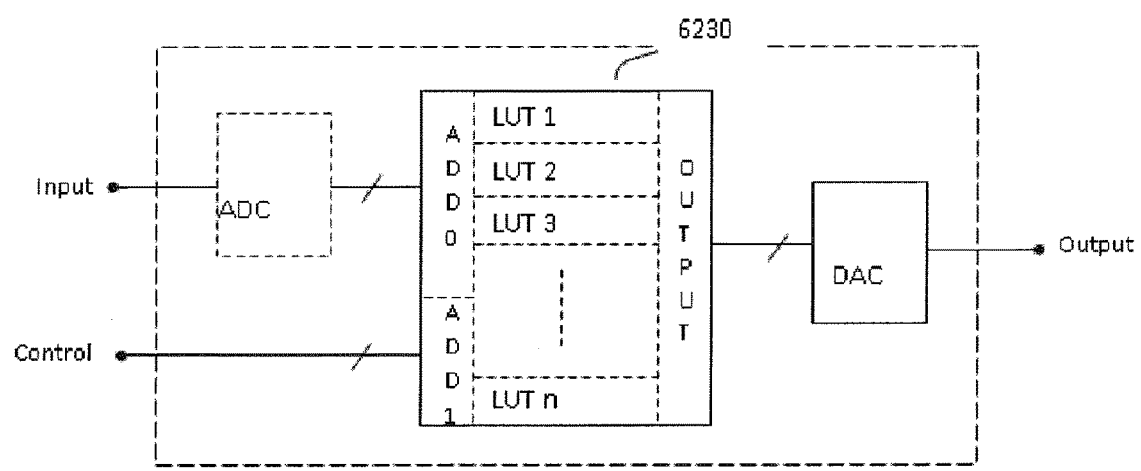
FIG. 72 shows an example embodiment of a waveform generator module wherein a partitioned ROM is used to store the waveform data.
Figure 73:
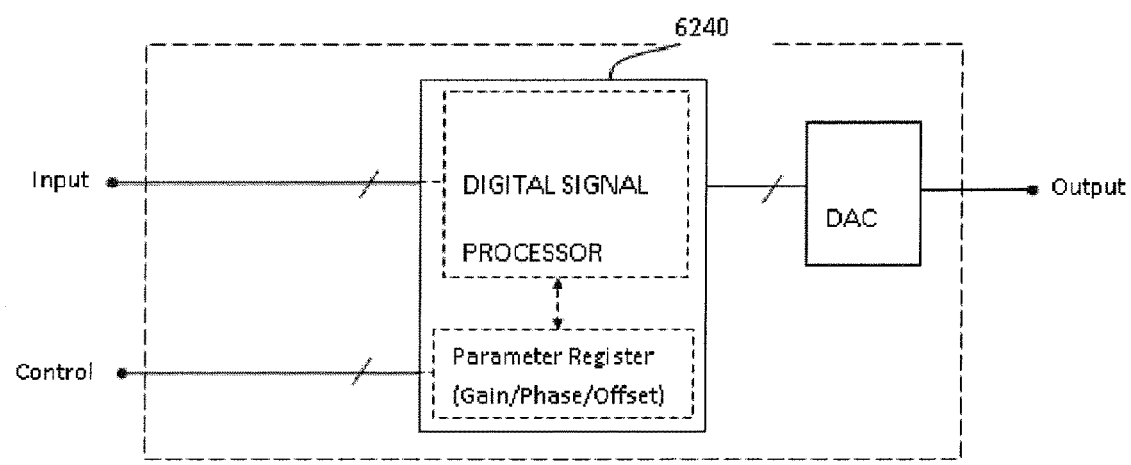
FIG. 73 shows an example embodiment of a waveform generator module using a Digital Signal Processor.

The person skilled in the art will understand that known design techniques are available for implementation of the presented system functions. For example:
   Envelope detection=SQRT($I^2$+$Q^2$) or diode envelope detector.
   Waveform generation=lookup table (FIGS. 71, 72), digital processing using DSP (FIG. 73) or analog processing such as op-amp circuits to adjust gain, DC offsets, etc. . . . .
   Input generation=D/A converter if needed plus buffer amplifiers to present appropriate impedance/drive strength.

The various examples set forth above represent some possible implementations of the envelope tracking method by placing such system functions in newly defined modules (i.e. 730, 740, 780A) and/or in specific functional units. As such, the input/output configurations of said units reflect the chosen implementation. For example, input to the PA unit (750) is modified in order to adapt to each of the configurations of FIGS. 53-55. To allow direct input to each of the gate bias voltages, ladder resistors used in FIG. 1 to provide (combined) gate biasing, is removed as depicted in FIG. 8. On the other hand and as depicted in FIG. 9, to allow incremental corrections to each of the gate bias voltages, input summing resistors were added to the PA. In another example, the transceiver unit (720) in FIG. 53 outputs one set of digital data to the DAC unit (730), whereas the transceiver unit (720) in FIG. 54 has to adapt to the plurality of DAC units within (740) and thus outputs several set of digital data.

Furthermore, a person of ordinary skill will understand that any of such system functions can be implemented within a plurality of functional units given some design modification to said unit. For example, the transceiver can be made to perform envelope detection based on its input data at terminal (710), but so can the PA unit based on the input RFin signal at terminal (105), or the waveform shaping unit (780A) of FIG. 55 based on its input from DAC (730). One can also envision a transceiver unit performing envelope detection and gate/drain generation, or an ETPS performing these same system functions.

This apparent flexibility of mixing and matching system functions within functional units, and adapting I/O's accordingly, is however limited by the choice of good and sound design principles and integration. For example, any integration of waveform generation into the PA is beneficial because monolithic integration means the waveform signals will be matched and the amplitude/phase response will be well controlled. In contrast, splitting the gate and drain waveform generation across multiple ICs and packages introduces potential amplitude, phase and delay issues subject to PCB design and part variation. In another example and as previously mentioned, due to its high current requirement, it is desirable to keep the drain voltage supply generation close to the PA unit and within the ETPS, since latter is designed for high currents and good heat dissipation. This in turn limits the PA input configuration for its drain bias to an analog input, in contrast to a possible digital input for the gates biases, whereby internal D/A conversion units can generate the analog gate bias voltages.

Given the above, Table 1 is a proposed embodiment of design and integration constraints for the system functions. It defines possible functional integrations for each of the system functions.

TABLE 1

|  | Functional Unit | Input Source | I/O Signal Type |
|---|---|---|---|
| Envelope detection | Tx/Rx, ETPS, PA, WS | RFin/Analog Data/Digital data | Analog/Digital |
| Gate waveform generation | Tx/Rx, ETPS, PA, WS | Envelope Detection | Analog/Digital |
| Drain waveform generation | Tx/Rx, ETPS, PA, WS | Envelope detection | Analog/Digital |
| PA Drain input generation | ETPS | Drain waveform generation | Analog/Digital Input Analog Output |
| PA Gate input generation | Tx/Rx, ETPS, PA, WS | Gate waveform generation | Analog/Digital Input Analog Output |

As per Table 1, the following constraints are defined:
Envelope detection can be performed within any of the functional units and corresponding module is required to have one of RFin, Analog input data or Digital input data as input. Its input and output can be in either analog or digital form.
Gate waveform generation can be performed within any of the functional units and corresponding module is required to be connected to the functional unit performing the envelope detection. Input and output signals can be analog or digital.
Drain waveform generation can be performed within any of the functional units and corresponding module is required to be connected to the functional unit performing the envelope detection. Input and output signals can be analog or digital.
PA Drain input generation is required to be performed within ETPS unit which is required to be connected to the Drain waveform generation module. Input signal to corresponding module can be analog or digital, and output signal is analog.
PA Gate input generation can be performed within any of the functional units and corresponding module is required to be connected to the Gate waveform generation module. Input signal to corresponding module can be analog or digital, and output signal is analog.

Figure 56:
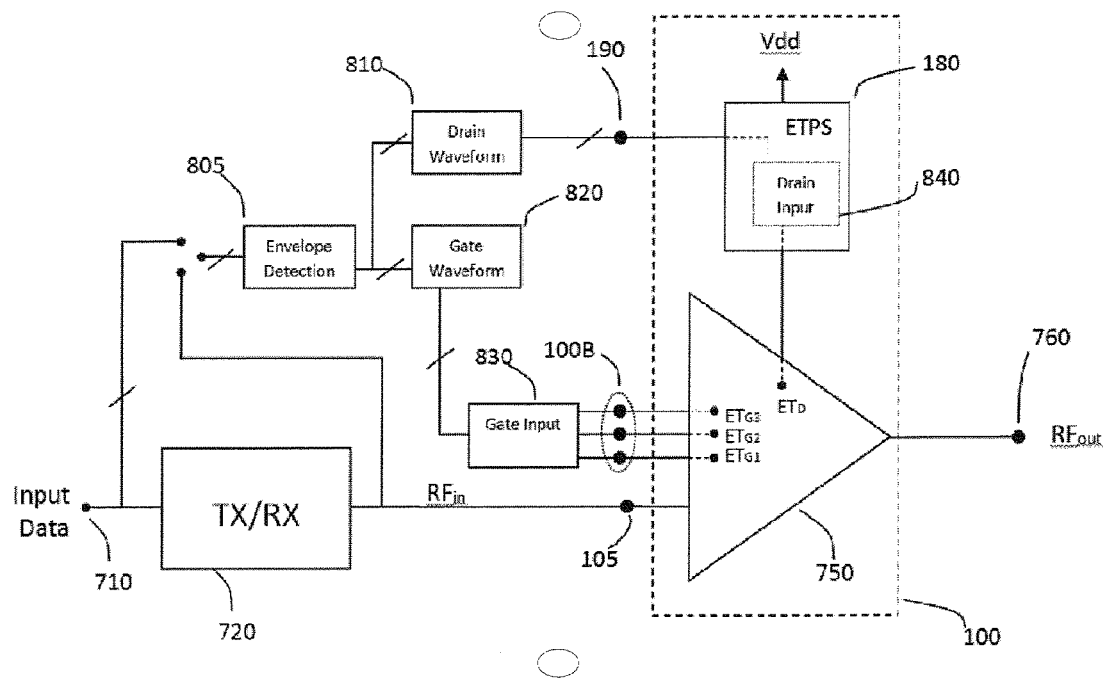
FIG. 56 shows an exemplary embodiment of various control modules of the present disclosure.

FIG. 56 breaks down the controlling elements for the envelope tracking system. Herewith new modules (805, 810, 820, 830, 840) are introduced which implement the system functions previously mentioned and are depicted accounting for restrictions presented in table 1. So for example, as per table 1, the Drain Input generation module (840) is placed within the ETPS unit (180), has a single output signal (uncrossed output line) which feeds the $ET_D$ input of the power amplifier (750) and its input is connected to the Drain Waveform generation module (810) via several signal lines (so could be several digital input signals or single analog input signal).

Modules presented in FIG. 56 are drawn individually and not assigned to any of the functional units at this point. Exception to this being the Drain Input generation module (840) which is integrated within ETPS unit (840) as per table 1. Furthermore, the ETPS can be subdivided into an analog control part, a DC-DC and an analog amplifier or error amplifier. These pieces can be broken apart and combined with various blocks as well.

In FIG. 56 the envelope detection module (805) takes its input from either the Input Data at input terminal (710) which feeds the transceiver unit (720), or the modulated analog RFin signal generated by the transceiver unit and fed to the input terminal (105) of the amplifier unit (750). Therefore the envelope detection module (805) may have one (analog RFin) or several (Input Data) signal lines at its input port. In turn the envelope detection module (805) provides an analog or digital representation of the envelope signal to the Drain Waveform (810) and Gate Waveform (820) generation modules, so again, these modules may have one analog or several digital input signal lines. The Drain Waveform generation module (810) in turn feeds the Drain Input generation module (840), placed within the ETPS unit (180), via input terminal (190). Finally Drain Input generation module (840) feeds the drain of the amplifier (750) at node $ET_D$ through inductor (170) with an analog voltage. Concurrently and in a similar fashion, biasing analog voltages for gates to $ET_{G1}$, $ET_{G2}$ and $ET_{G3}$ are generated within Gate Input module (830) and routed to amplifier (750) via input terminal (100b). It should be noted that the usage of the term "gate input" should not be seen as a limitation of the present embodiment, or other embodiments of this disclosure, to only FET devices, as the skilled person will know how to apply these teachings to other type of devices (e.g. replace "gate input" with "base input" for the case of a bipolar device configuration).

FIG. 56 therefore represents the envelope tracking system, which include the functional units; transceiver (720), ETPS (180) and amplifier (750), and the enabling system functions each represented by a dedicated system module wherein the circuitry to generate the specific function resides. Any of the FIGS. 53-55 can be represented using these system modules and functional units, wherein as previously mentioned, Input/Output configuration of each module is tailored to the specific configuration.

Figure 57:
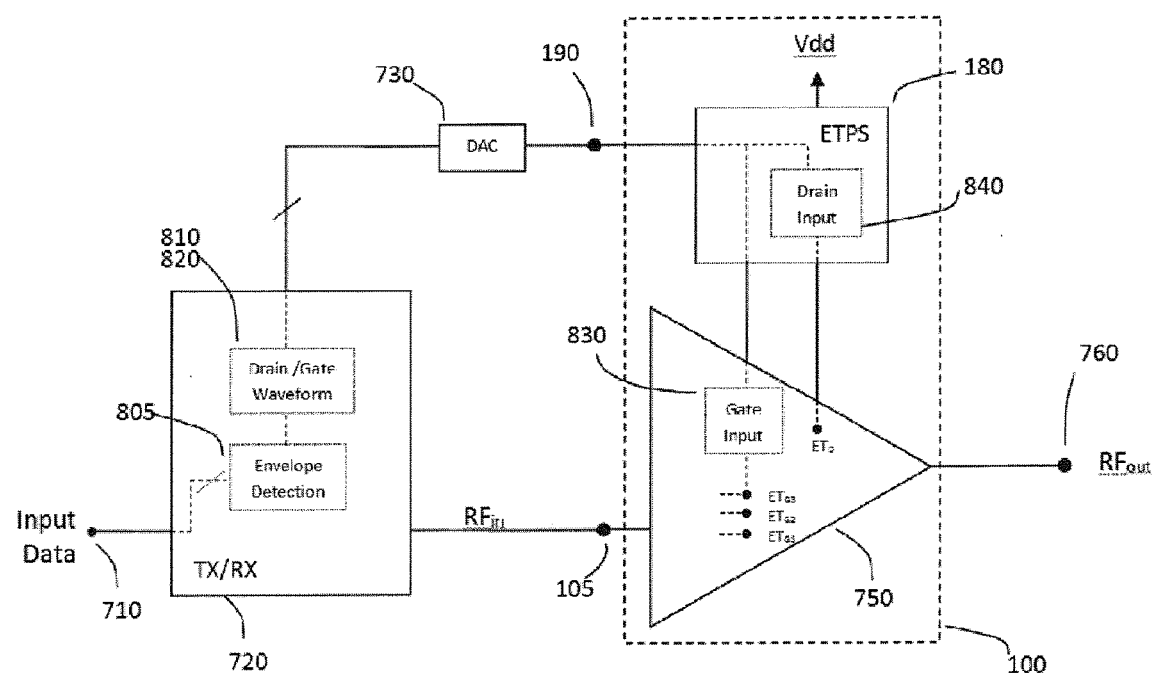
FIG. 57 is a representation of embodiment of FIG. 53 highlighting the various system functions.
Figure 60:
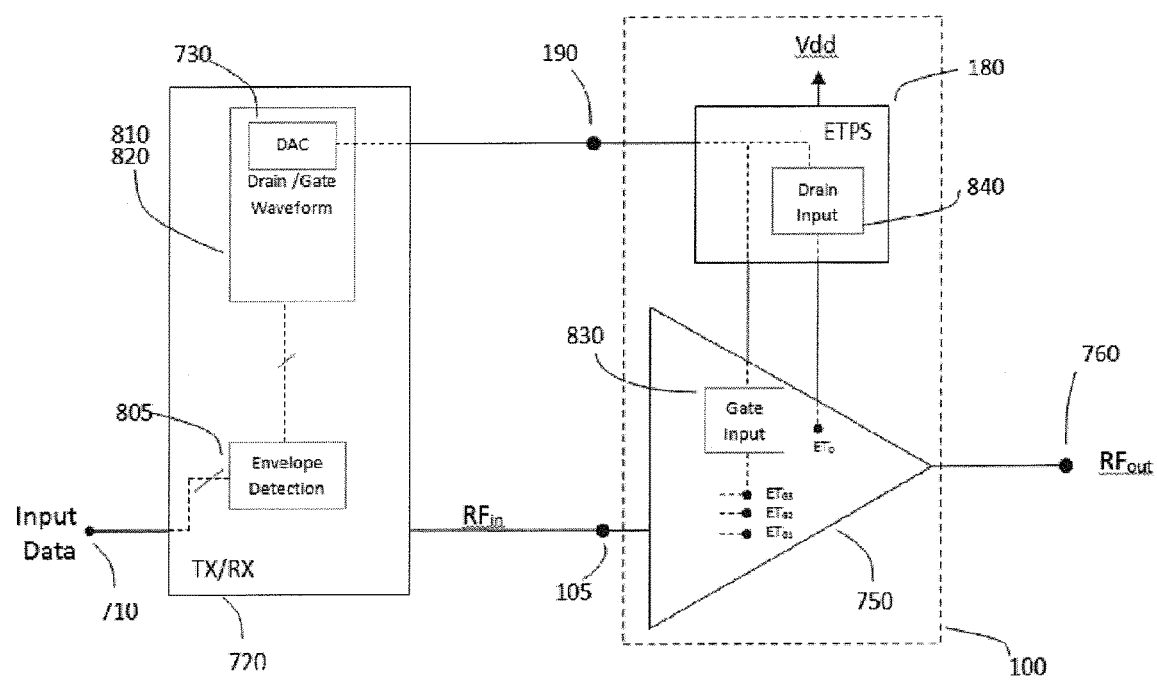
FIGS. 60-61 show equivalent system representations according to embodiment of FIGS. 53 and 57.
Figure 61:
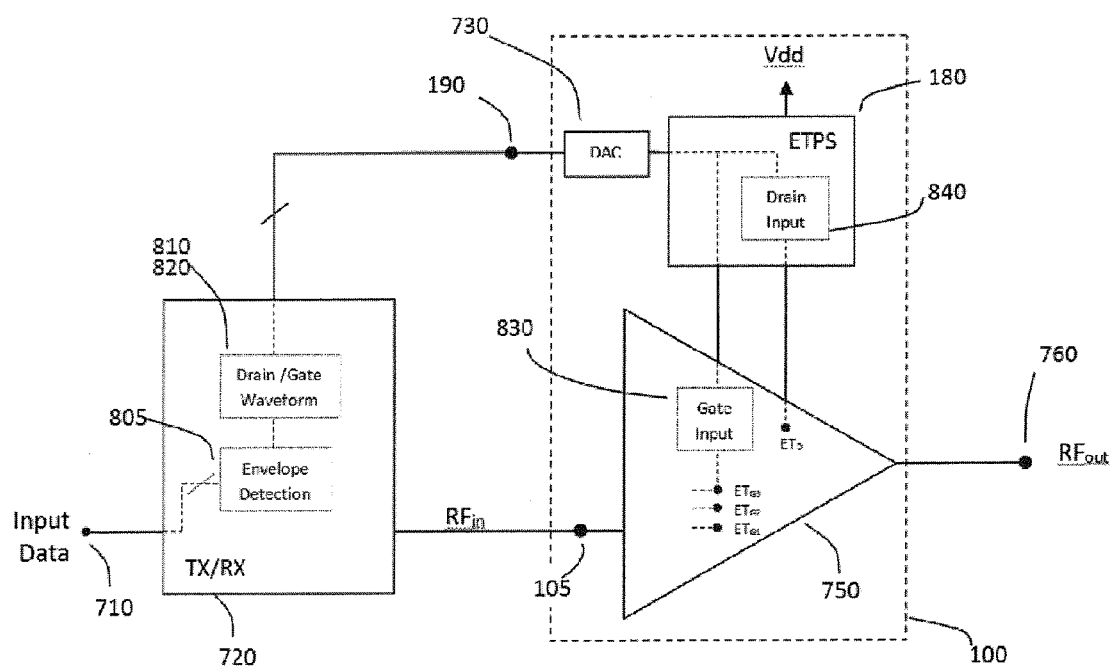
Figure 62:
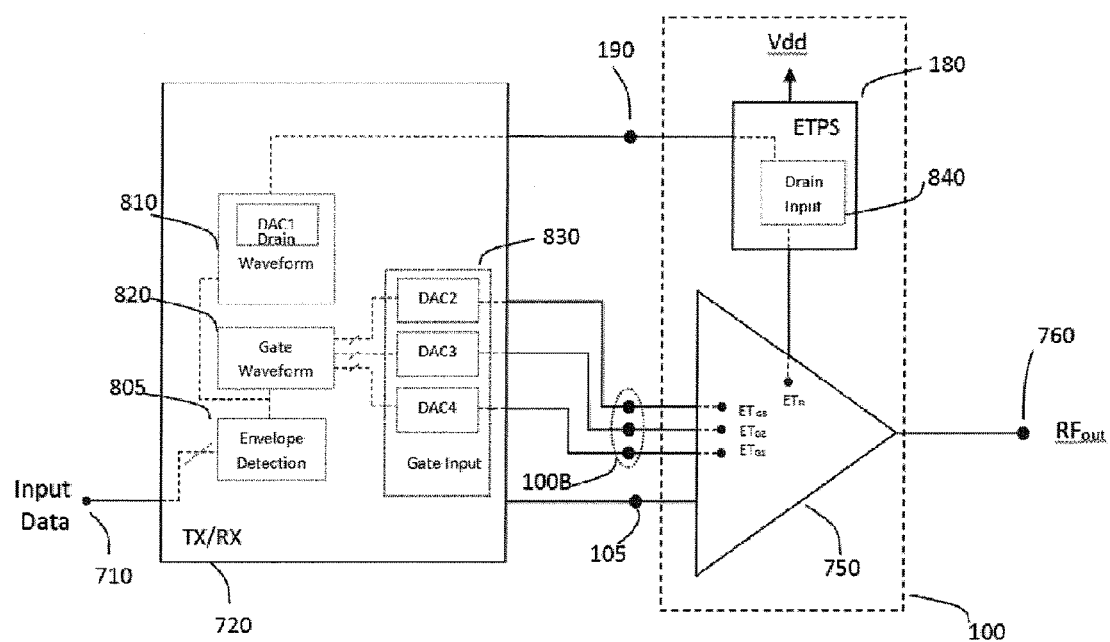
FIGS. 62-64 show equivalent system representations according to embodiment of FIGS. 54 and 58.

For example, FIG. 57 is a representation of embodiment of FIG. 53 highlighting the system functions. The envelope detection module (805) and the Drain/Gate Waveform generation modules (810, 820) reside within the transceiver unit (720), and Drain/Gate Input generation modules (840, 830) reside within ETPS (180) and amplifier (750) respectively. Internal amplifier (750) configuration is as depicted by FIG. 1, wherein gate biases are derived via single input voltage from Gate Input generator (830) fed to a ladder network comprised of resistors (130, 140, 175). DAC unit (730) is used to translate digital envelope data from Drain/Gate waveform generator module into analog form prior to feeding to the Drain/Gate input generator modules residing within ETPS unit (180) and amplifier (750). To be noted that in this embodiment, a single waveform is generated for both drain and gate control, thereby reducing Drain/Gate waveform generation to a single module. Input to the envelope detection (805) is the Input Data at input terminal (710), but could also be the RFin signal generated within the transceiver unit (720). A person of ordinary skill in the art will understand that FIG. 60 embodies the same envelope tracking method as depicted by FIG. 53 and thus FIG. 57. In FIG. 60 functionality of the DAC unit (730) is moved to the transceiver unit (720) and merged with the Drain/Gate generation module becoming the output stage of the module. Therefore FIG. 60 represents same embodiment as depicted in FIG. 53 but using the defined functional units and modules while maintaining overall system functionality. Alternatively, the DAC unit (730) may be placed within ETPS (180) or within the envelope tracking unit (100), as depicted in FIG. 61, in which case the input terminal (190) is modified to adapt to the multiple input signals required to interface with the DAC unit (730).

Figure 58:
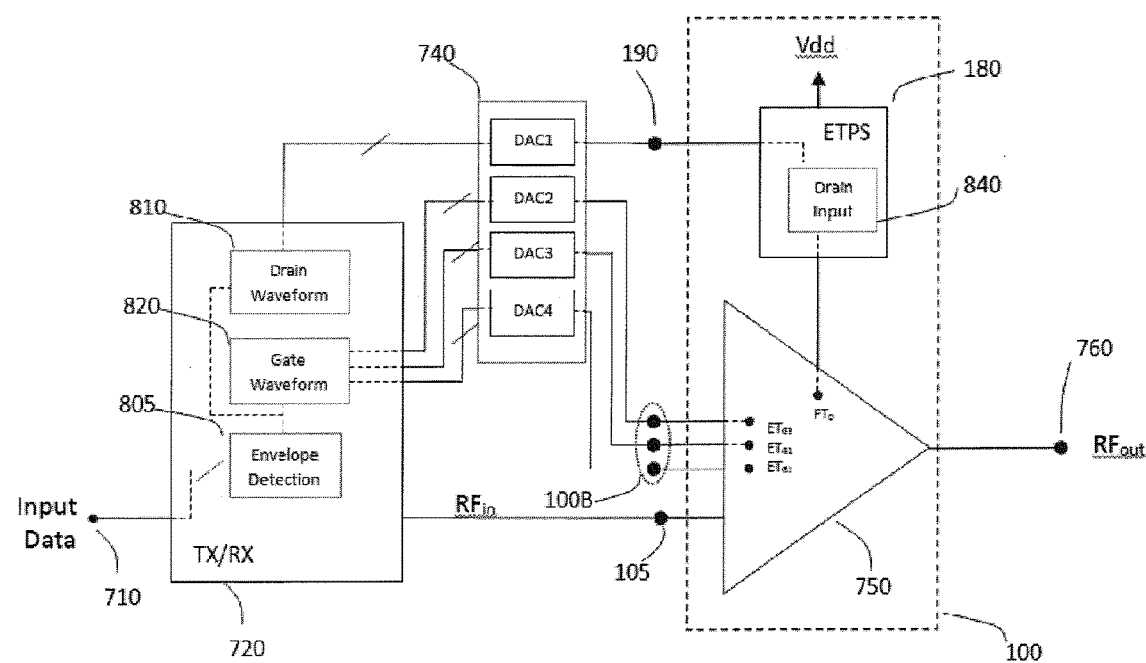
FIG. 58 is a representation of embodiment of FIG. 54 highlighting the various system functions.
Figure 63:
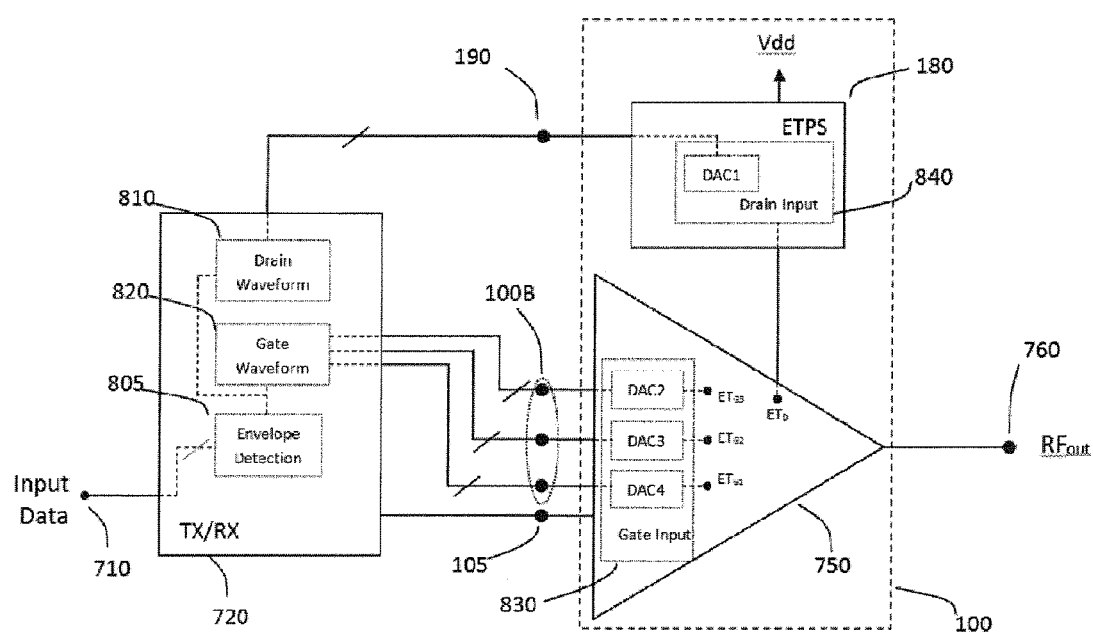
Figure 64:
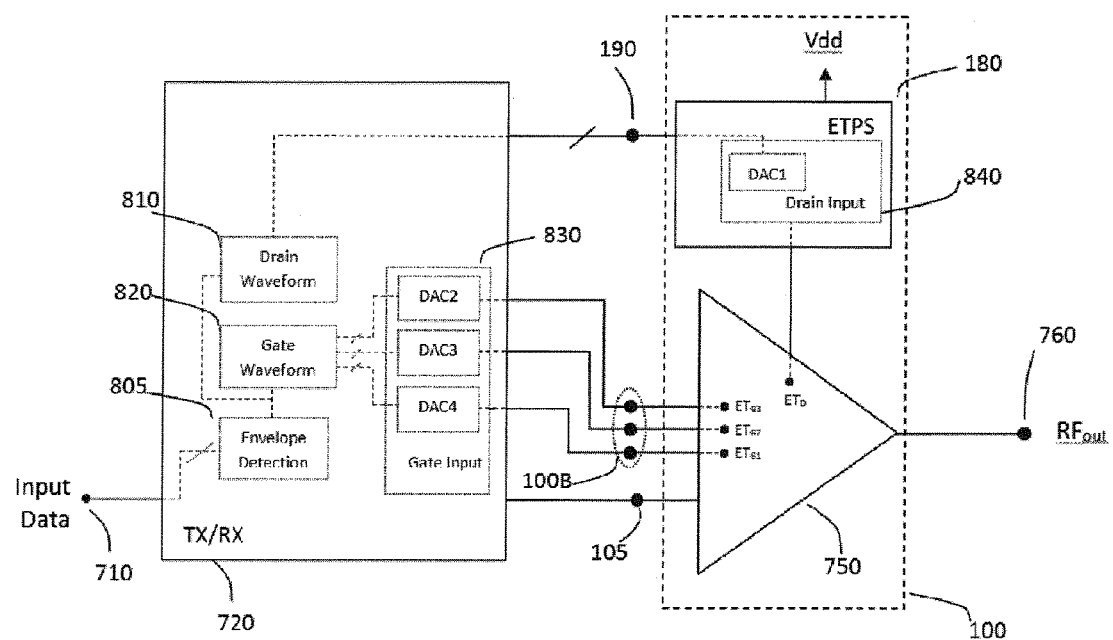

Equivalently, FIG. 58 represents same embodiment as FIG. 54 wherein the system functions are highlighted. Drain/Gate Waveform generation is performed within transceiver unit (720), but in this case using two distinct system modules, one dedicated to the Drain Waveform generation (810) outputting a single digital data set to DAC1, and the other dedicated to the Gate Waveforms generation (820) outputting different digital data sets to each of the dedicated gate DACs (DAC2-4). In this embodiment Drain Input generation (840) remains within ETPS unit (180) whereas the task of Gate Input generation is performed by DAC2-4, which through input terminal (100b) respectively feed biasing gates voltages to $ET_{G1}$, $ET_{G2}$ and $ET_{G3}$. Going one step further, FIG. 62 represents again same embodiment as FIG. 54 using only the functional units and modules. This is done by repartitioning functionality within module (740) into system modules and then mapping these into functional units. As such, DAC1 becomes the output stage of Drain Waveform generation module (810) which is moved within transceiver unit (720) and DAC2-4 become the Gate Input generation module placed within the transceiver. In this implementation all envelope tracking related control signals between transceiver unit (720) and envelope tracking amplifier (100) are in analog form. On the other hand and as depicted by FIG. 63, by shifting module (740) functionality entirely within ETPS (180) and amplifier (750), tracking related control signals between the same two units become all digital. Finally (740) functionality can be split between transceiver unit (720) and ETPS (180) as depicted in FIG. 64 to obtain a hybrid configuration whereby a mix of analog and digital tracking related control signals exist between transceiver unit (720) and envelope tracking amplifier (100). Of course for each of these cases, I/O configuration for the functional units adapt to the required interface type.

Figure 59:
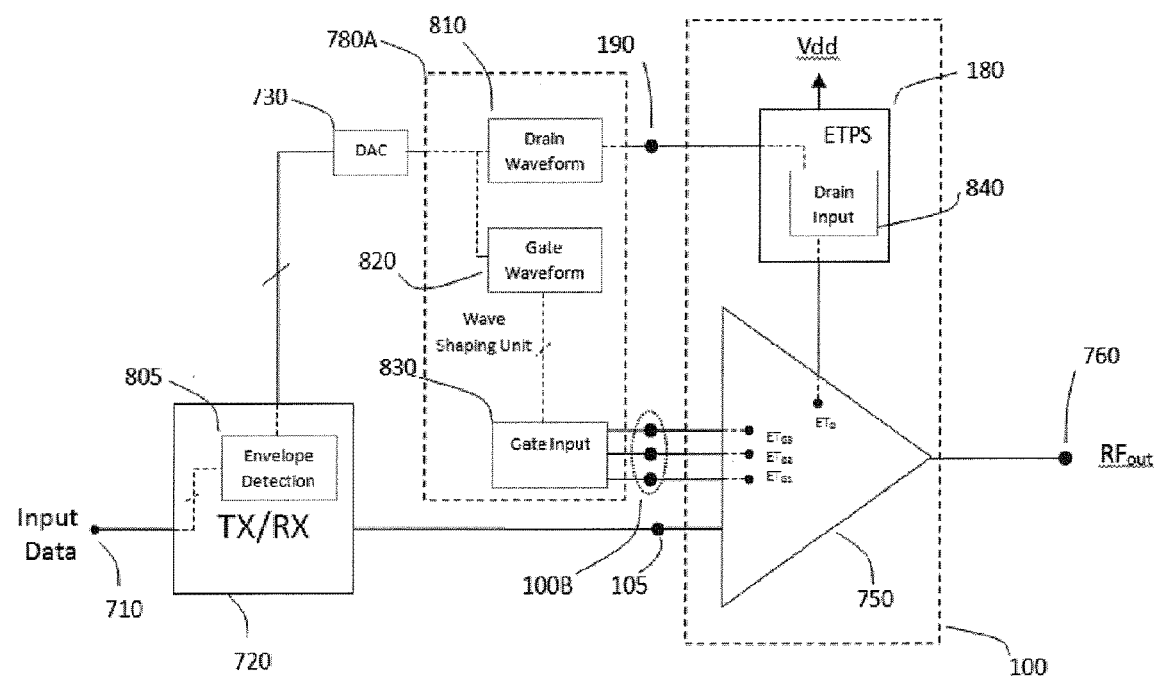
FIG. 59 is a representation of embodiment of FIG. 55 highlighting the various system functions.
Figure 65:
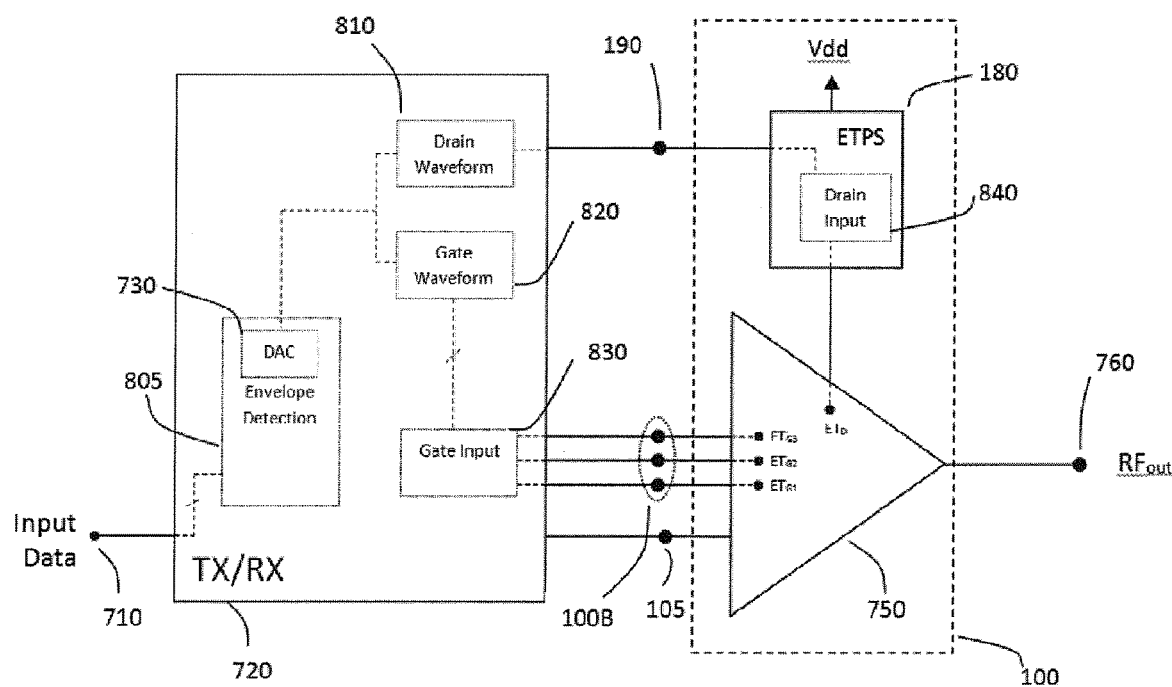
FIGS. 65-67 show equivalent system representations according to embodiment of FIGS. 55 and 59.
Figure 66:
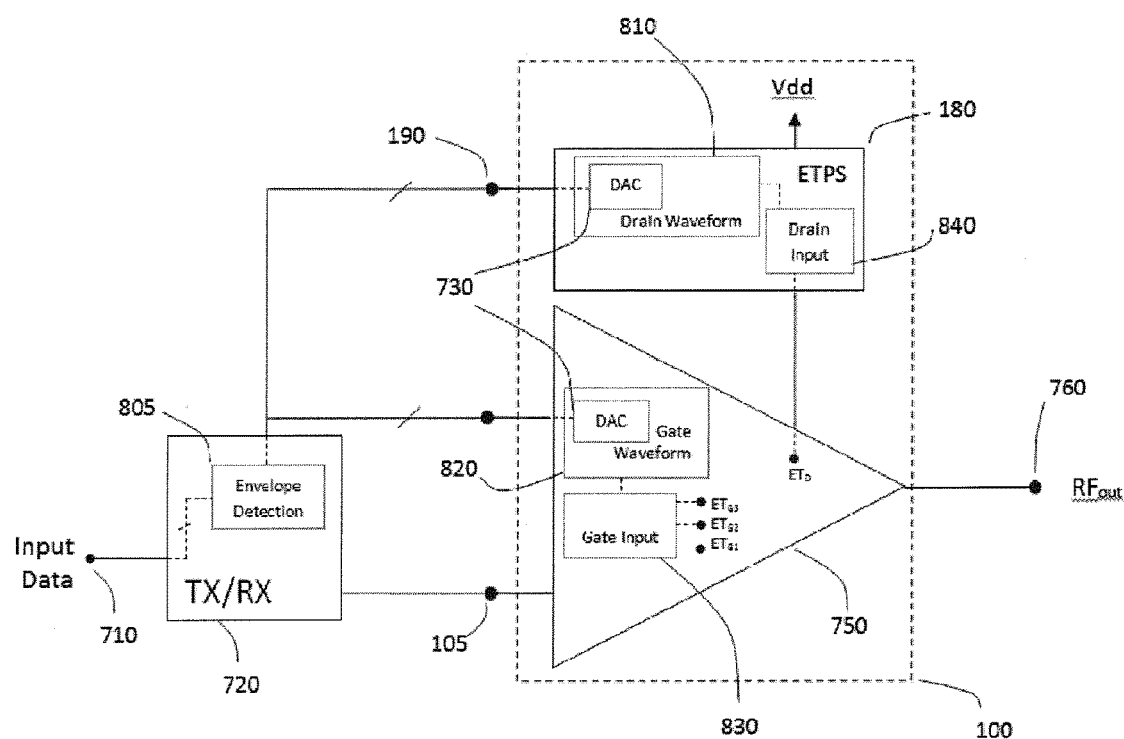
Figure 67:
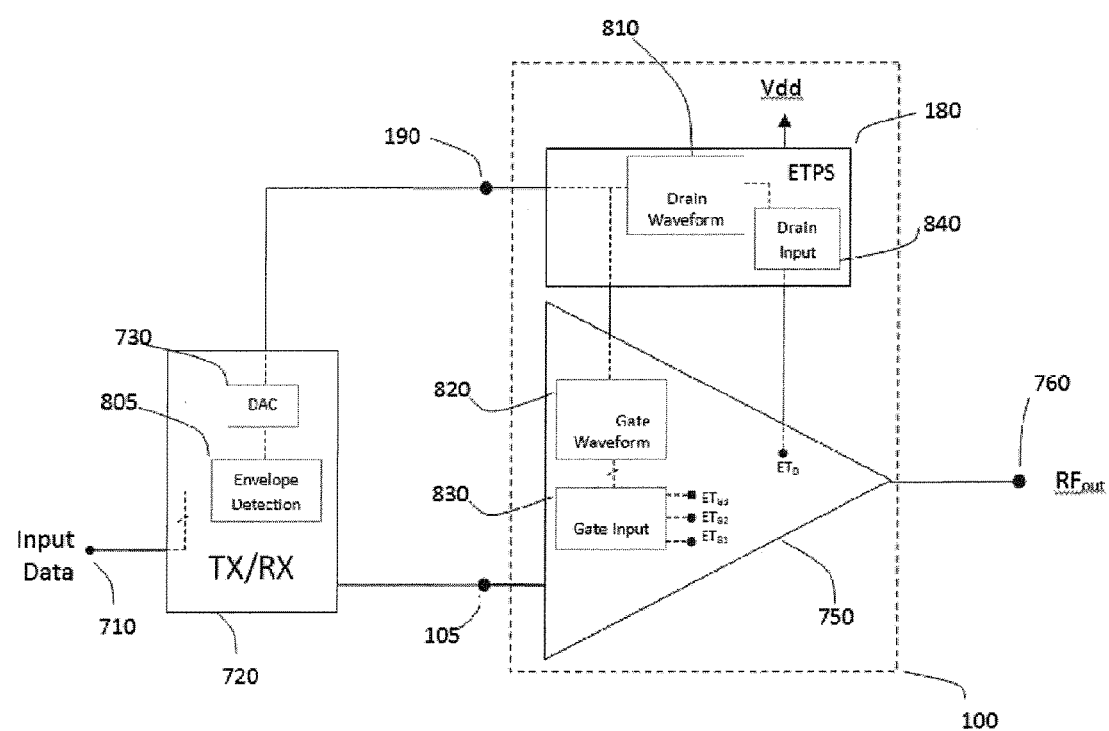

System functions of embodiment presented in FIG. 55 are highlighted in FIG. 59. Wave Shaping unit (780A) contains Drain and Gate Waveform generation modules (810, 820) which have a common input from DAC unit (730), as well as the Gate Input generation module (830) which feeds the gate bias voltages via input terminal (100b) to $ET_{G1}$, $ET_{G2}$ and $ET_{G3}$. Drain Waveform generation module (810) feeds via input terminal (190) the gate control signal to the Drain Input module (840) within ETPS (180). This configuration can be further reduced to contain only functional units by mapping functionalities within the Wave Shaping unit (780A) and the DAC unit (730) into the functional units. As seen in prior examples, this can be performed in various ways, all yielding to same overall system functionality and each imposing some type of I/O interface adaption for each functional unit. By mapping all said functionalities into the transceiver unit (720), the system configuration of FIG. 65 is obtained, wherein envelope tracking controls from transceiver (720) to envelope tracking amplifier (100) are in analog form. By mapping all said functionalities into the envelope tracking amplifier (100), then the controls are in digital form as depicted by FIG. 66. Finally, by partitioning said functionalities and mapping into both the transceiver unit (720) and the envelope tracking amplifier (100), then system configuration of FIG. 67 is obtained, wherein a single analog control line is transmitted from the transceiver unit (720) and the envelope tracking amplifier (100).

As a summary, in the previous paragraphs, various system level embodiments for controls and methods implementation of the envelope tracking amplifier using some functional units; the transceiver unit (720), the ETPS unit (180) and the amplifier unit (750), surrounded by some external enabling modules (730, 740, 780A) were presented. Subsequently a set of enabling system functions required to generate the presented embodiments as well as associated design constraints were defined which together allowed to define a generic system configuration for the envelope tracking method and controls thereof (FIG. 56). Latter configuration was used to create specific configurations reflecting each of the embodiments presented in the first section using only functional units and system modules. In the course of this exercise it was demonstrated that for a given proposed embodiment, several such configurations exist and presented some, but not all, as these are well within the reach of the person skilled in the art. Although at the system level these configurations are equivalent, in practice each may pose different issues as far as manufacturing, performance and reliability of the finished product. These issues are of course outside the scope of the present disclosure and as such shall not be discussed herewith in too much detail.

Figure 68:
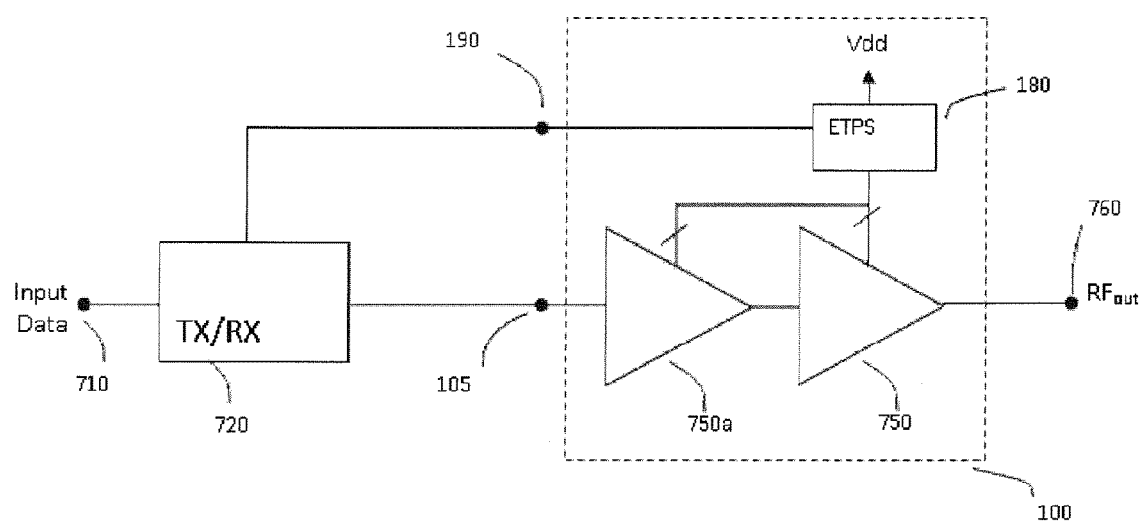
FIG. 68 shows an example embodiment according to the present disclosure of a driver ET amplifier feeding the final ET amplifier, wherein a single output form an ETPS unit provides the supply to both ET amplifiers.

FIG. 68 shows a practical implementation of the current embodiment wherein a driver ET amplifier (750a) is used to drive the final stage (750). In this embodiment a single ETPS (180) feeds biasing supplies (e.g. drains and gates) to both amplifiers. In this configuration both amplifiers may be of types depicted in FIGS. 8 and 9, with system configuration for each of the ET amplifiers further depicted by FIG. 60. The person skilled in the art will notice limitation associated with the configuration of FIG. 68, wherein by virtue of a shared supply connection to both amplifiers, RF interference/coupling may arise between the two amplifiers, thus degrading overall system performance (e.g. ACLR, linearity, efficiency), as well as possibly induce oscillation. This shortcoming is addressed in FIG. 69, wherein according to the presented embodiment, the ETPS (180) is modified to comprise two decoupled and isolated output supplies, each dedicated to one of the ET amplifiers.

It should be noted that in the case of an ET implementation, traditional filtering of the supply input to the amplifier via a large bypass capacitor to reduce feedback between the various amplification stages, and thus possible oscillation, is not possible, since such a capacitor would distort the supply envelope modulation and thus the RF output, as well as reduce any efficiency improvement obtainable from the ET design. FIG. 69A shows one possible embodiment for decoupling the two outputs of the ETPS (as discussed in the prior paragraph), thus minimizing said performance issues and possible oscillation. The filter (755) is designed to pass DC and the envelope modulation frequency and stop higher frequencies which can cause the combination of driver and final stage to oscillate. The filter components L1 and C1 break the oscillation loop while allowing ET to function. Given the teachings of this embodiment, the skilled person will find other possible filtering implementations, not necessarily reduced to the filter as depicted by FIG. 69A, which thus should not be considered a design limitation.

Figure 69:
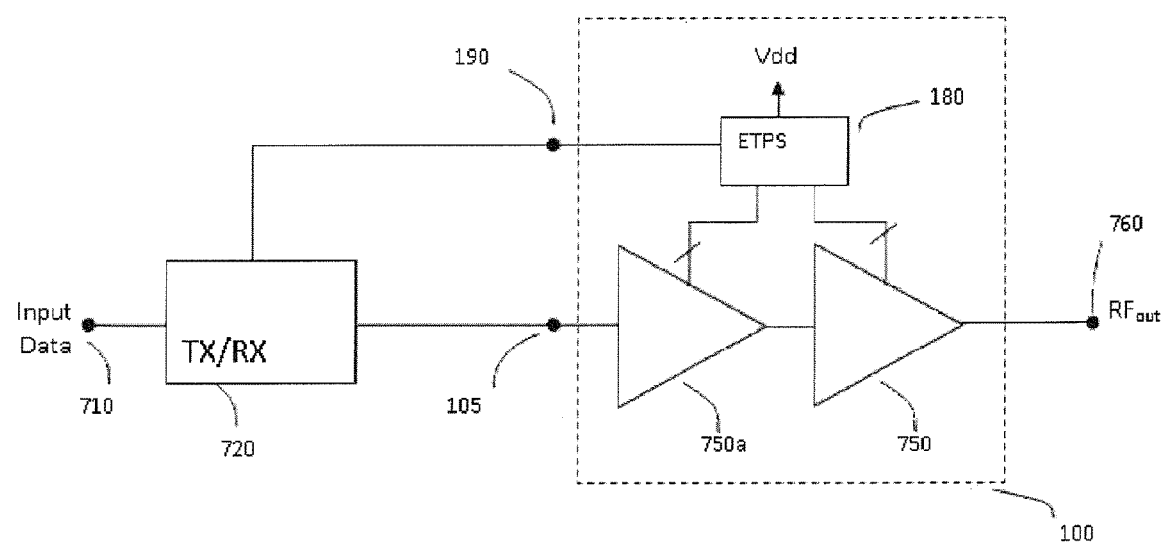
FIG. 69 shows an example embodiment according to the present disclosure of a driver ET driver ET amplifier feeding the final ET amplifier, wherein two decoupled outputs from a single ETPS unit are used to each provide the supply to each ET amplifier.
Figure 69A:
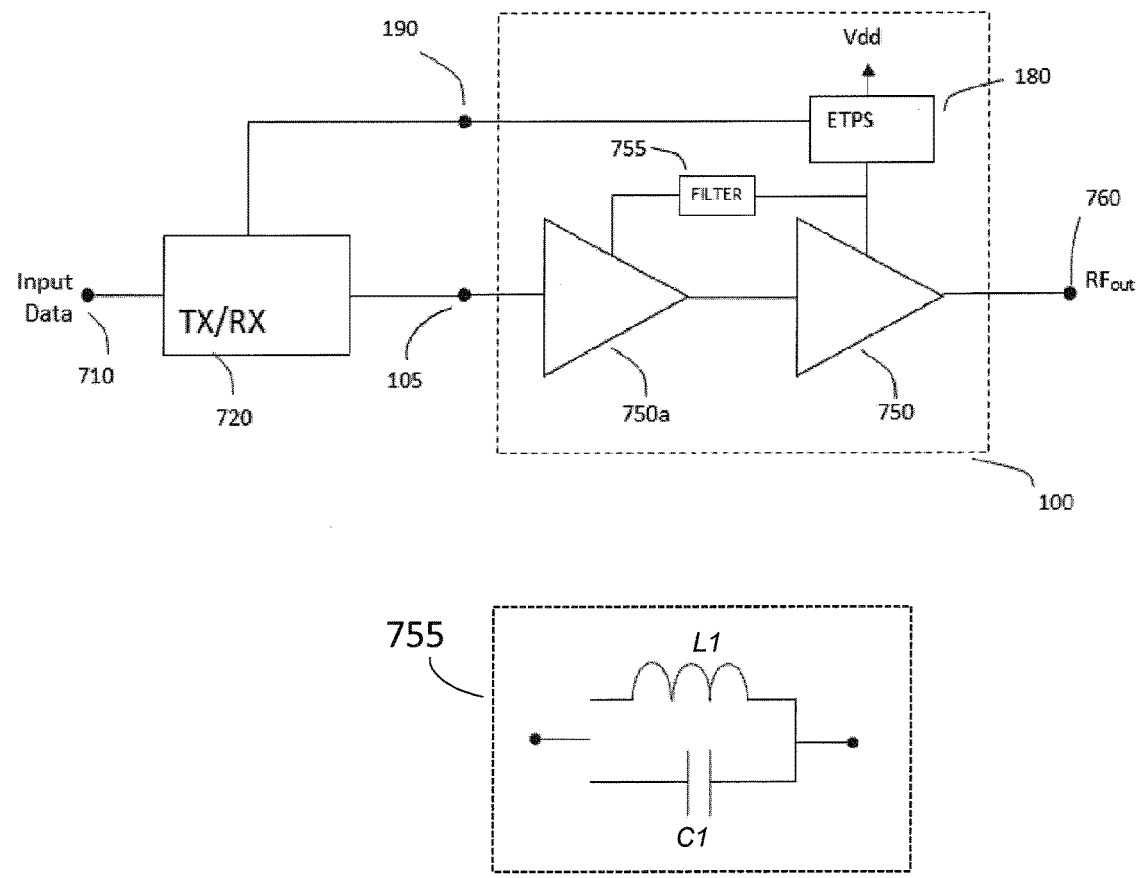
FIG. 69A shows an example embodiment according to the present disclosure of an amplifier configuration adapted to pass DC and the envelope modulation frequency components of the ETPS output and stop higher frequency components of the ETPS output susceptible to put the combination of a driver ET amplifier and a final ET amplifier into oscillation.

The person skilled in the art will now notice that the embodiments presented in FIGS. 68 and 69 provide a single control to the ETPS (180), thus limits the flexibility to independently control operation of each ET amplifier (750, 750a). This shortcoming is addressed in FIG. 70, wherein according to the presented embodiment two dedicated and independent ETPS (180, 180a) are used to each supply ET amplifiers (750, 750a) respectively. By virtue of their independent controls provided at (190, 190a), each ETPS can be independently controlled and thus independently affect operation of the corresponding ET amplifier for better overall system performance. Although these embodiments presented in conjunction of an ET pair (driver/final) have used a base system configuration depicted by FIG. 60, the person skilled in the art will know how to use other system embodiments disclosed herewith for the case where two or more cascaded amplifiers are used. FIG. 70A is one example embodiment of the embodiment presented in FIG. 70, where amplifiers (750, 750a) are shown in detail.

Figure 70:
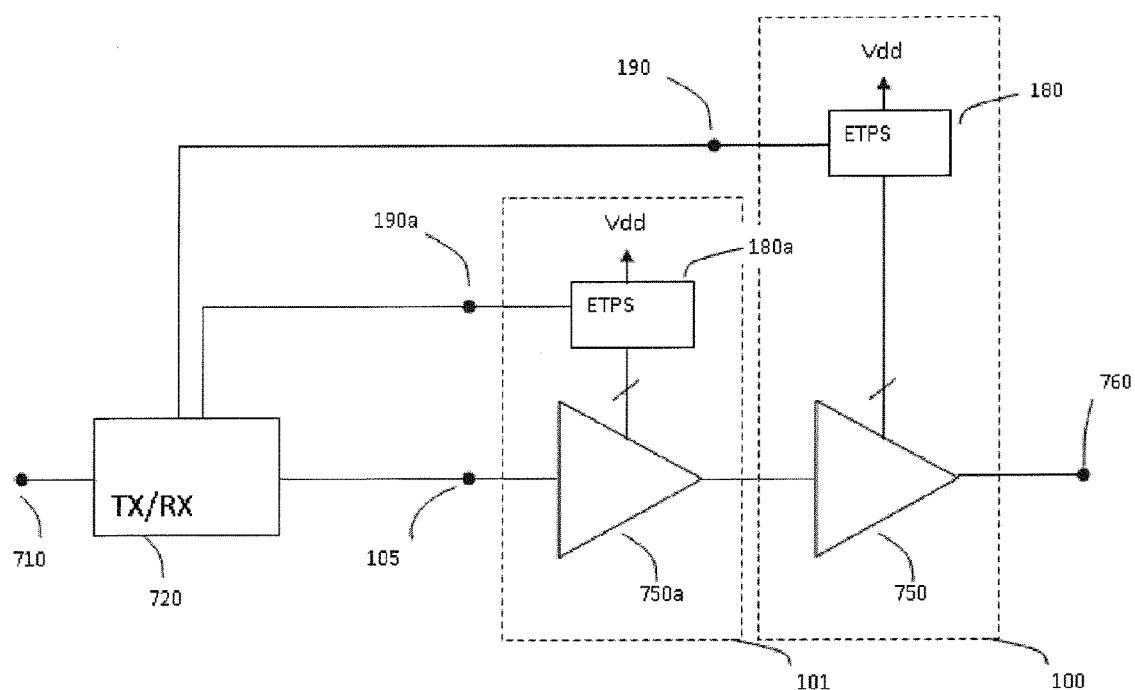
FIG. 70 shows an example embodiment according to the present disclosure of a driver ET amplifier feeding the final ET amplifier, wherein the supply to each ET amplifier is provided via a dedicated ETPS unit.
Figure 70A:
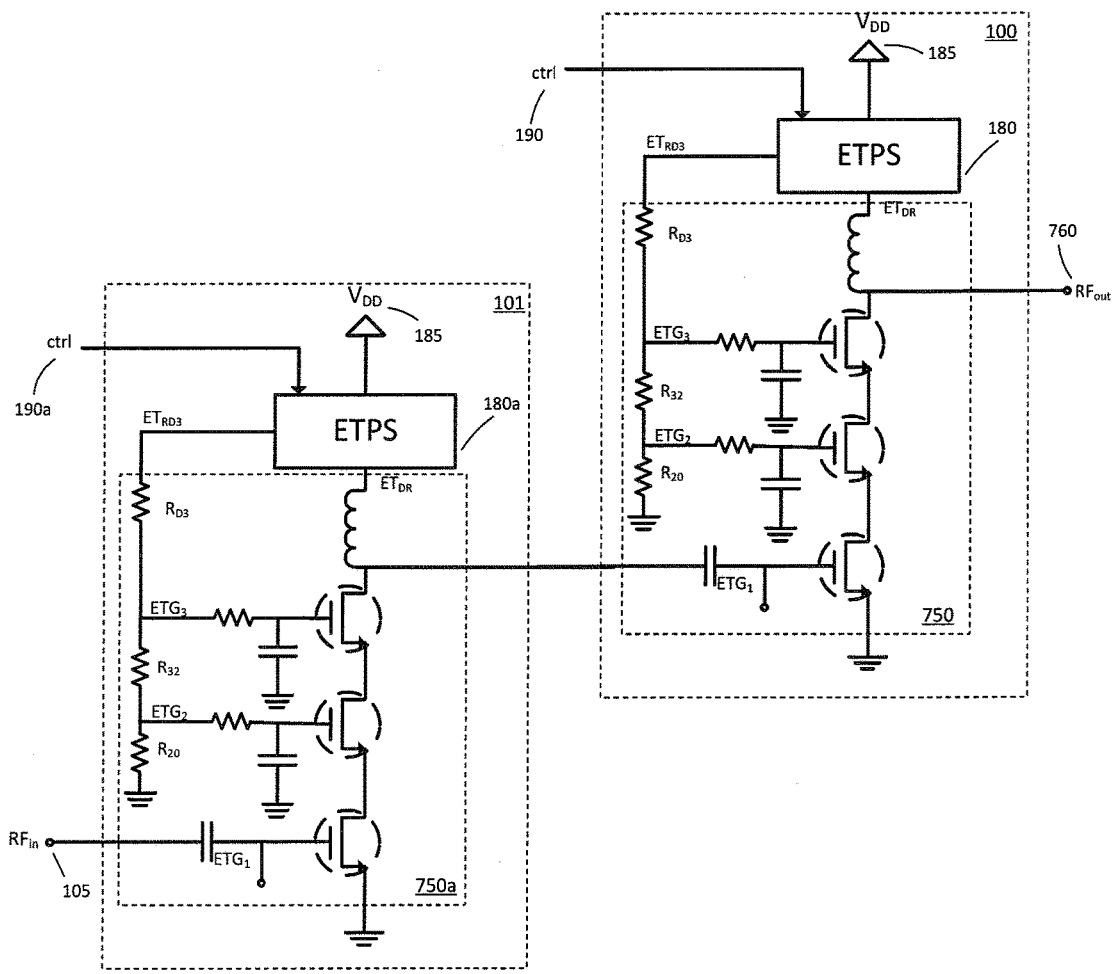
FIG. 70A is an equivalent representation of the embodiment of FIG. 70, wherein each amplifier is depicted in more details.
Figure 70B:
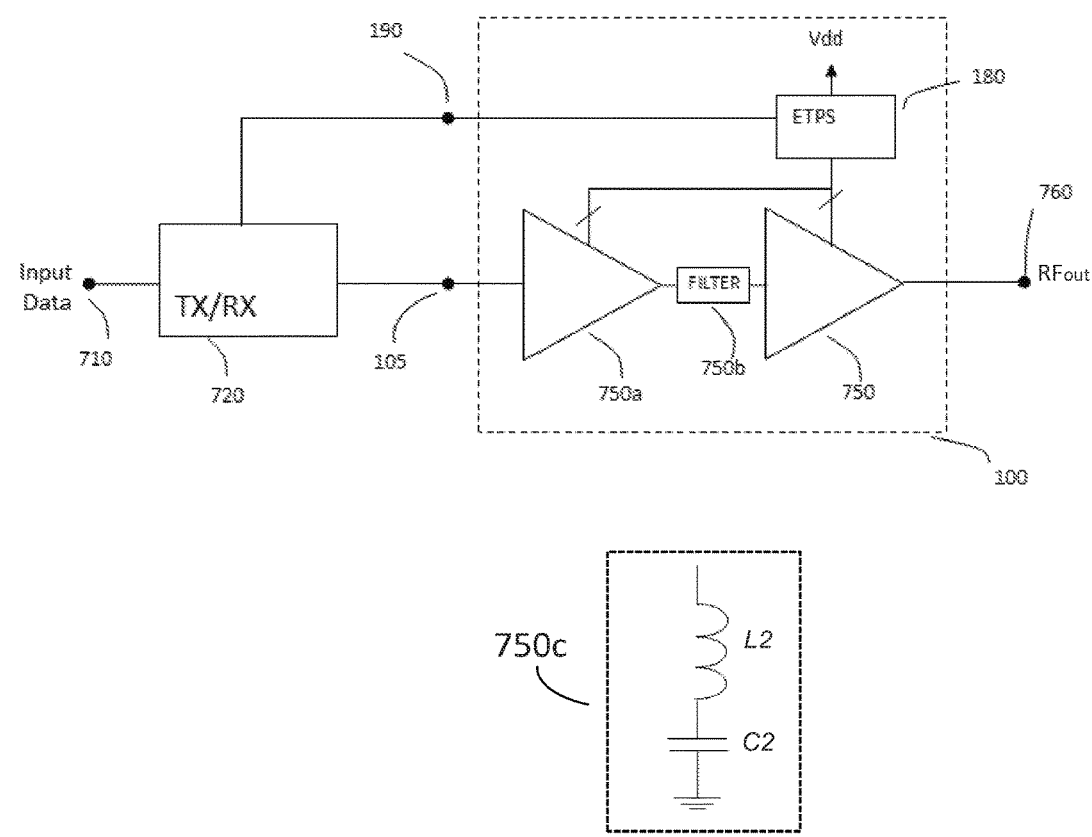
FIG. 70B shows an example embodiment according to the present disclosure of a an amplifier configuration adapted to remove undesirable coupling between the various gain stages.

Embodiments as depicted by FIGS. 68-70 can provide undesirable coupling issues between the two amplification stages (driver, final). Specifically, when the envelope modulation signal of the driver amplifier supply (generated by ETPS (180)) is coupled to the input of the final stage amplifier (750), distortion of the output RF signal can be observed. Traditional circuit layout techniques such as physical separation of components and electrical isolation via ground shielding may not suffice to reduce the unwanted coupling, as the unwanted signal may be coupled via the conduction coupling path between the output of the drive and the input of the final amplifier which conducts the RF signal (conduction path between output of (750a) and input of (750)). As per further embodiment of the present disclosure and as depicted by FIG. 70B, such unwanted coupling within the said conduction coupling is reduced by adding a frequency selective filter (750b) within the conduction coupling path that will remove the envelope modulation signal, and thus reduce distortion of the output RF signal. It should be noted that such a technique is possible since the (lower frequency) envelope signal spectrum resides outside the RF signal spectrum. In an alternative embodiment, the frequency selective filter (750b) may be replaced by the notch filter (750c), specifically designed to notch out the envelope modulation signal present in the conduction path.

As described earlier, close proximity of the ETPS unit to the amplifier unit is desirable, such as to reduce any phase/amplitude degradation of the envelope supply to the amplifier unit, as the supply directly affects the output of the amplifier. As such, monolithic integration of these two units, using for example Silicon on Insulator technology, which allows for high transistor stacks (e.g. 3, 4 or greater) and higher breakdown voltages, is disclosed. This integration also allows for better stability when feedback is used around the amplifier as all the components affecting the output may be integrated.

FIG. 74 shows a system configuration according to the present disclosure wherein various optimization modules are embedded within the amplifier unit (100). Although the amplifier unit is depicted containing a single ET amplifier, as discussed earlier, several cascaded amplifiers with or without dedicated ETPS may also be used. Furthermore, ETPS and ET amplifiers may be monolithically integrated (e.g. Silicon on Insulator) for better overall performance. The integration would allow easier interfacing of numerous dynamically biased nodes, far more than if the components were not integrated due to the large number of I/O. For example, a 2-stage amplifier (e.g. driver and final) that contains a stack of 3 devices could have 6 different gate voltages plus 2 different drain voltages to generate and interconnect. Routing of these 8 signals would be difficult without integration. Integration also greatly benefits the integrity of these interface signals. Keeping the signals on chip preserves the interface conditions and minimizes parasitic effects that can load down the signal, shift the phase of the signal, and introduce cross-talk or signal isolation concerns.

The presented optimization modules may be used in different context and for optimizing different parameters at different stages of operation. For example, the temperature detector module (920), may be used during amplifier transmission and provide feedback to main controller of operating temperature, which may prompt the controller to modify controls (supplies or other amplifier configuration related) to the amplifier. Such controls may cause for example selection of different waveforms for the ETPS unit to shift biasing or supply of the amplifier in a manner to maintain a specific response characteristic (e.g. ACLR, linearity, efficiency, power output, etc. . . . ). If lookup tables are used in the waveform generation module, controls may result in selection of a different lookup table in response to a temperature shift detected by the temperature detection module. In other cases, controls may prompt injection of a compensation error component (e.g. offset, gain) into the waveform generation module. Other parameters can be monitored and used to drive the configuration and control loop. Examples include detecting threshold voltages of devices in the PA IC or ETPS or other related circuits, detecting voltage and current levels, input or output power, and the status/health of circuits and devices. Monitoring information such as this can be used to drive a configuration setting (slow changes, for example at power up) or in a real-time closed loop system.

Another optimization module, the Non-Volatile RAM module (910), may be used in different manners. For example during the manufacturing stage of the amplifier unit (100), module (910) may be programmed to contain characteristic data specific to the amplifier unit, not only vis-à-vis biasing and supply variation, but also with respect to temperature and other parameters. In turn, during final integration of the amplifier unit into a target device (e.g. cellular phone), NV-RAM content is used to expedite calibration, testing and troubleshooting of the target device. Availability of data within module (910) not only expedites calibration/testing/troubleshooting of the target device, possibly allowing bypass of certain steps required in the absence of the data provided by the NV-RAM, but also guarantees that the final device is "optimized" for operation with respect to the specific amplifier unit, thus rendering issues associated with batch to batch manufacturing variability moot. During operation of the device, the NV-RAM content can also be used to provide correction factors based on operating conditions (e.g. temperature and other). The person skilled in the art will understand the flexibility of providing such a programmed NV-RAM coupled with a temperature detector or some other type of transducer (930), and will be able to use teaching from the present disclosure to adapt to various conditions and requirements. In some embodiments, this calibration can be done at factory test of the PA, the ETPS, the PA+ETPS if integrated, factory test of the radio system, or in-situ by detectors in the radio system. The calibration can also be based on characterization. Typical parameters that would be monitored during the calibration process include output power, gain, AM-AM, AM-PM, ACLR, EVM, receive band noise, efficiency, and voltage levels.

Although throughout the present disclosure envelope tracking was used as an amplification method in the various embodiments, it should be noted that the techniques for stacking, mode switching optimization, and system partitioning used in said embodiments apply to envelope tracking as well as envelope following, polar amplifiers/systems, and average power tracking described in the early sections of this disclosure. These techniques can be further applied in conjunction with other amplifier efficiency improvement and performance techniques such as analog pre-distortion, digital pre-distortion, Doherty amplifiers, LINC or outphasing amplifiers, switching amplifiers such as Class S and Class M, and also distributed amplifiers, among others. The skilled person will thus appreciate the flexibility and adaptability of the various embodiments of this disclosure to other known configurations and techniques.

Finally, as integration is usually synonymous to reduced cost and reduced form factor, it is envisioned, as another embodiment of the current disclosure, that the entirety of the components of FIGS. 53-74 be monolithically integrated (e.g. Silicon on Insulator), with various intermediary stages, wherein partial integration of the components is performed.

The examples set forth above are provided to give those of ordinary skill in the art a complete disclosure and description of how to make and use the embodiments of the amplifier dynamic bias adjustment for envelope tracking of the disclosure, and are not intended to limit the scope of what the inventors regard as their disclosure. Such embodiments may be, for example, used within mobile handsets for current communication systems (e.g. WCMDA, LTE, etc. . . . ) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuital arrangement comprising:
an amplifier comprising:
stacked transistors having a plurality of gate terminals configured to operatively provide a plurality of dynamic bias voltages or currents to the stacked transistors;
an input port operatively connected to a gate terminal of an input transistor of the stacked transistors;
an output port operatively connected to an output transistor of the stacked transistors configured to output an amplified version of the RF signal;
a reference terminal operatively coupling the input transistor to a reference potential, and
a plurality of series connected resistors configured as a voltage divider coupled to the stacked transistors by way of nodes formed by two consecutive resistors of the plurality of series connected resistors,
wherein:
the stacked transistors comprise two subsets of transistors operatively arranged in series:
a) a first subset comprising the input transistor operatively connected between the reference potential at the reference terminal; and
b) a second subset comprising one or more transistors operatively connected in series with each other, at least one transistor of the one or more transistors being the output transistor, the second subset operatively connected between the first subset and a variable output supply bias voltage or current provided to a drain terminal of the output transistor, and
the nodes of the plurality of series connected resistors are configured to provide the dynamic bias voltages or currents to the gate terminals of the one or more transistors of the second subset.

2. The circuital arrangement according to claim 1, further comprising a variable voltage or current source operatively coupled to the circuital arrangement and configured to output one or more variable voltages or currents according to a control signal applied to the variable voltage or current source.

3. The circuital arrangement according to claim 2, wherein the control signal is a function of an envelope signal of an input signal to the amplifier, such as the applying of the control signal impresses said function upon the one or more variable voltages or currents output by the variable voltage or current source.

4. The circuital arrangement according to claim 3, wherein the amplifier is configured to operate in at least one of: a) linear region, b) compression region, or c) switching between compression and linear regions.

5. The circuital arrangement according to claim 3, wherein the dynamic bias voltages or currents are operatively generated at the nodes of the plurality of series connected resistors from a first variable voltage or current of the one or more variable voltages or currents and the variable output supply bias voltage or current is operatively generated from a second variable voltage or current of the one or more variable voltages or currents.

6. The circuital arrangement according to claim 5, further comprising one or more capacitors connected between the gate terminals of the one or more transistors of the second subset and the reference potential, wherein a gate capacitor of the one or more gate capacitors is configured to allow a gate voltage at a gate terminal of a transistor of the one or more transistors of the second subset to vary along with a radio frequency (RF) voltage at a drain of the transistor.

7. The circuital arrangement according to claim 5, further comprising one or more capacitors connected between the gate terminals of the one or more transistors of the second subset and the reference ground, wherein the one or more capacitors are configured to perform any combination of: a) optimize a bias voltage across each of the one or more transistors for a desired operation of the amplifier, b) optimize an envelope signal voltage across each of the one or more transistors for a desired operation of the amplifier, and c) optimize an RF voltage swing across each of the one or more transistors for a desired operation of the amplifier.

8. The circuital arrangement according to claim 6, further comprising one or more resistors connected in series between the gate terminals of the one more transistors of the second subset and the nodes of the plurality of series connected resistors configured as the voltage divider.

9. The circuital arrangement according to claim 5 further comprising a circuital arrangement connected in series between at least one gate terminal of the one or more transistors of the second subset and the nodes of the plurality of series connected resistors configured as the voltage divider, the circuital arrangement comprising at least one active device.

10. The circuital arrangement according to claim 9, wherein the circuital arrangement is configured to operate in a frequency range spanning from DC to a frequency content of the input signal.

11. The circuital arrangement according to claim 5, wherein the gate terminal of the input transistor is adapted to receive a bias input gate voltage or current which is not generated from the first or the second variable voltage or current.

12. The circuital arrangement according to claim 5, further comprising an inductor configured as a choke operatively connected between the output transistor and the variable output supply bias voltage or current provided to the output transistor.

13. The circuital arrangement according to claim 5, wherein the variable voltage or current source is a DC-DC converter.

14. The circuital arrangement according to claim 5, wherein the variable voltage or current source is a DC-DC converter and a linear regulator operatively connected in parallel or in series with each other.

15. The circuital arrangement according to claim 5, wherein the variable voltage or current source is operatively coupled to the drain terminal of the output transistor and is adapted to vary a voltage of the variable output supply bias voltage or current.

16. The circuital arrangement according to claim 5, wherein a direct current (DC) component of an at least one of the plurality of the dynamic bias voltages or currents is not operatively generated from the first variable voltage or current.

17. The circuital arrangement according to claim 5, wherein the stacked transistors are configured in a cascode configuration.

18. The circuital arrangement according to claim 5, wherein the amplifier is a driver or a final stage amplifier.

19. The circuital arrangement according to claim 5, wherein the reference potential is one of a) a reference ground, b) a virtual ground, and c) an RF ground.

20. The circuital arrangement according to claim 5, wherein the stacked transistors are field effect transistors (FETs) or bipolar junction transistors (BJTs).

21. The circuital arrangement according to claim 5 wherein the amplifier is configured to amplify an input signal with a frequency content above 100 MHz provided at the input port of the amplifier, and reproduce an amplified output signal at the output port of the amplifier, wherein a measured power of the amplified output signal into an output load is above 50 mW.

22. The circuital arrangement according to claim 5 wherein the amplifier is configured to amplify an input signal with a frequency content below 100 MHz provided at the input port of the amplifier, and reproduce an amplified output signal at the output port of the amplifier, wherein a measured power of the amplified output signal into an output load is above 50 mW.

23. The circuital arrangement according to claim 1 or claim 5, wherein the stacked transistors comprise one of: a) three transistors, b) four transistors, c) five transistors, and d) more than five transistors in a stacked configuration.

24. The circuital arrangement according to claim 1, wherein the variable output supply bias voltage or current is operatively generated from an envelope signal of an input signal.

25. The circuital arrangement according to claim 24, wherein at least one of the plurality of the dynamic bias voltages or currents is operatively generated from the envelope signal.

* * * * *